(12) United States Patent
Magoshi et al.

(10) Patent No.: US 6,316,163 B1
(45) Date of Patent: Nov. 13, 2001

(54) PATTERN FORMING METHOD

(75) Inventors: Shunko Magoshi; Masamitsu Itoh, both of Yokohama; Shinji Sato, Kawasaki; Soichi Inoue, Yokohama; Kazuyoshi Sugihara, Kanagawa-ken; Katsuya Okumura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/163,421

(22) Filed: Sep. 30, 1998

(30) Foreign Application Priority Data

| Oct. 1, 1997 | (JP) | 9-268893 |
| Dec. 8, 1997 | (JP) | 9-337146 |
| Jan. 16, 1998 | (JP) | 10-006503 |
| Sep. 7, 1998 | (JP) | 10-252728 |

(51) Int. Cl.⁷ .................. G03F 9/00; G03C 5/00
(52) U.S. Cl. ............................ 430/296; 430/30
(58) Field of Search .............. 430/296, 30, 312, 430/942

(56) References Cited

U.S. PATENT DOCUMENTS

| 5,677,092 | * | 10/1997 | Takekuma et al. | 430/30 |
| 5,863,682 | * | 1/1999 | Abe et al. | 430/30 |
| 5,958,636 | * | 9/1999 | Tamura | 430/30 |
| 5,994,030 | * | 11/1999 | Sugihara et al. | 430/296 |
| 6,040,114 | * | 3/2000 | Inoue et al. | 430/296 |

OTHER PUBLICATIONS

R. Jonckheere et al., "Electron beam/DUV intra–level mix–and–match lithography for random logic 0.25 μm CMOS", Microelectronic Engineering 27, pp. 231–234, (1995).

F. Benistant et al., "A heavy ion implanted pocket 0.10 μm n–type metal–oxide–semiconductor field effect transistor with hybrid lithography (electron–beam/deep ultraviolet) and specific gate passivation process", Journal of Vacuum Science Technology, B 14(6), pp 4051–4054, (1996).

* cited by examiner

*Primary Examiner*—Mark F. Huff
*Assistant Examiner*—Saleha R. Mohamedulla
(74) *Attorney, Agent, or Firm*—Finnegan, Henderson, Farabow, Garrett & Dunner, L.L.P.

(57) ABSTRACT

A method for forming patterns, in which pattern transfer to the same photosensitive material on a first layer is carried out using both light exposure and charged particle beam exposure, comprises the steps of performing a predetermined geometric operation between data associated with a pattern to be transferred to the first layer and data associated with a pattern to be transferred to a second layer different from the first layer, separating the pattern data associated with the pattern to be transferred to the first layer into first exposure pattern data for charged particle beam exposure and second exposure pattern data for light exposure, and performing pattern transfer on to the first layer based on the result of the separation.

29 Claims, 30 Drawing Sheets

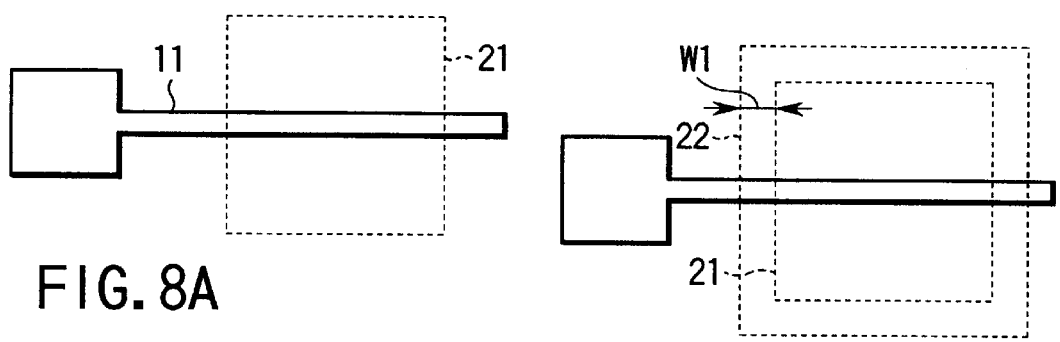
FIG. 8A
FIG. 8B
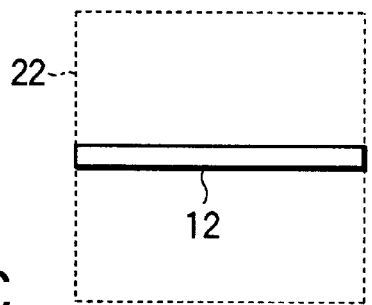
FIG. 8C
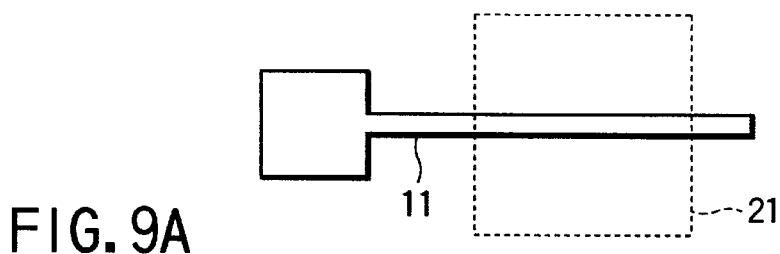
FIG. 9A
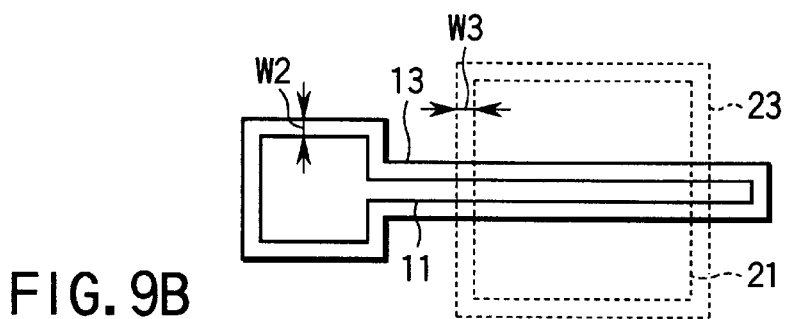
FIG. 9B
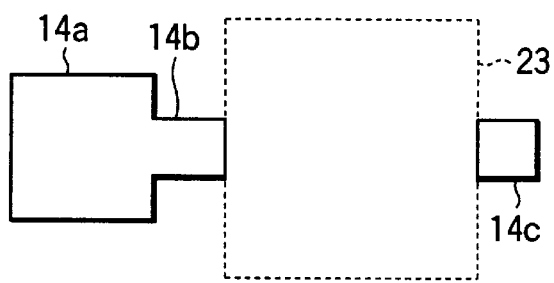
FIG. 9C

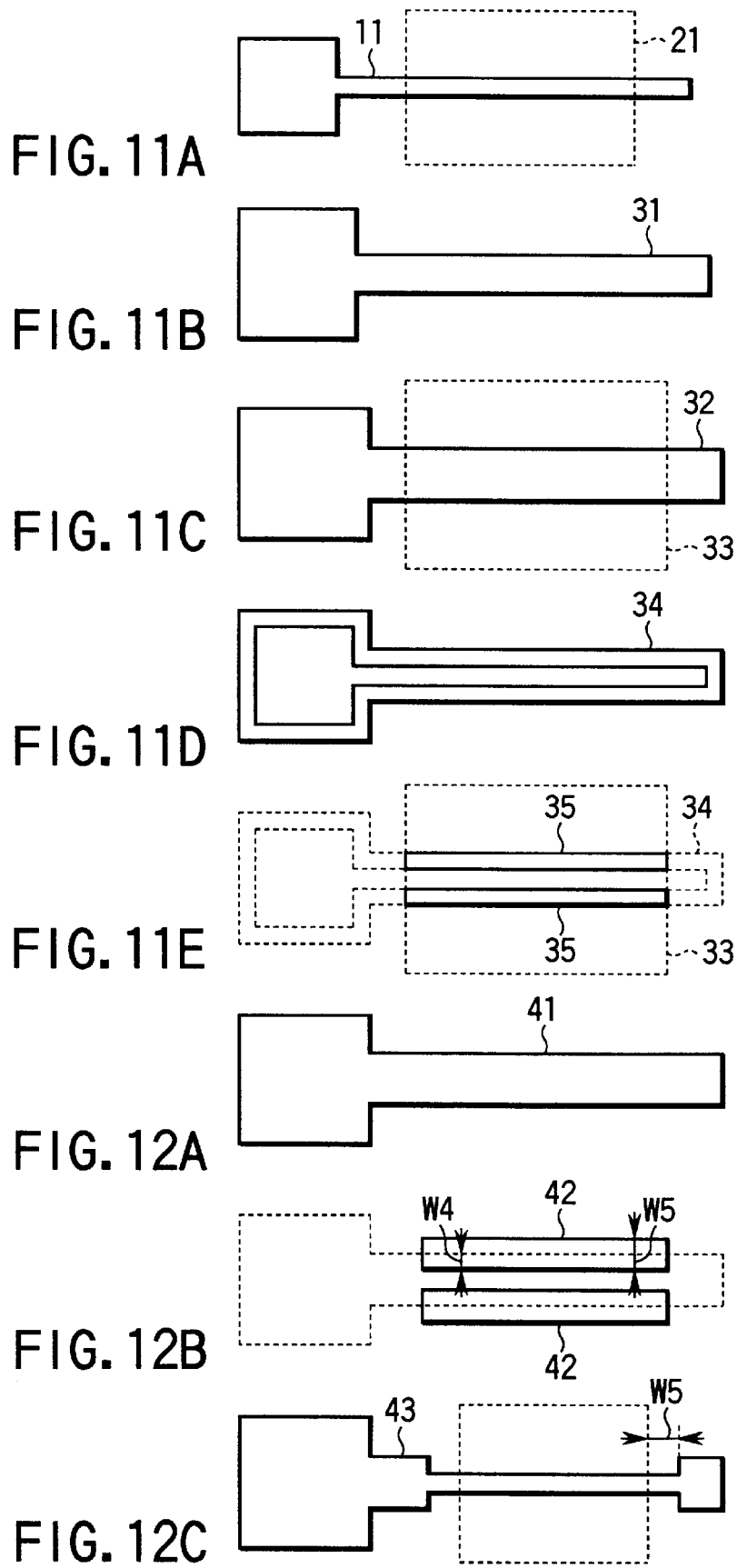

|  | PATTERN GENERATION METHOD ACCORDING TO THE PRESENT INVENTION | ONLY ELECTRON BEAM EXPOSURE IS USED |
|---|---|---|
| NUMBER OF SHOTS OF ELECTRON BEAM EXPOSURE | 4081294 (0.19) | 22017096 (1.0) |
| THROUGHPUT [h⁻¹] | 2.9 (4.1) | 0.7 (1.0) |
| NUMERAL IN BLANKET INDICATES RATE OF PATTERN GENERATING METHOD ACCORDING TO THE PRESENT INVENTION WHEN ONLY ELECTRON BEAM EXPOSURE IS USED AS REFERENCE | | |

|  | ONLY ELECTRON BEAM EXPOSURE IS USED | EB/DUV INTRA-LEVEL Mix-and-Match |
|---|---|---|
| EVALUATION SAMPLE | CACHE MEMORY CELL:CP PERIPHERAL CIRCUIT:VSB | CACHE MEMORY CELL:CP PERIPHERAL CIRCUIT:deep-uv |
| 256MDRAM GATE LAYER | 0.3 PAGE/h | 2.84 PAGE/h |

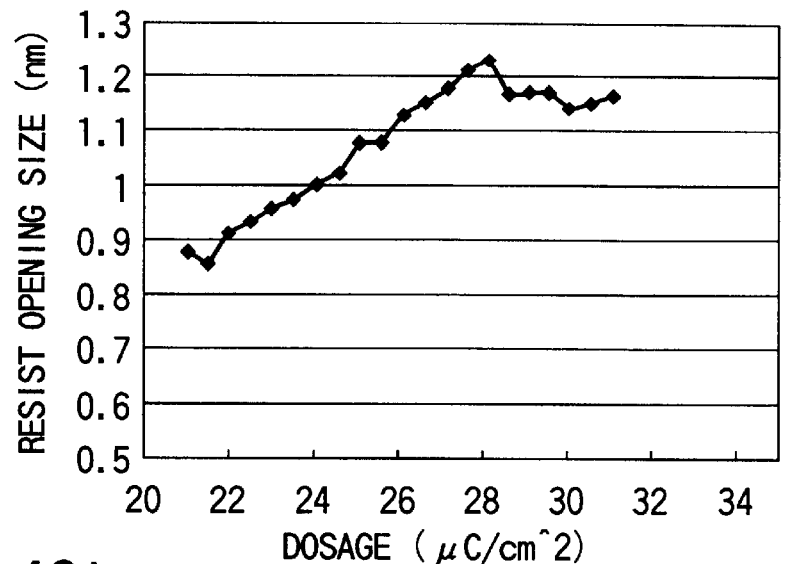
FIG. 42A
FIG. 42B
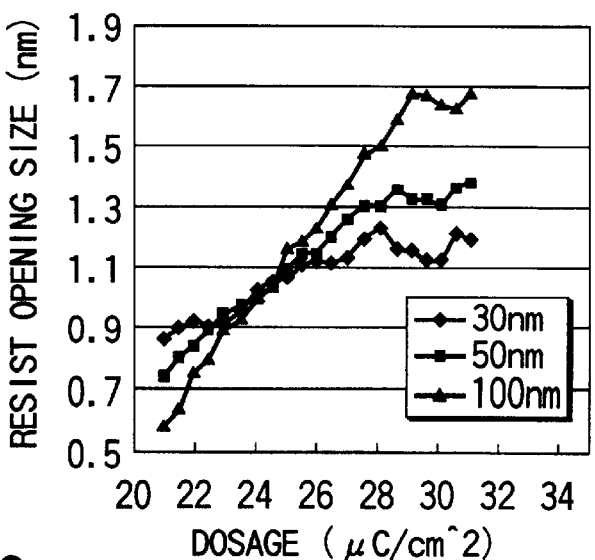
FIG. 42C

PATTERN FORMING METHOD

BACKGROUND OF THE INVENTION

The present invention relates to a pattern forming method for forming fine patterns with high accuracy and throughput. More particularly, the present invention relates to a method for generating pattern data for light exposure and charged particle beam exposure from device design patterns in order to transfer patterns on the same photosensitive material using light exposure and charged particle beam exposure.

Photolithography in semiconductor manufacturing steps is widely used for the production of devices thanking to its advantages such as simplicity of processing and low cost. Recently, elements as fine as 0.25 μm or less have been realized as a result of the introduction of short wavelength utilizing KrF excimer laser light sources. In order to improve fineness further, efforts are being put on the development of ArF excimer laser light sources having shorter wavelengths and Revenson type phase shift masks which are regarded promising as mass production lithographic tools compatible with 0.15 μm rules. However, there are many disadvantages to be solved to realize them, which has increased the time required for the development of the same and behind the rate at which devices are made finer and it is being worried about being impossible to catch up a fineness speed of the device.

On the contrary, electron beam lithography which is the most promising candidate as the post-photolithography technique (in the following description, "electron beam lithography" obviously implies charged particle lithography) has proved itself capable of processing on the order of 0.01 μm using narrowed beams. Although this technique has no pressing disadvantage from the viewpoint of improving fineness, it has a disadvantage with throughput when viewed as a tool for the mass production of devices. Specifically, this technique inevitably takes time because it sequentially draws fine patterns one by one. In order to reduce such drawing time, several apparatuses have been developed which employ methods such as exposure method of character projection wherein repetitive parts of an ULSI pattern are simultaneously drawn partially. However, the use of such apparatuses has been still unsuccessful in catching up the through put of photolithography.

As a method of increasing the throughput of electron beam lithography, proposals have been made on the so-called mixing and matching of light and electron beams in the same layer. This method is to perform pattern transfer on to the same resist using light exposure and electron beam exposure to reduce areas subjected to electron beam exposure, thereby increasing the number of wafers which can be processed by an electron beam lithography apparatus per hour. For example, Jpn. Pat. Appln. KOKAI Publication No. 4-155812 discloses the use of light exposure and electron beam exposure employing a phase shift mask in transferring patterns on to the same resist during a lithographic step for pattern formation. According to the publication, most of patterns to form an element are transferred using the phase shift mask and areas having disadvantages attributable to the position of the phase shifter are corrected by means of electron beam lithography, thereby reducing areas to be subjected to electron beam lithography as much as possible to increase the number of wafers which can be processed by the electron beam lithography apparatus per hour.

Although this method reduces areas to be drawn using electron beams, it can not be adapted to finer devices in future because it is not capable of pattern transfer at resolutions below the limit of the resolution of the phase shift mask. Especially, ultra-resolution techniques such as the Revenson type phase shift mask may be limited to patterns having regular lines and spaces of memory LSIs and can not be adapted to increased fineness of random patterns which are characteristic of logic devices.

Further, since LSIs are manufactured through many repetitive lithographic steps, they have variations in processing at those steps and errors in alignment of layers. It is impossible to eliminate those factors completely, although various measures are being taken to suppress them as much as possible. This disadvantage is encountered also in performing pattern transfer on to the same resist using light exposure and electron beam exposure. According to the above-described method, pattern sizes become too large or small or gaps are formed at areas where patterns formed by light exposure and electron beam exposure are connected because such variations in processing and alignment errors are not taken into account in this method.

The variable beam shaping method capable of providing a variety of beam shapes is used to form irregular patterns as seen on, for example, logic circuits using electron beam exposure. The variable beam shaping method controls an optical overlap between a first shaping aperture and a second shaping aperture using a shaping deflector, so that the shapes and sizes of electron beams can be varied with flexibility.

However, a disadvantage arises in that the accuracy of beam sizes is directly affected by the deflecting accuracy of the shaping deflector. Further, insulation materials are gradually deposited on the surface of structures between the first and second shaping apertures and are charged to cause a change in an electrostatic field in the path of electron beams, which results in a shift of the position of an image of the first aperture projected upon the second shaping aperture from a desired position. Since the amount of the deposited insulation materials and the charge thereof change over time, beam sizes also change over time. Therefore, even if the beam sizes are calibrated before lithography, patterns formed at the beginning and the end of lithography are in different sizes because the accuracy of beam sizes gradually changes during lithography.

The disadvantage of overlapping deviations will now be described with reference to FIGS. 1A through 1D. If a design pattern is divided into a light-exposed pattern A and an electron-beam-exposed pattern B simply based on the sizes thereof, since the light-exposed pattern A and electron-beam-exposed pattern B are contact to each other (FIG. 1A), an error in the overlapping of the light exposure and electron beam exposure as described above results in a gap in the area which must be contact (FIG. 1B) to disable normal operation of the element.

An article titled "Electron beam/DUV intra-level mix-and-match lithography for random logic 0.25 μm CMOS" (R. Jonckheere et al., Microelectronic Engineering 27 (1995) pp. 231–234) discloses mix-and-match in the same layer wherein pattern transfers on the same resist are performed using light exposure utilizing a deep-UV stepper and electron beam exposure utilizing a Gausian electron beam lithography apparatus at a lithographic step for pattern formation. According to this article, patterns are divided using 0.4 μm as a reference, and patterns of 0.4 μm or more are exposed by deep-UV light whereas patterns less than 0.4 μm are drawn directly on a wafer using electron beams. In order to absorb errors in overlapping the light exposure and electron beam exposure, the light-exposed patterns and electron-beam-exposed patterns are exposed such that they overlap by 0.1 μm (FIG. 1C). By overlapping the patterns in such a manner, it is possible to prevent discontinuation of patterns in areas where they are to be contact even if there is overlapping deviations (FIG. 1D).

The above-cited article discloses two methods for generating such overlapping patterns. The first method is to move the outline line of a light-exposed pattern outward of the pattern to increase the sizes of the pattern, thereby overlapping it with an electron-beam-exposed pattern (such a processing is referred to as "sizing processing" or "resize processing"). The second method is to move the outline line of an electron-beam-exposed pattern outward of the pattern to increase the sizes of the pattern, thereby overlapping it with a light-exposed pattern. According to the first method, however, an increase in the sizes of a light-exposed pattern decreases distances between patterns in violation of design rules. According to the second method, the sizes of patterns are increased by the overlapped pattern, which disallows a desired pattern to be obtained.

The fabrication of masks to manufacture many types of elements in small quantities takes time. As means for solving this disadvantage, Jpn. Pat. Appln. KOKAI Publication No. 1-293616 discloses a processing wherein a group of functional blocks common to various semiconductor elements on the same resist are exposed by light and a method wherein patterns unique to each semiconductor element are drawn using electron beams. Specifically, a mask for the areas common to various elements is prepared in advance, and electron beam lithography is used in the remaining areas having different patterns. This method makes it possible to shorten the period spent from the designing of elements until the manufacture of the same because there is no need for preparing a mask for each type of element. However, this method is similar to the above-described method in that it can not be used where there are patterns in functional blocks that require resolutions below the limit of resolution of light exposure. Further, patterns to be drawn using electron beams are wiring areas and the like, and the use of electron beam exposure inevitably takes time because patterns are sequentially drawn one at a time. As a result, this method is difficult to use in lithography systems for drawing fine patterns at a high speed.

As described above, the mix-and-match of light and electron beams in the same layer which has been performed to improve throughput has had disadvantages in that the resolving power of electron beam exposure is not fully utilized and in that throughput is not improved to the same level as that achievable with an optical stepper.

In order to solve the above-described disadvantages, the inventors have already proposed a lithography system for exposing the same light-sensitive material to light and electron beams which provides both of excellent resolving power beyond that of light provided by electron beam exposure and throughput equivalent to that achieved by an optical stepper.

As described above, the conventional mix-and-match of light and electron beams in the same layer has the disadvantages listed below.

(1) It does not fully utilizes high resolving power and high throughput characteristic of electron beam exposure and light exposure, respectively.

(2) An error in the overlapping of light exposure and electron beam exposure can reduce pattern accuracy in areas where patterns exposed by light and electron beams are contact to each other. An effort to avoid this will make it impossible to obtain a desired pattern size.

(3) While the variable beam shaping method is used to irregular patterns as seen on logic circuits utilizing electron beam exposure, pattern accuracy is reduced in this case due to changes in the accuracy of beam sizes over time.

(4) No solution has been found to avoid the influence of electrons that are scattered backward.

BRIEF SUMMARY OF THE INVENTION

It is an object of the present invention:

(1) To provide a method for lithography having high resolution and throughput capable of achieving high pattern accuracy.

(2) To provide a method for generating pattern data capable of preventing reduction in pattern forming accuracy attributable to misalignment between light exposure and electron beam exposure at areas where various patterns are connected without oversizing patterns exposed by light and patterns exposed by electron beams and to realize a lithography system which has excellent resolving power beyond that of light provided by electron beam exposure, high pattern forming accuracy and throughput equivalent to that achievable with an optical stepper and which can be adapted to mass production that follows photo-lithography.

(3) To provide a method for pattern formation which compensates for the effect of back-scattered electrons that fall on patterns exposed by light in the vicinity of areas exposed by electron beams during electron beam exposure and which has preferable pattern resolution, controllability of sizes, excellent resolving power beyond that of light provided by electron beam exposure and throughput equivalent to that achievable with an optical stepper.

According to the present invention, there is provided a method for forming patterns, in which pattern transfer to the same photosensitive material on a first layer is carried out using both light exposure and charged particle beam exposure, comprising the steps of: performing a predetermined geometric operation between data associated with a pattern to be transferred to the first layer and data associated with a pattern to be transferred to a second layer different from the first layer; separating the pattern data associated with the pattern to be transferred to the first layer into first exposure pattern data for charged particle beam exposure and second exposure pattern data for light exposure; and performing pattern transfer on to the first layer based on the result of the separation.

According to the present invention, a predetermined arithmetic process is carried out between data associated with a pattern to be transferred to a layer (first layer) on which a pattern is to be formed and data associated with a pattern to be transferred to a different layer (second layer) to separate patterns into a pattern exposed by electron beams and a pattern exposed by light. Thus, a pattern for which excellent resolving power in the excess of that of photolithography provided by electron beam exposure must be used can be easily separated from a pattern for which the resolving power of photolithography is sufficient. It is therefore possible to achieve high resolution, high throughput and high pattern accuracy.

The pattern to be transferred to the first layer or the like means a virtual pattern defined by data for pattern formation or the like rather than a pattern which actually exists. Such a virtual pattern is also simply referred to as "pattern" in the present specification.

According to the present invention, in above method, the first layer is a gate layer for forming a gate of a MIS transistor and the second layer is an active area layer for forming an active area of a MIS transistor.

According to the present invention, there is provided a method for forming patterns wherein pattern transfer to the same photosensitive material on a gate layer for forming a gate of a MIS transistor is carried out using both light exposure and charged particle beam exposure, the method comprising the steps of: separating pattern data associated with patterns transferred to the gate layer into first exposure pattern data for transferring a pattern on to an area corresponding to an active area of the MIS transistor using charged particle beam exposure and second exposure pattern data for transferring a pattern on to an area corresponding to an area including a non-active area of the MIS transistor using light exposure; and performing pattern transfer to the gate layer based on the result of the separation.

According to the present invention, only a fine gate pattern on an active area among patterns on a gate layer can be exposed by electron beams and other patterns can be exposed by light. Accordingly, light exposure is responsible only for the formation of patterns for which requirements are relaxed in that retracted or rounded pattern edges attributable to diffraction of light are permitted, which simplifies the generation of photomasks and increases the flexibility of an exposure process. The use of electron beams for the exposure of a fine gate pattern, the fine gate pattern can be formed with high accuracy because the tolerance for the focal depth is increased at the step between the element area and the element separation area. This makes it possible to delete a planarization process in order to reduce such a step which is otherwise required for light exposure, thereby reducing manufacturing steps.

According to the present invention, there is provided a method for forming patterns wherein at least part of pattern transfer to the same photosensitive material on a first layer is carried out using charged particle beam exposure that applies charged particle beams emitted by an charged particle beam source to a sample through a first shaping aperture and a second shaping aperture, the method comprising the steps of: performing a predetermined geometric operation between data associated with a pattern to be transferred to the first layer and data associated with a pattern to be transferred to a second layer different from the first layer; separating the pattern data associated with the pattern to be transferred to the first layer into first exposure pattern data and second exposure pattern data; and performing pattern transfer on to the first layer based on the result of the separation, wherein the first exposure pattern data are used in an exposure method wherein an charged particle beam image projected upon the second shaping aperture through the first shaping aperture includes an area sandwiched by at least part of a pair of sides facing each other of a shaping pattern formed on the second shaping aperture.

According to the present invention, in above method, the first layer is a gate layer for forming a gate of a MIS transistor and the second layer is an active area layer for forming an active area of a MIS transistor.

According to the present invention, there is further provided a method for forming patterns wherein at least part of pattern transfer to the same photosensitive material on a gate layer for forming a gate of a MIS transistor is carried out using charged particle beam exposure that applies charged particle beams emitted by an charged particle beam source to a sample through a first shaping aperture and a second shaping aperture, the method comprising the steps of: separating pattern data associated with the pattern to be transferred to the gate layer into first exposure pattern data for transferring a pattern on to an area corresponding to an active area of the MIS transistor using charged particle beam exposure and second exposure pattern data for transferring a pattern on to an area corresponding to an area including a non-active area of the MIS transistor using light exposure; and performing pattern transfer on to the gate layer based on the result of the separation, wherein the first exposure pattern data are used in an exposure method wherein an charged particle beam image projected upon the second shaping aperture through the first shaping aperture includes an area sandwiched by at least part of a pair of sides facing each other of a shaping pattern formed on the second shaping aperture.

According to the present invention, a predetermined process is performed to separate first exposure pattern data and second exposure pattern data, and the first exposure pattern data are used for the above-described method for exposure. In this method for exposure, since an electron beam image projected upon a second shaping aperture includes an area which is sandwiched between at least part of a pair of sides facing each other of a desired shaping pattern formed on the second shaping aperture, the width of electron beams which have passed through the second shaping aperture is always fixed by the pair of sides facing each other. Therefore, for example, when the interval between the pair of sides facing each other defines the gate length of a transistor, the accuracy of a pattern in the direction of the gate length can be improved. It is thus possible to avoid the above-described disadvantage with the variable shaping beam method, i.e., the disadvantage of a reduction in pattern accuracy attributable to a change in the accuracy of beam sizes over time.

While the above-described exposure method using the first exposure pattern implies the exposure method of character projection, it is based on a concept that is broader than that of the exposure method of character projection. Specifically, while an electron beam image projected upon the second shaping aperture through the first shaping aperture includes the entire area of a desired shaping pattern formed on the second shaping aperture according to the exposure of character projection, an electron beam image according to the above-described method of exposure is required only to include an area which is sandwiched by at least part of a pair of sides facing each other of a desired shaping pattern formed on the second shaping aperture.

There is no special limitation on the method of exposure utilizing the second exposure pattern data, and the exposure may be based on either light exposure or electron beam exposure of the variable shaping beam type.

The above-describe arithmetic process is at least either a process of extracting an overlapping area between patterns to be transferred to first and second layers from the pattern to be transferred to the first layer (which may be also referred to as "AND process" in this specification for convenience) or a process of removing the same (which may be also referred to as "subtraction process" or "masking process" in this specification for convenience).

The process of separation into first and second exposure pattern data includes a process of extracting an overlapping area between patterns to be transferred to first and second layers from the pattern to be transferred to the first layer (process 1), a process of generating the first exposure pattern data based on the result of the process (process 2), a process of removing the overlapping area between the patters to be transferred to the first and second layers from the pattern to be transferred to the first layer (process 3) and a process of generating the second exposure pattern data based on the result of the process (process 4).

According to the present invention, pattern data for a gate layer (first layer) and pattern data for an active area layer (second layer) are ANDed to allow gate pattern on the active area layer to be extracted easily. By subtracting the pattern data for the active area layer from the pattern data for the gate layer, patterns according to a size rule more relaxed compared to that for the gate pattern can be easily extracted.

The process 1 is a process of extracting an overlapping area between a pattern obtained by oversizing a pattern to be transferred to the second layer and a pattern to be transferred to the first layer from the pattern to be transferred to the first layer.

As a result, the pattern extracted from the pattern on the gate layer protrudes from the active area, which eliminates the possibility of oversizing of the gate length on the active area even if there is any misalignment between the active area layer and gate layer. Further, since an overlap can be created between patterns exposed by light and electron beams on the gate layer, no gap is formed in the area where those patterns are connected even if there is misalignment between the patterns exposed by light and electron beams in the same layer.

The process 3 is a process of removing an overlapping area between a pattern obtained by oversizing the pattern to be transferred to the second layer and the pattern to be transferred to the first layer or a pattern obtained by oversizing the same from the pattern to be transferred to the first layer or the pattern obtained by oversizing the same.

This results in a gap between patterns (patterns exposed by light) other than the removed pattern on the gate layer and the active area and, therefore, any misalignment between the active area layer and gate layer will not result in intrusion of patterns exposed by light according to a relaxed size rule into the active area layer.

The process 2 includes a process of adding the patterns obtained by the processes 1 and 3 when the sizes of the patterns are smaller than first and second thresholds, respectively (the process may be also referred to as "AND process in this specification for convenience), and the process 4 includes a process of adding the patterns obtained by the processes 1 and when the sizes of the patterns are greater than first and second thresholds, respectively.

This allows patterns according to a relaxed size rule exposed by light even on the active area, which makes it possible to reduce the number of patterns to be subjected to electron beam exposure, thereby improving throughput. Further, fine patterns beyond the limit of resolution of light can be formed using electron beam exposure even outside the active area.

At least either of the processes 2 and 4 may includes a further process to oversize or narrow the resultant pattern by any size. This allows a oversizing or narrowing process to be performed on patterns exposed by electron beams and light after they are separated in sizes chosen taking the respective exposure processes into consideration, thereby improving the accuracy of the size of the resist pattern ultimately obtained.

The process separating the first and second exposure patterns includes a process of generating a first oversized pattern by oversizing the pattern to be transferred to the first layer, a process of generating the second exposure pattern data based on the result of the process, a process of generating a second oversized pattern by oversizing the pattern to be transferred to the first layer further beyond the first oversized pattern, a process of generating a third oversized pattern by oversizing the pattern to be transferred to the second layer, a process of removing an overlapping area between the pattern to be transferred to the first layer and the second oversized pattern from the second oversized pattern, a process of extracting an overlapping area between the pattern obtained by the removing process and the third oversized pattern; and a process of generating the first exposure pattern data based on the result of the extraction process.

While the methods according to the above-described seventh through eleventh aspects of the present invention are effective primarily when a negative-tone resist is used, the method according to the twelfth aspect of the present invention is effective when a positive-tone resist is used.

It is advantageous to use the methods for pattern formation according to the first through twelfth aspects of the present invention in the formation of patterns in a gate layer of a semiconductor integrated circuit having logic and memory portions thereof. The methods for pattern formation according to the first through twelfth aspects are used for the logic portion and, for the memory portion, a method for pattern formation is used which employs light exposure (e.g., an ultra-resolution light exposure technique such as phase shift mask) or part simultaneous electron beam exposure (e.g., character projection type electron beam exposure or self-projection type electron beam exposure). (A13)

As a result, appropriate methods of exposure are used for the memory portion wherein the same pattern is repeated and the logic portion which is formed by random patterns. It is therefore possible to form the patterns with excellent resolving power beyond that of light provided electron beam exposure and throughput equivalent to that achieved by an optical stepper.

According to the present invention, there is provided a method for forming patterns involving pattern transfer to the same photosensitive material using light exposure and charged particle beam exposure, the method comprising the steps of: moving the outline of a device design pattern inwardly by a first amount; extracting a pattern exposed by charged particle beams from the device design pattern whose outline has been moved; moving the outline of the extracted pattern exposed by charged particle beams outwardly by a second amount; converting the pattern exposed by charged particle beams whose outline has been moved into a data format for an charged particle beam lithography apparatus; extracting a pattern exposed by light from the device design pattern; and converting the pattern exposed by light into a data format for a photomask writing apparatus.

Preferable manners for carrying out the present invention are as follows.

(1) A first outline movement and a second outline movement have the same absolute value.

(2) The first outline movement and second outline movement have different absolute values.

(3) The first and second outline movements are determined in consideration to errors in the alignment of light exposure and electron beam exposure on the same photosensitive material, the accuracy of the electron beam size from an electron beam lithography apparatus, value of the pattern size change in resist processing and value of the pattern size change in etching.

(4) The extraction of patterns exposed by electron beams is carried out by extracting patterns having sizes smaller than a reference size.

(5) A boundary size between light exposure and electron beam exposure is defined; a value obtained by correcting the boundary size by the first outline movement is used as a reference value; and patterns smaller than the reference value are extracted as patterns exposed by electron beams.

(6) Prior to a step of converting patterns exposed by electron beams into a data format for an electron beam lithography apparatus, a step is performed to move the positions of at least either of shorter or longer sides of extracted patterns exposed by electron beams in a direction perpendicular thereto.

(7) Prior to a step of converting patterns exposed by electron beams into a data format for an electron beam lithography apparatus, a step is performed to move the positions of sides of extracted patterns exposed by electron beams which are in contact with patterns exposed by light in a direction perpendicular thereto.

According to the present invention, the outlines of patterns are moved by a first amount $\Delta W1$ such that the sizes of design patterns become smaller than desired pattern sizes to reduce the width of the patterns and, thereafter, patterns exposed by electron beams are extracted. The outlines of the extracted patterns are moved by a second amount $\Delta W2$ such that the sizes thereof becomes equal to desired pattern sizes to increase the width of the patterns. As a result, patterns exposed by electron beams and light overlap with each other in areas where they are connected. The amount of overlap is the sum of the first outline ovement $\Delta W1$ and second outline movement $\Delta W2$.

Further, considering the deviation in overlapping electron beam exposure and light exposure, amounts $\Delta W1$ and $\Delta W2$ may be set such that the amount of pattern overlap ($\Delta W1+\Delta W2$) exceeds the positional shift in overlap. Since a pattern exposed by electron beams and a pattern exposed by light always overlap in areas where they are connected, it is possible to avoid discontinuation of patterns due to a shift in overlapping.

Further, by setting the outline movements such that they satisfy $\Delta W1=\Delta W2$, it is possible to provide a pattern exposed by electron beams with an amount of pattern overlap ($\Delta W1+\Delta W2$) and to avoid variation of the width of the pattern. It is therefore possible to obtain pattern data to achieve a pattern width in accordance with the original design. That is, the method for generating pattern data according to the present invention suffers from the side effect that a pattern ultimately obtained is not subjected to any change in its line width.

The amounts of pattern outline movement $\Delta W1$ and $\Delta W2$ are set in consideration to positional shifts in overlapping electron beam exposure and light exposure, the accuracy of the beam size of the lithography apparatus used, value of the pattern size change in resist processing, value of the pattern size change in etching and the like. This makes it possible to correct such factors which can otherwise reduce the accuracy of pattern sizes to perform pattern formation with higher accuracy. In the so-called mix-and-match method in the same layer wherein patterns are formed by exposing them to electron beams and light on the same photosensitive material, it is therefore possible to form fine patterns accurately without causing deterioration of the patterns in areas where electron beam exposure and light exposure are connected.

According to the present invention, there is provided a method for forming patterns involving pattern transfer to the same photosensitive material using light exposure and charged particle beam exposure, the method comprising the steps of: moving the outline of a device design pattern inwardly by a first amount; separating the device design pattern whose outline has been moved into a pattern exposed by light and a pattern exposed by charged particle beams; moving the outline of the pattern exposed by light outwardly by a second amount; moving the outline of the pattern exposed by charged particle beams outwardly by a third amount; converting the pattern exposed by light whose outline has been moved into a data format for a photomask writing apparatus; and converting the pattern exposed by charged particle beams whose outline has been moved into a data format for an charged particle beam lithography apparatus.

Preferable manners for carrying out the present invention includes the following.

(1) First, second and third outline movements have the same absolute value.

(2) The first, second and third outline movements have different absolute values.

(3) The first, second and third outline movements are determined in consideration to errors in the alignment of light exposure and electron beam exposure on the same photosensitive material, the accuracy of the electron beam size from an electron beam lithography apparatus, value of the pattern size change in resist processing and value of the pattern size change in etching.

(4) A boundary size between light exposure and electron beam exposure is defined. Patterns smaller than the boundary size are classified as patterns exposed by electron beam exposure, and patterns greater than the boundary size are classified as patterns exposed by light.

(5) A boundary size between light exposure and electron beam exposure is defined; a value obtained by correcting the boundary size by the first outline movement is used as a reference value; patterns greater than the reference size are classified as patterns exposed by light; and patterns smaller than the reference value are classified as patterns exposed by electron beams.

(6) Prior to a step of converting patterns exposed by electron beams into a data format for an electron beam lithography apparatus, a step is performed to move the positions of at least either of shorter or longer sides of separated patterns exposed by electron beams in a direction perpendicular thereto.

(7) Prior to a step of converting patterns exposed by electron beams into a data format for an electron beam lithography apparatus, a step is performed to move the positions of sides of separated patterns exposed by electron beams which are in contact with patterns exposed by light in a direction perpendicular thereto.

According to the present invention, the outlines of patterns are moved by a first amount $\Delta W1$ such that the sizes of design patterns become smaller than desired pattern sizes to reduce the width of the patterns. Thereafter, patterns exposed by electron beams and patterns exposed by light are separated from each other are extracted. The outlines of the extracted patterns exposed by electron beams are moved by a second amount $\Delta W2$ such that the sizes thereof becomes equal to desired pattern sizes to increase the width of the patterns. In addition, the outlines of the extracted patterns exposed by light are moved by a third amount $\Delta W3$ such that the sizes thereof becomes equal to desired pattern sizes to increase the width of the patterns. As a result, patterns exposed by electron beams and light overlap with each other in areas where they are connected. The amount of overlap is the sum of the second outline movement $\Delta W2$ and third outline movement $\Delta W3$.

Further, considering the deviation in overlapping electron beam exposure and light exposure, amounts ΔW2 and ΔW3 may be set such that the amount of pattern overlap (ΔW2+ΔW3) exceeds the positional shift in overlap. Since a pattern exposed by electron beams and a pattern exposed by light always overlap in areas where they are connected, it is possible to avoid discontinuation of patterns due to a shift in overlapping.

Further, in addition to positional shifts in overlapping of electron beam exposure and light exposure, the amounts of pattern outline movement ΔW1, ΔW2 and ΔW3 may be set in consideration to the accuracy of the beam size of the lithography apparatus used, value of the pattern size change in the process for manufacturing photomasks, value of the pattern size change in resist processing, value of the pattern size change in etching and the like. This makes it possible to correct such factors which can otherwise reduce the accuracy of pattern sizes to perform pattern formation with higher accuracy.

Further, by moving the position of short sides of patterns exposed by electron beams by an arbitrary amount ΔW4, the amount of overlap of the patterns is not limited to the minimum sizes of the design patterns and can be arbitrarily set. Therefore, in the so-called mix-and-match method in the same layer wherein patterns are formed by exposing them to electron beams and light on the same photosensitive material, it is possible to form fine patterns accurately without causing deterioration of the patterns in areas where electron beam exposure and light exposure are connected not only during resist pattern formation but also during etching.

According to the present invention, each of the methods is applied a logic portion of a gate layer of a semiconductor circuit having the logic portion and a memory portion thereon and wherein a method for pattern formation based on light exposure or part simultaneous charged particle beam exposure is used for the memory portion.

According to the present invention, when patterns of a device having both of a memory element and logic element, the memory element area and logic element area are separated, the pattern of the memory element area is formed using the part simultaneous electron beam exposure method or the light exposure technique; and the pattern of the logic element is formed using a method of the present invention which is a combination of light exposure and electron beam exposure. This makes it possible to provide a mass production system subsequent to photolithography which exhibits excellent resolving power exceeding that of light provided by electron beam exposure and throughput equivalent to that achievable using an optical stepper.

According to the present invention, there is provided a computer-readable recording medium that stores a program for generating pattern data for light exposure and electron beam exposure from device design patterns, for controlling a computer such that the outlines of the device design patterns are moved inward by a first amount; patterns exposed by electron beams are extracted from the device design patterns after the movement of the outlines; the outlines of the extracted patterns exposed by electron beams are moved outwardly by a second amount; the patterns exposed by electron beams after the movement of the outline are converted into a data format for an electron beam lithography apparatus; patterns exposed by light are extracted from the device design patterns; and the patterns exposed by light are converted into a data format for a photomask writing apparatus.

According to the present invention, there is provided a computer-readable recording medium that stores a program for generating pattern data for light exposure and electron beam exposure from device design patterns, for controlling a computer such that the outlines of the device design patterns are moved inward by a first amount; the device design patterns after the movement of the outlines are separated into patterns exposed by light and patterns exposed by electron beams; the outlines of the patterns exposed by light are moved outwardly by a second amount; the outlines of the patterns exposed by electron beams are moved outwardly by a third amount; the patterns exposed by light after the movement of the outlines are converted into a data format for a photomask writing apparatus; and the patterns exposed by electron beams after the movement of the outlines are converted into a data format for an electron beam lithography apparatus.

A method for forming patterns according to the present invention is a method wherein desired pattern transfers to a photosensitive material formed on a substrate to be processed are performed using light exposure utilizing photomask masks and charged particle beam exposure and the transfer of at least patterns beyond the limit of resolution of light exposure is carried out using charged particle beam exposure, characterized in that the pattern formation is performed with predetermined correction to suppress (avoid) the influence of back-scattered electrons on the patterns exposed by light during charged particle beam exposure (A1).

Preferred manners for carrying out the present invention are as follows.

(1) The predetermined correction is performed using photomasks used for light exposure in A1 (A2).

(2) The predetermined correction is performed by varying the pattern sizes of the photomasks used for light exposure in A1 (A3).

(3) The photomasks are generated by a charged particle beam exposure apparatus employing proximity effect correction for dose control and wherein the predetermined correction is carried out by modulating a map of incident dose used during the generation of the photomasks in A1 through A3 (A4).

(4) The modulation of the map of incident dose is performed depending on whether there is any effect of back-scattered charged particles at the time of the exposure of charged particle beams in A4 (A5).

(5) The modulation of the map of incident dose used in photomask making is carried out by obtaining the incident charged particles from a relational expression: pattern size change per charged particle on wafer×back-scattered charged particles=reduction ratio of stepper×pattern size change per charged particle on photomask×incident charged particles in A4 (A6).

(6) The process of generating data for the map of incident dose comprises the step of: obtaining a map of proper doses for drawing a pattern exposed by light on a photomask substrate; obtaining a distribution map of energy accumulated by back-scattered charged particles during the drawing a pattern exposed by charged particles on a wafer; converting the distribution map of energy accumulated by back-scattered charged particles into a distribution map of variation of the pattern size exposed by light; enlarging the distribution map of variation of the pattern size exposed by light by an inverse multiple of the reduction factor of a stepper for light exposure; converting the enlarged distribution of variation of the pattern size exposed by light into a distribution map of converted values of photomask exposure doses; and subtracting the distribution map of converted values of photomask exposure doses from the map of proper doses in A4 (A7).

(7) The predetermined correction is carried out by modulating the pattern size exposed on photomasks during the fabrication of the same in A1 through A3 (A8).

(8) The modulation of the pattern size is carried out depending on whether there is any effect of back-scattered charged particles during the exposure of charged article beams in A8 (A9).

(9) The modulation of the pattern size is carried out by obtaining the amount of the pattern size change on photomask from a relational expression: ratio of pattern size change on wafer to back-scattered charged particle×back-scattered charged particles=reduction ratio of stepper×pattern size change on photomask in A8 (A10).

(10) The step of generating data for the map of pattern size comprises the steps of: obtaining a distribution map of energy accumulated by back-scattered charged particles during the drawing a pattern exposed by charged particle beams on a wafer; converting the distribution map of energy accumulated by back-scattered charged particles into a distribution map of variation of the pattern size exposed by light; enlarging the distribution map of variation of the pattern size exposed by light by an inverse multiple of the reduction factor of a stepper for light exposure; and subtracting the enlarged distribution map of variation of the pattern size exposed by light from the pattern exposed by light drawn on the photomask substrate in A8 (A11).

(11) The predetermined correction is carried out by correcting device pattern data in A1 (A12).

(12) The predetermined correction is carried out by keeping a definite distance between the area of the pattern exposed by light and the area of the pattern exposed by charged particle beams except in a pattern area connecting those areas in A1 or A12 (A13).

(13) The constant distance is a distance corresponding to the scattering diameter of back-scattered charged particles during the exposure of charged particle beams in A13 (A14).

(14) The constant distance is determined by the degree of the effect of back-scattered charged particles during the exposure of charged particle beams in A13 (A15).

(15) The predetermined correction is carried out by varying the sizes of the pattern of a photomask used for light exposure and wherein the sizes of the pattern of the photomask are varied by varying the dose based on the relationship between the variation of the dose of charged particle beams used for drawing the photomask and the variation of the pattern sizes identified in advance in A1 (B1).

Further, according to the present invention, there is provided a method for forming patterns wherein a desired pattern is formed on a substrate by applying charged particle beams on the substrate, comprising the steps of: identifying the relationship between the variation of the dose of charged particle beams and the variation of pattern sizes in advance; and varying the pattern sizes by varying the dose (B2).

The relationship between the variation of the dose of charged particle beams and the variation of the pattern sizes is set at a desired value by varying the amount of blur of charged particle beams in B1 or B2 (B3).

The method for forming patterns according to B1 through B3, further comprises the step of creating a map of doses in advance (B4).

The step of creating a map of doses comprises the steps of: establishing a map of proper doses for drawing a pattern exposed by light on a photomask substrate; establishing a distribution map of energy accumulated by back-scattered charged particles during the drawing of a pattern exposed by charged particle beams on a wafer; converting the distribution map of energy accumulated by back-scattered charged particles into a distribution map of the variation of the sizes of the pattern exposed by light; enlarging the distribution map of the variation of the sizes of the pattern exposed by light by an inverse multiple of the reduction factor of a stepper for light exposure; converting the enlarged distribution map of the variation of the sizes of the pattern exposed by light into a distribution map of converted values of doses for photomask exposure; and subtracting the distribution map of converted values of doses for photomask exposure from the map of proper doses in B4 (B5).

The amount of blur of charged particle beams is varied by varying the focal position of an optical system for focusing charged particle beams in B3 (B6).

According to the present invention, there is provided a method for forming patterns wherein desired pattern transfers on a photosensitive material formed on a substrate to be processed using light exposure and charged particle beam exposure employing photomasks and wherein the transfer of patters beyond the limit of resolution of light exposure is performed using charged particle beam exposure, the method comprising the step of performing desired pattern formation using an organic photosensitive material having high contrast which is sensitive to light and charged particle beams (C1).

An organic photosensitive material having a PH jump mechanism as the organic photosensitive material in C1 (C2).

A high contrast photosensitive organic material is a photosensitive material whose ratio of residual film is abruptly decreased when the dosage on the photosensitive organic material exceeds a predetermined value.

According to the present invention, patterns exposed by light and electron beams are separated through a predetermined process to make it possible to perform pattern formation with excellent resolving power beyond that achievable with photolithography provided by electron beam exposure and excellent throughput provided by light exposure. Further, a predetermined process is carried out to separate light-exposed patters which are to be subjected to exposure of character projection or a similar method. This makes it possible to form patterns for which high accuracy of the size is required with accuracy higher than that of the variable shaping beam method.

According to the present invention, device design patterns are narrowed by predetermined sizes and, thereafter, patterns exposed by electron beams are extracted and oversized by predetermined sizes. This makes it possible to prevent reduction of the accuracy of pattern formation in each pattern connecting area attributable to misalignment between light exposure and electron beam exposure without oversizing patterns exposed by light or electron beams. It is therefore possible to provide a lithography system which has excellent resolving power beyond that achievable with light provided by electron beam exposure, high pattern forming accuracy and throughput equivalent to that achievable with an optical stepper and which can be adapted to mass production that follows photolithography.

In addition, the present invention makes it possible to perform pattern formation with high resolving power and high throughput by controlling the influence of back-scattered electrons during charged particle beam exposure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A through 8C are pattern diagrams showing steps for generating data for electron beam exposure according to the second and third embodiments of the present invention;

FIG. 9A through 9C are pattern diagrams showing steps for generating data of photomask writing for light exposure according to the second and third embodiments of the present invention;

FIG. 11A through 11E are pattern diagrams showing steps for generating data for light exposure and data for electron beam exposure according to a fourth embodiment of the present invention;

FIGS. 12A through 12C are diagrams showing steps for exposing a resist according to the fourth embodiment of the present invention;

FIGS. 42A through 42C are diagrams for explaining functions of the method for pattern formation according to the eleventh embodiment of the present invention;

DETAILED DESCRIPTION OF THE INVENTION

Preferred embodiments of the present invention will now be described with reference to the accompanying drawings.

<First Embodiment>

A first embodiment of the present invention will be described with reference to an example of the processing of a gate electrode of a MOSFET. The present embodiment is an example wherein a negative-tone resist sensitive to electron beams and deep-UV (DUV) light is used as a photosensitive agent.

Figure 1A:
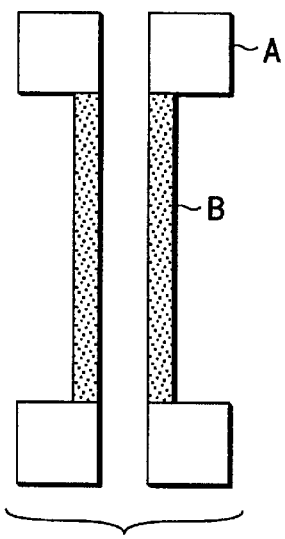
FIGS. 1A through 1D are views illustrating deterioration of pattern shapes attributable to errors in overlapping light exposure and electron beam exposure according to the prior art.
Figure 1B:
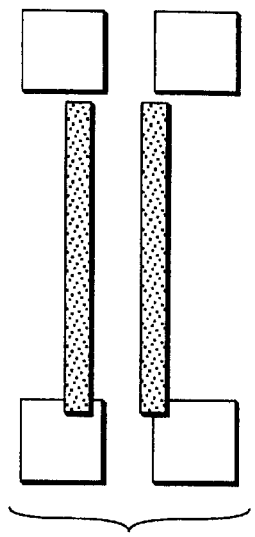
Figure 1C:
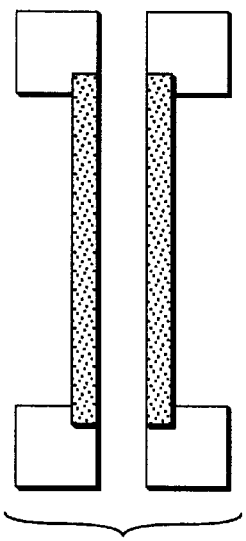
Figure 1D:
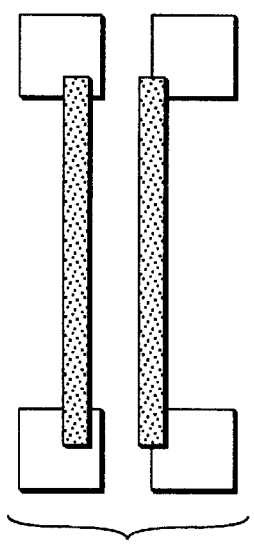
Figure 2:
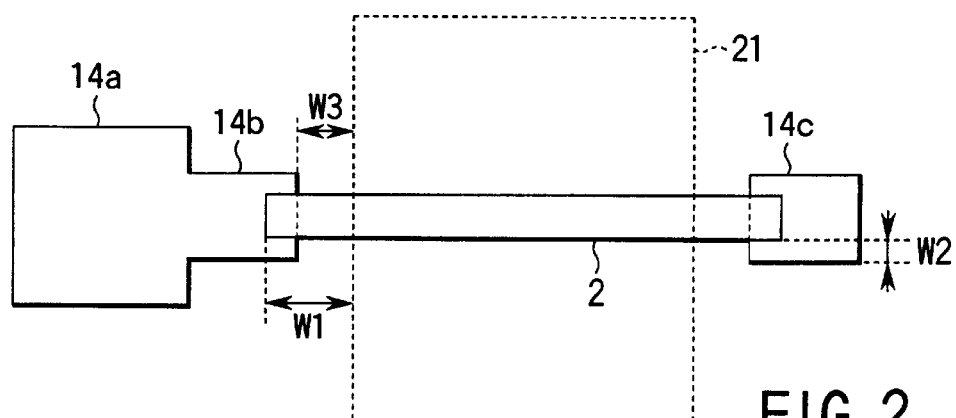
FIG. 2 is a pattern diagram showing an example of a pattern of a gate layer according to a first embodiment of the present invention.

FIG. 2 illustrates exposure patterns for forming a gate. FIG. 2 shows a pattern 21 for an active area layer formed prior to forming the gate and patterns 12 and 14a through 14c for a gate layer. Specifically, the patterns for the gate layer are a gate pattern 12 for a MOS transistor, a pad pattern 14a to establish conduction to a wiring layer above the gate layer, a gate wiring pattern 14b for connecting the gate and the pad and a fringe pattern 14c on an element separating area. While the term "gate" in general means an area on only the active area 21, the gate pattern 12 of the present invention is configured such that it protrudes from the active area 21 by an amount W1 to extend over the wiring 14b and fringe 14c. The active area 21 is apart from the wiring 14b and the fringe 14c at a distance W3. In the present embodiment, the gate pattern 12 is exposed by electron beams and the remaining patterns 14a through 14c are exposed by deep-UV light during pattern transfers on to the same photosensitive material of the gate layer.

Figure 3:
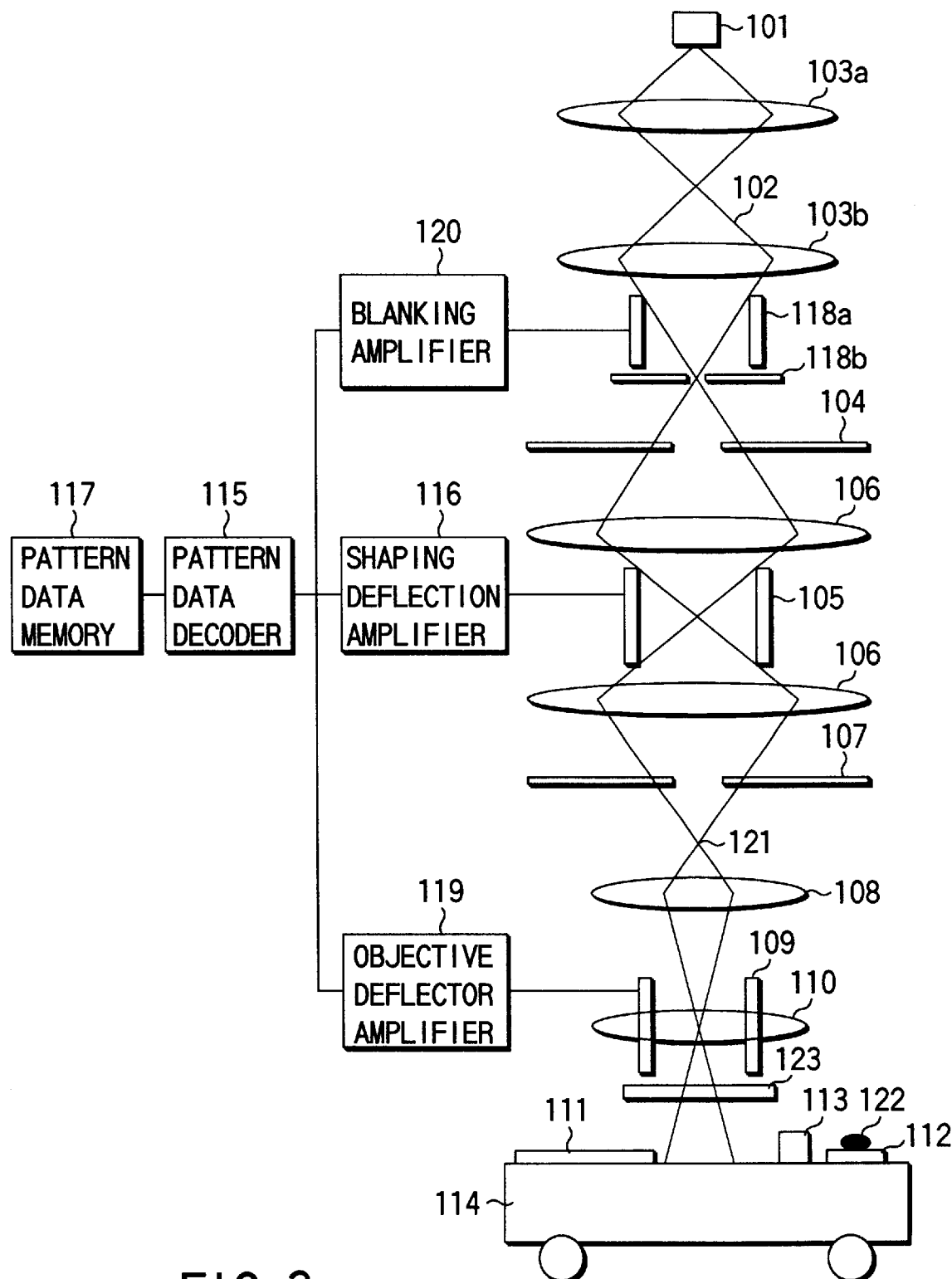
FIG. 3 schematically illustrates a configuration of an electron-beam exposure apparatus used with the present invention.

FIG. 3 schematically illustrates a configuration of an electron-beam exposure apparatus used in the present embodiment.

The current density and Koehler illumination conditions of electron beams 102 emitted by an electron gun 101 are adjusted by a first condenser lens 103a and a second condenser lens 103b to irradiate a first shaping aperture 104 uniformly. An image of the first shaping aperture is formed on a second shaping aperture 107 through a projection lens 106. The degree of optical overlap between the first and second apertures is controlled by a shaping deflector 105 to perform functions such as selecting an aperture used for exposure of character projection and generating variable shaping beam used for VSB exposure. The shaping deflector 105 is connected to a shaping deflection amplifier 116 to which deflection data from a pattern data decoder 115 is sent.

An image originating from an optical overlap between the first shaping aperture 104 and second shaping aperture 107 is reduced by a reduction lens 108 and an objective lens 110 to be formed on a sample 111. The position of electron beams 102 on the surface of the sample is set on the sample 111 by an objective deflector 109. The objective deflector 109 is controlled by a pattern data decoder 115 and an objective deflector amplifier 119. The sample 111 is placed on a movable stage 114 along with a Faraday cup 113 and a mark stand 112 for measuring the sizes of electron beams, and the sample 111, mark stand 112 or Faraday cup 113 may be selected by moving the movable stage 114.

When the position of electron beams on the sample 111 is moved, in order to prevent unnecessary locations on the sample from being exposed (i.e., in order to prevent electron beams from reaching the surface of the sample 111), electron beams are deflected by a blanking deflector 118a and the deflected electron beams are cut off by a blanking aperture 118a. A deflecting voltage supplied to the blanking deflector 118a is controlled by a blanking amplifier 120. Various control data are stored in a pattern data memory 117.

The basic configuration described above is the same as that of conventionally known electron-beam exposure apparatuses. An electron-beam exposure apparatus used in the present embodiment is capable of generating an image originating from an optical overlap between the first shaping aperture 104 and second shaping aperture 107 according to the method described below. Specifically, an electron beam image projected upon the second shaping aperture through the first shaping aperture includes an area sandwiched by at least part of a pair of sides facing each other of an opening (shaping pattern) formed on the second shaping aperture.

FIGS. 4A through 4D are schematic views of overlaps between areas 131 on the second shaping aperture 107 exposed by electron beams through the first shaping aperture 104 (electron beam images) and opening patterns 132 formed on the second shaping aperture 107. Any of FIGS. 4A through 4D satisfies the above-described conditions.

Figure 4A:
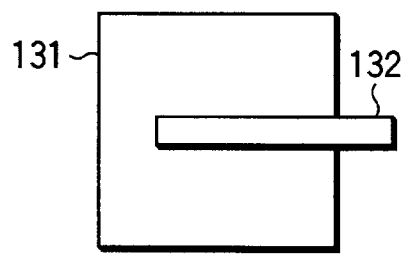
FIGS. 4A through 4D are views schematically illustrating overlapping of an area exposed by electron beams on a second shaping aperture through a first shaping aperture and a pattern of an opening formed on the second shaping aperture.

Referring to FIG. 4A, the opening pattern 132 is rectangular and partially protrudes from the area 131 exposed by electron beams. The opening pattern 132 of FIG. 4B has a rectangular shape and is entirely included in the area 131 exposed by electron beams. The opening pattern 132 of FIG. 4C has an L-shaped configuration and partially protrudes from the area 131 exposed by electron beams. The opening pattern 132 in FIG. 4D has an L-shaped configuration and is entirely included in the area 131 exposed by electron beams.

Figure 4B:
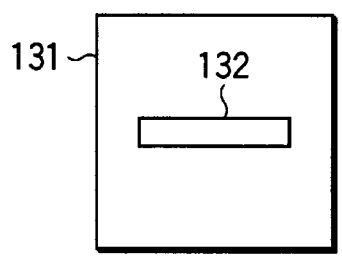
Figure 4C:
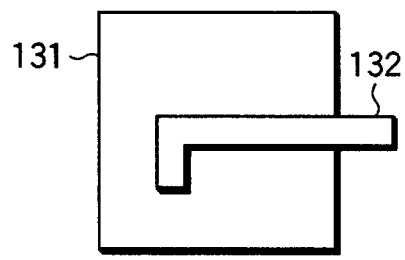
Figure 4D:
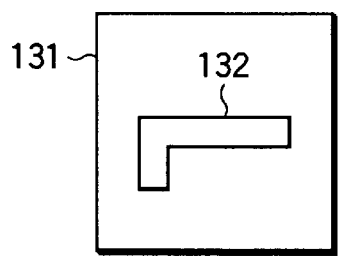

As shown in FIGS. 4B and 4D, an opening pattern 132 entirely included in the area 131 exposed by electron beams indicates that the exposure method of character projection is used.

Figure 5:
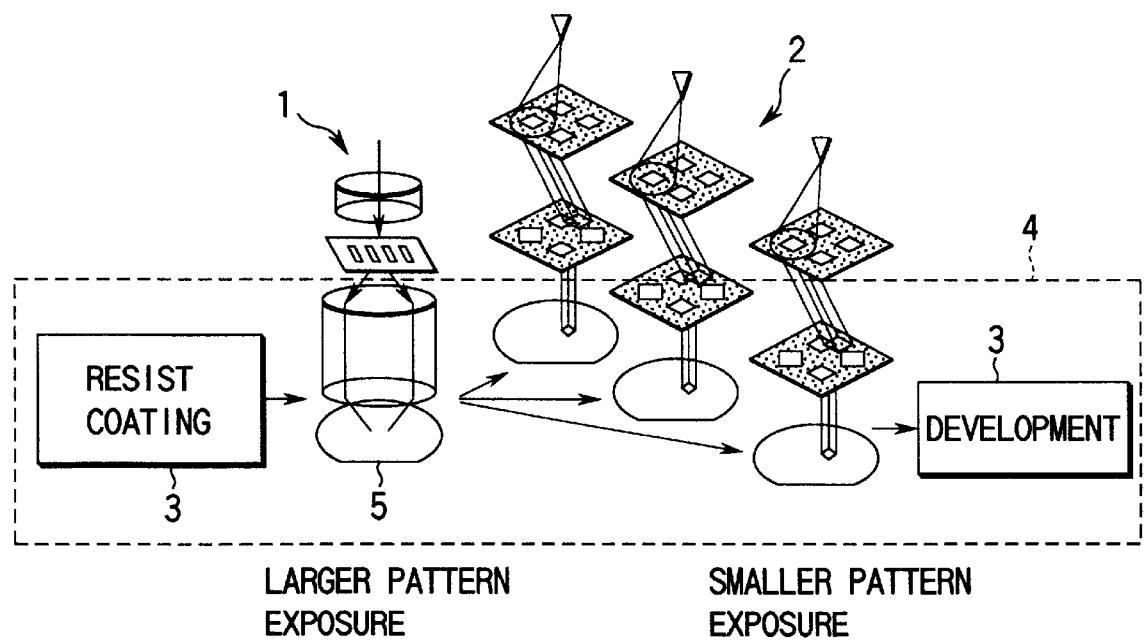
FIG. 5 schematically illustrates a configuration of a lithography system used in each embodiment of the present invention.

FIG. 5 illustrates the concept of a lithography system used in an embodiment of the present invention. FIG. 5 shows a deep-UV stepper 1, an electron-beam exposure apparatus 2, a resist coating and development device 3, a device 4 for transporting resist between the above-described devices in an environment having a controlled atmosphere to perform an in-line process thereon and a semiconductor wafer 5.

The wafer 5 having resist applied thereon by the resist coating and development device 3 is transported by the device 4 to the deep-UV stepper 1 where photomask patterns are reduced and sequentially subjected to light exposure on the entire surface of the wafer 5. The photomasks used here are formed with of the pad pattern 14a, wiring pattern 14b and fringe pattern 14c shown in FIG. 2 which are transferred on to the wafer 5. When the light exposure is complete, the wafer 5 is transported to the electron-beam exposure apparatus 2 by the device 4. After the positioning of the patterns to be subjected to electron beam exposure is completed on the light-exposed wafer, each of chips on the entire surface of the wafer 5 is sequentially exposed by electron beams. The patterns exposed by electron beams here are gates 12 shown in FIG. 2.

Since the throughput of electron beam exposure is generally lower than that of the stepper 1, a plurality of electron-beam exposure apparatuses are provided to configure the system such that the processing capacity of the stepper is not rate-determined by the processing capacity of the electron-beam exposure apparatus and such that wafers 5 transported out of the stepper 1 can be processed in parallel using a plurality of the electron-beam exposure apparatuses 2. This makes it possible to utilize both of the high resolution of electron beam exposure and the high throughput of the stepper. After all of the patterns are formed on all chips on the entire surface of the wafer 5, the device 4 returns the wafer 5 to the coating and development device 3 where the formation of patterns for a gate layer is completed.

By forming the patterns of the gate layer using such a pattern forming method, it is possible to produce a high performance device having a microscopic gate length at a resolution higher than the limit of resolution of light exposure in a short time.

Further, by using the character projection method or the line as shown in FIGS. 4A through 4D for the exposure of the gate 12 using electron beams, the gate length is determined by only the width of the opening pattern of the second shaping aperture. It is therefore possible to avoid instability of the accuracy of beam shaped and sizes which is an essential error factor of the variable shaping beam method and to accurately perform pattern formation in the direction of the gate length which must be highly accurate.

In addition, the gate 12 exposed by electron beams protrude from the boundary of the active area by an amount W1, and a distance W3 is kept between the active area 21 and wiring 14b and between the active area 21 and fringe 14c. As a result, any misalignment between the active area layer and gate layer will not cause the patterns of the fringe 14c and wiring 14b which follow more relaxed size rules compared to those for the gate 12 to intrude the active area 21 as long as the amount of the positional shift is equal to or smaller than W3. It is therefore possible to expand the gate length partially, thereby preventing deterioration of. the performance of transistor. Further, since the gate pattern is exposed by electron beams which has a great focal depth at the step between the element separation area and active area, it is possible to avoid the disadvantage of a reduction of the pattern width at the step. Moreover, since the gate 12 exposed by electron beams and the wiring 14b and fringe 14c exposed by light overlap by an amount (W1−W3), any misalignment of the pattern exposed by electron beams and the patterns exposed by light in the same layer will now cause the disadvantage of a gap at the area where the gate 12 is connected to the wiring 14b or fringe 14 as long as the amount of the positional shift is equal to or smaller than W1−W3.

According to the present embodiment, the patterns of the fringe 14c and wiring 14b can be resolved by light under a design rule which is less strict than that for the pattern of the gate 12 by W2. Smaller patterns can be subjected to light exposure by performing OPC (optical proximity effect correction) and using ultra-resolution techniques such as phase shift masks and transformed illumination in addition to this.

When smaller pattern sizes at resolutions higher than the limit of resolution of light, electron beam exposure may be carried out instead of light exposure. In this case, it is possible to form the fringe 14c and wiring 14b with the same line width as that of the gate 12. Further, by exposing the fringe 14c and wiring 14b to electron beams, it is possible to avoid the disadvantage of retraction of patterns that occurs in light exposure due to diffraction at the pattern edges. This makes it possible to prevent unwanted flow of a current attributable to shorting between the source and drain caused by the retraction of the fringe 14c. It is also possible to prevent the occurrence of gaps between light-exposed pattern and electron-beam-exposed pattern attributable to the retraction of the wiring 14b. In addition, since there is no need for the OPC process to prevent the retraction of those patterns, a significant reduction is achieved in the time required for data processing. Moreover, the areas of patterns especially the area of the fringe 14c can be reduced, which allows the area of the chip to be reduced.

<Second Embodiment>

A second embodiment of the present invention will now be described. The present embodiment represents specific methods for generating the patterns described in the first embodiment.

Figure 6:
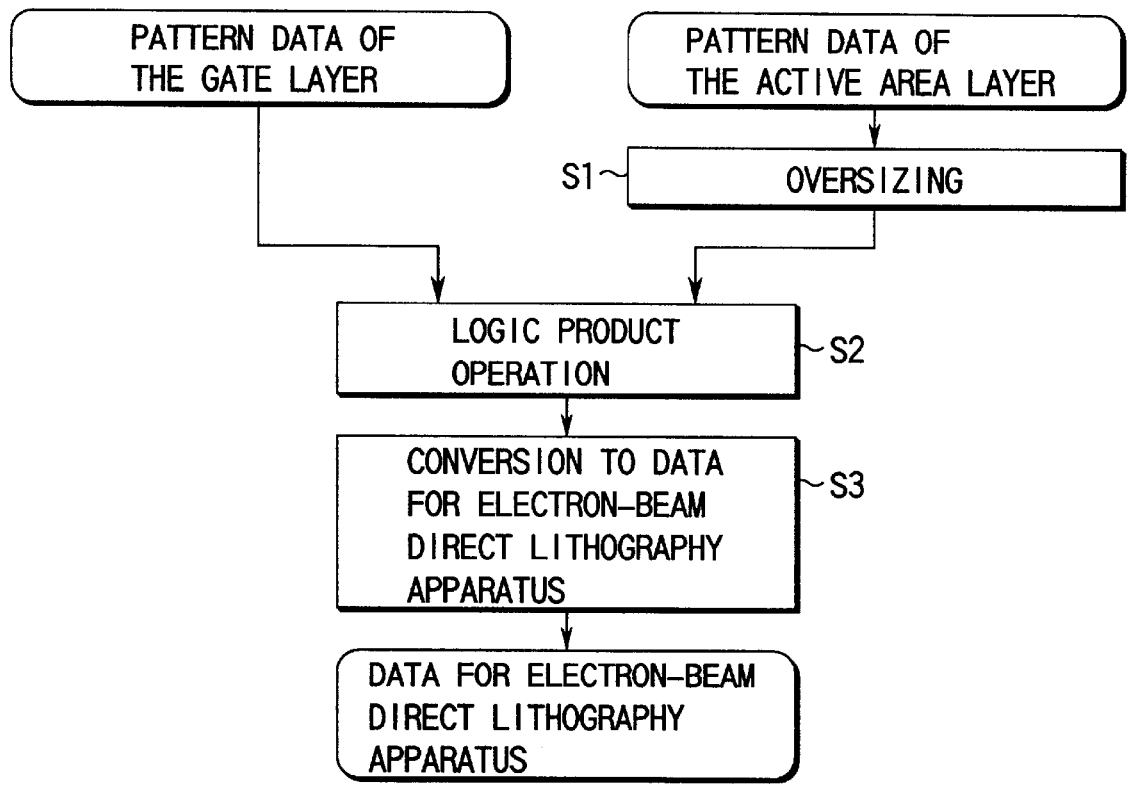
FIG. 6 is a flow chart showing steps for generating data for electron beam exposure according to a second embodiment of the present invention.
Figure 7:
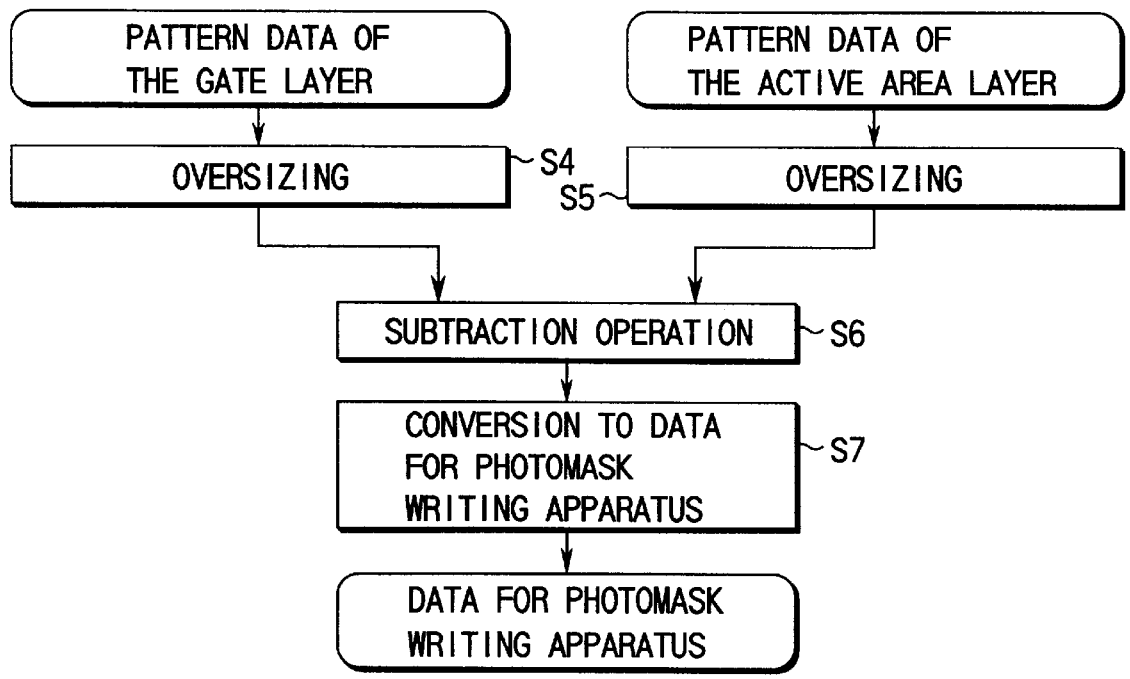
FIG. 7 is a flow chart showing steps for generating data of photomask writing for light exposure according to the second embodiment of the present invention.

FIGS. 6 and 7 are flow charts showing methods for generating pattern data used for electron beam exposure and light exposure. The methods for generating pattern data will be described briefly with reference to the flow charts.

FIG. 6 is a flow chart showing a method for generating pattern data used for electron beam exposure. First, original pattern data for the gate layer and original pattern data for active area layer are input and, thereafter, a process is performed to oversize the original pattern for the active area layer (S1). Then, the pattern for the gate layer and the result of step S1 are ANDed (S2), and the result is converted into data for an electron-beam direct lithography apparatus (S3).

FIG. 7 is a flow chart showing a method for generating pattern data for generating photomasks used in light exposure. First, original pattern data for the gate layer and original pattern data for the active area. layer are input. Then, processes are performed to oversize the original pattern for the gate layer (S4) and to oversize the original pattern for the active area layer (S5). Thereafter, the result of step S5 is subtracted from the result of step S4 (S6), and the result is converted into data for a light exposure photomask writing apparatus (S7).

The present embodiment will now be described in more detail with reference to the pattern diagrams shown in FIGS. 8A through 9C.

FIGS. 8A through 8C illustrate pattern shapes at respective steps in the method for generating data for electron beam exposure. FIG. 8A shows an original pattern 11 for the gate layer and an original pattern 21 for the active area layer to be input in an overlapping relationship with each other. FIG. 8B shows the result of step S1 wherein the original pattern 21 for the active area layer has been oversized by an amount W1 to provide a pattern 22. FIG. 8C shows the result of step S2 wherein the original pattern 11 for the gate layer and the oversized pattern 22 of the active area layer have been ANDed to extract a gate pattern 12. The gate pattern 12 thus extracted is converted at step S3 into data for electron beam exposure. In doing this, a oversizing resize processing and a narrowing resize processing are performed in consideration to an electron beam exposure process and, in addition, a pattern for process evaluation and a mark pattern for the alignment of the gate layer and layers thereon are synthesized.

FIGS. 9A through 9C illustrate pattern shapes at respective steps in the method for generating exposure pattern data for generating photomasks used in light exposure. FIG. 9A shows an original pattern 11 for the gate layer and an original pattern 21 for the active area layer to be input in an overlapping relationship with each other. FIG. 9B shows the results of steps S4 and S5 in an overlapping relationship wherein the original pattern 11 for the gate layer has been oversized at step S4 by an amount W2 to provide a pattern 13 and wherein the original pattern 21 for the active area layer has been oversized at step S5 by an amount W3 to provide a pattern 23. At step S6, a process is performed to subtract the pattern 23 from the pattern 13 (the pattern 13 is masked with the pattern 23) to extract a pad 14a, wiring 14b and fringe 14c as shown in FIG. 9c. The patterns 14a through 14c thus extracted are converted at step S7 into data for photomask lithography for light exposure. In doing so, a oversizing resize processing or narrowing resize processing is carried out in consideration to a mask generation process, and a pattern for process evaluation and a mask pattern for the alignment of the gate layer and layers thereon are synthesized. Further, a process is performed to enlarge patterns by an inverse multiple of the reduction factor of the deep-UV stepper used for light exposure.

According to the present embodiment, since the original pattern 21 for the active area layer and the original pattern 11 for the gate layer are ANDed, only the gate pattern 12 can be easily extracted from the pattern for the gate layer. Further, since the extracted pattern is used for electron beam exposure, a gate length can be finished with accuracy higher than that achievable with light exposure. In addition, since the pattern for the active area layer is subtracted from the pattern for the gate layer, it is possible to extract the pad 14a, wiring 14b and fringe 14c easily from the pattern for the gate layer.

Moreover, according to the present embodiment, different amounts are employed for the oversizing resize processing on the original pattern for the active area layer when the patterns exposed. by electron beams and light exposure are generated. Since this results in an overlap between the patterns exposed by electron beams and light exposure, it is possible to avoid the disadvantage of discontinuation between the patterns exposed by electron beams and light exposure attributable to a misalignment of those patterns and the disadvantage of inoperability of the element.

Step S4 to oversize the patterns to achieve sizes that can be resolved using light may be carried out after step S6 for extracting the pattern exposed by light or may be replaced by an OPC process.

<Third Embodiment>

A third embodiment of the present invention will now be described. The present embodiment represents a specific method for generating patterns as described in the first embodiment.

Figure 10:
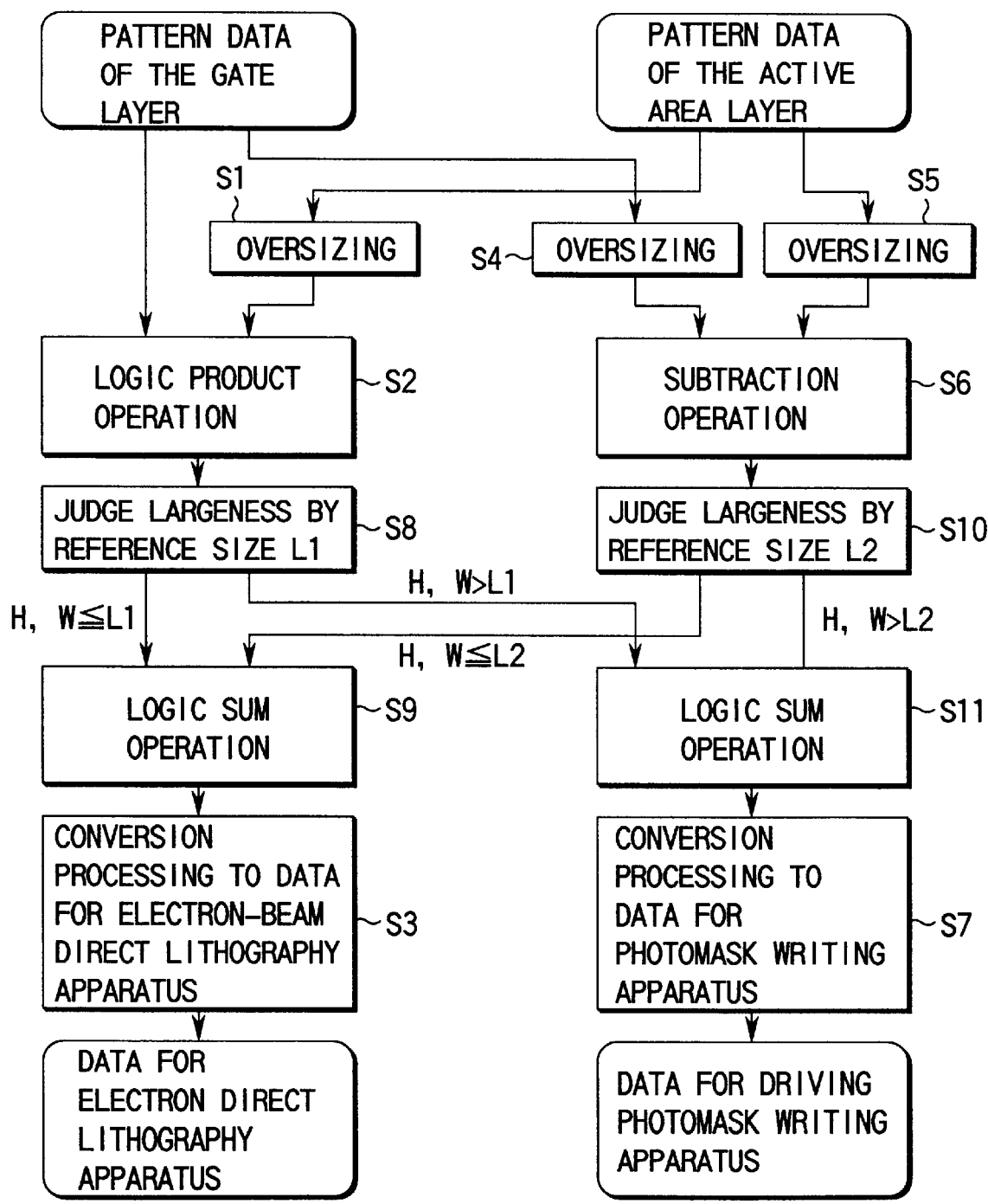
FIG. 10 is a flow chart showing steps for generating data for electron beam exposure and data of photomask writing for light exposure according to the third embodiment of the present invention.

FIG. 10 is a flow chart schematically showing methods for generating pattern data used for electron beam exposure and light exposure. Processes in FIG. 10 similar to those in FIGS. 5 and 6 are indicated by like reference numbers. The method for generating pattern data will be described with reference to this flow chart and the pattern diagrams shown in FIGS. 8A through 9C.

The part of FIG. 10 primarily shown in. the left half thereof shows a method for generating pattern data used for electron beam exposure.

First, original pattern data for a gate layer and original pattern data for an active area layer are input, and processes are performed to oversize an original pattern for the active area layer and to oversize and original pattern for the active area layer (S1). The result of the process at step S1 is as shown in FIG. 8B wherein an original pattern 21 for the active area layer has been oversized by an amount w1 to provide a pattern 22. Subsequently, an original pattern of the gate layer and the result of the process at step Si are ANDed (S2). The result of the process at step S2 is as shown in FIG. 8C wherein an original pattern 11 of the gate layer and the oversized pattern 22 for the active area layer are ANDed to extract a gate pattern 12.

Thereafter, the line width W and line length H of the patterns are examined, and the patterns are separated into patterns greater and smaller than a given size L1 as a reference (S8). The patterns smaller than the reference size L1 are ANDed with the result of the process at step S10 to be described later (S9). The result of the process at step S9 is converted into data for electron beam direct lithography apparatus (S3). In doing so, a oversizing resize processing or narrowing resize processing is performed taking an electron beam exposure process into consideration, and a pattern for process evaluation and a mark pattern for the alignment of the gate layer and layers thereon are synthesized.

The part of FIG. 10 primarily shown on the right-hand side thereof illustrates a method for generating exposure pattern data for generating photomasks used in light exposure.

Original pattern data for a gate layer and original pattern data for an active area layer are input, and processes are performed to oversize an original pattern for the gate layer (S4) and to oversize and original pattern for the active area layer (S5). FIG. 9B shows the results of steps S4 and S5 in an overlapping relationship wherein the original pattern 11 for the gate layer has been oversized at step S4 by an amount W2 to provide a pattern 13 and wherein the original pattern 21 for the active area layer has been oversized at step S5 by an amount W3 to provide a pattern 23. Subsequently, a process is performed to subtract the result of the process at step S5 from the result of the process at step S4 (S6). Specifically, a process is performed to subtract the pattern 23 from the pattern 13 (the pattern 13 is masked with the pattern 23) to extract a pad 14a, wiring 14b and fringe 14c as shown in FIG. 9C.

Thereafter, the line width W and line length H of each pattern are examined, and the patterns are separated into patterns greater and smaller than a given size L2 as a reference (S10). The patterns greater than the reference size L2 are ANDed with the result of the process at step S8 (S11).

The result of step S11 is converted into data for a photomask writing apparatus used for light exposure (S7). In doing so, a oversizing resize processing or narrowing resize processing is performed taking a mask generating process into consideration, and a pattern for process evaluation and a mark pattern for the alignment of the gate layer and layers thereon are synthesized. Further, a process is performed to enlarge the patterns by an inverse multiple of the reduction factor of the deep-UV stepper 1 used for light exposure.

According to the present embodiment, the original pattern 21 of the active area layer and the original pattern 11 of the gate layer are ANDed to extract only the gate pattern 11 from the pattern of the gate layer and, thereafter, the patterns are separated using the line width L1 as a reference to expose the gate pattern 11 larger than the reference size L1 to light. As a result, patterns exposed by electron beams are limited to patterns in sizes smaller than the reference size L1, which reduces the number of shots of exposure to allow the throughput of electron beam exposure to be improved.

The pattern for active area layer is subtracted from the pattern for the gate layer to extract the pad 14a, wiring 14b and fringe 14c and, thereafter, the patterns are separated using the line width L2 as a reference to expose patterns smaller than the reference size L2 to electron beams. As a result, only patterns equal to or greater than the reference size are subjected to light exposure, which relaxes the conditions for light exposure and processing.

After the patterns to be subjected to electron beam exposure and light exposure are separated, a oversizing resize processing or narrowing resize processing is carried out on at least either of them in consideration to the exposure process employed. This makes it possible to adjust the pattern sizes depending on the methods for exposure to improve the accuracy of the sizes of resist patterns which are obtained ultimately.

Furthermore, after separating patterns to be subjected to electron beam exposure and light exposure, a matching mark pattern is synthesized on either of them. This allows alignment of for patterns in layers formed after the layer whose patterns are formed as described above.

Moreover, after patterns to be subjected to electron beam exposure and light exposure are separated, a pattern for process evaluation is synthesized on at least either of them. This makes it possible to monitor the sizes of the patterns obtained using electron beam exposure or light exposure.

<Fourth Embodiment>

A fourth embodiment of the present invention will now be described. The present embodiment of an example wherein a positive-tone resist sensitive to electron beams and deep-UV light is used as a photosensitive agent.

A description will be made first on procedures for generating patterns exposed by light and electron beam exposure with reference to FIGS. 11A through 11E.

FIG. 11A shows an original pattern 11 for a gate layer and an original pattern 21 for an active area layer which are inputs in an overlapping relationship. Referring to FIG. 11B, a process of oversizing an original pattern 11 of the gate layer by an amount W4 to create a pattern 31 which is to serve as a pattern exposed by light. Referring to FIG. 11C, a process is performed to both of the original pattern of the gate layer and the original pattern 21 of the active area layer by an amount W5 to create patterns 32 and 33. The amounts W4 and W5 satisfy a relationship "W5>W4". Referring to FIG. 11D, the patterns 11 and 32 are subjected to exclusive OR (EXOR) to create a pattern 34. Referring to FIG. 11E, the patterns 33 and 34 are ANDed to create a pattern 35 (opening pattern). This pattern 35 serves as a pattern exposed by electron beams.

Next, a description will be made with reference to FIG. 12A through 12C on a procedure for creating a resist pattern for a gate using the pattern 31 exposed by light and the pattern 35 exposed by electron beams created according to FIGS. 11A through 11E.

First, a positive-tone resist is exposed by deep-UV light using the pattern 31 exposed by light to form a pattern area 41 (the outside of the pattern 41 is exposed by the light) as shown in FIG. 12A. Then, as shown in FIG. 12B, a positive-tone resist is exposed by electron beams using the pattern 35 exposed by electron beams to form a pattern area 42 (the inside of the pattern 42 is exposed). At this time,:the pattern areas 41 and 42 overlap with each other across a width W4. The exposure of character projection as shown in FIGS. 4A through 4D or the like is employed for electron beam exposure performed here. By developing the resist having such an exposure pattern formed thereon, a resist pattern 43 as shown in FIG. 12C will be produced.

Such a method for pattern formation, when used for forming a pattern on the gate layer, makes it possible to produce a high performance device having a gate length having fineness beyond the limit of resolution of light exposure in a short period of time.

When the pattern 35 that defines the width in the direction of the gate length is exposed by electron beams, the exposure of character projection as shown in FIGS. 4A through 4D or the like may be used to so that the gate length is defined only by the width of the opening pattern of the second shaping aperture. According to the variable shaping beam method, two rectangular patterns 35 must be exposed in two separate cycles. As a result, an error may occur in the distance between the two rectangular patterns which is attributable to a positional error in beam deflection. According to this method wherein two rectangular patterns can be exposed simultaneously, a positional error in beam deflection will create no disadvantage. It is therefore possible to avoid instability of the shape and accuracy of the size of beams which is an essential error factor for the variable shaping beam method, thereby allowing the demand for high accuracy on pattern formation in the direction of the gate length to be satisfied.

Further, the gate area defined by the pattern exposed by electron beams outwardly protrudes from the boundary of the active area by an amount W5. As a result, any misalignment of the active area layer and gate layer will now cause the pattern area according to a size rule less strict than that for the gate to intrude into the active area as long as the amount of the positional shift is equal to or smaller than W5. It is therefore possible to oversize the gate length partially, thereby preventing deterioration of the performance of the transistor. Since the patterns exposed by electron beams and light overlaps by an amount W4, any misalignment between the electron-beam-exposed pattern and light-exposed pattern in the same layer will not cause the disadvantage of a gap at the area where those patterns are connected as long as the amount of the positional shift is equal to or smaller than W4.

<Fifth Embodiment>

A fifth embodiment of the present invention will now be described. The present embodiment is an application of the methods for pattern formation described in the first through fourth embodiments in the generation of a pattern of a gate layer of a semiconductor device having both of a memory circuit portion and a logic circuit portion.

Figure 13:
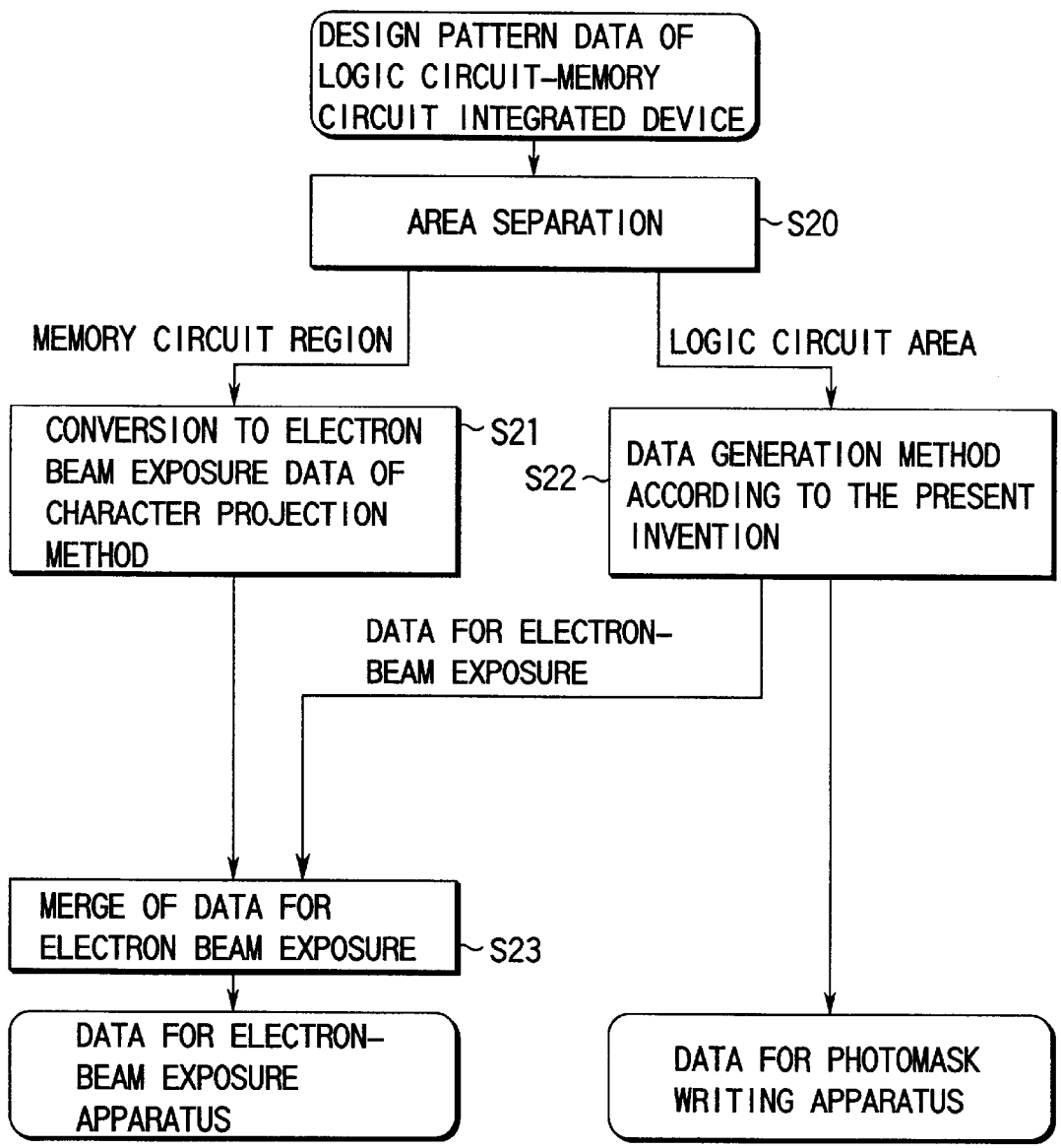
FIG. 13 is a flow chart showing steps for generating data for electron beam exposure and data of photomask writing for light exposure according to a fifth embodiment of the present invention.

FIG. 13 is a flow chart for explaining the present embodiment. First, the pattern of the gate layer is separated into a memory circuit area and a logic circuit area (S20). The pattern of the memory circuit area is converted into lithographic data for part simultaneous electron beam exposure (S21), and the pattern of the logic circuit area is separated into a pattern exposed by electron beams and a pattern exposed by light using the methods described in the first, second and third embodiments (S22). Thereafter, the pattern of the memory circuit area and the pattern exposed by electron beams of the logic circuit area are merged and converted into data for an electron-beam exposure apparatus (S23).

Figures 14, 15:
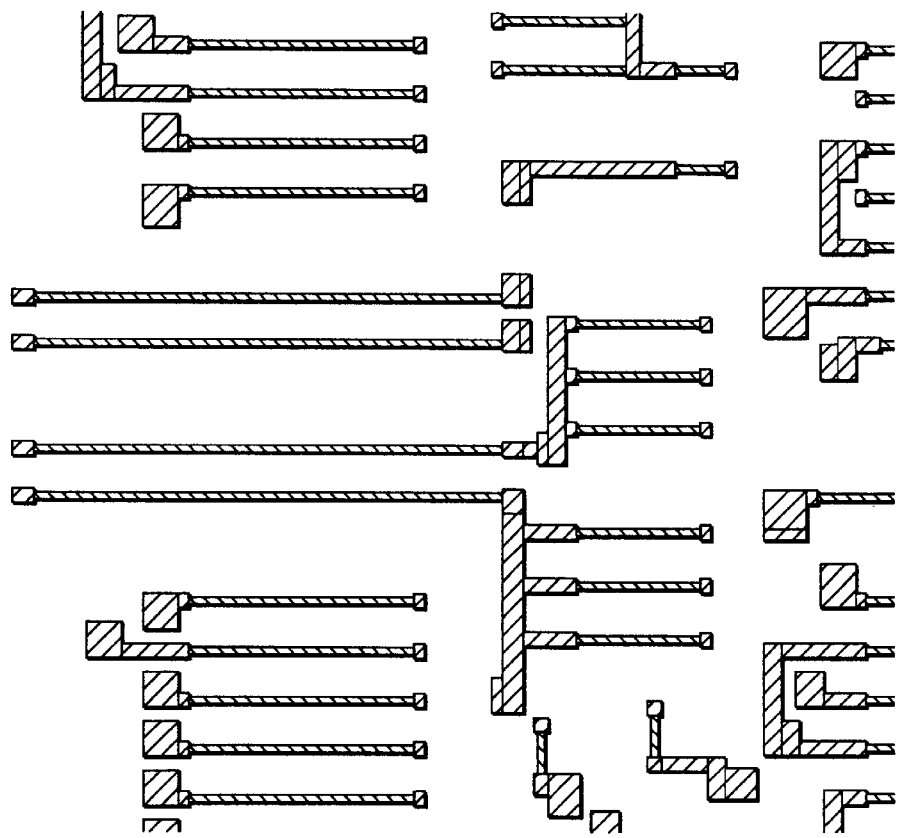
FIG. 14 is a diagram showing the throughput of a lithography system according to the present invention in comparison to throughput achieved by using only electron beam exposure.
FIG. 15 is a view illustrating an example of a resist pattern formed using a conventional method for pattern formation.

FIG. 14 shows the result of a calculation of throughput achieved according to the present invention in comparison to throughput achieved using only electron beam exposure. The exposure pattern used for the calculation of the throughput was a gate forming pattern of a 64 bit RISC processor according to a 0.15 $\mu$m rule. The throughput was calculated by exposing such patterns for 80 chips arranged on the entire surface of an 8-inch chip. The resist sensitivity was 10 $\mu$C./cm$^2$. The electron beam lithography apparatus used for the calculation was HL-800D manufactured by Hitachi. Reference was made to "Journal of Vacuum Science and Technology B9(6) (1991)" pp. 2940–2943 for the performance of this apparatus. The calculation was based on a configuration employing one each stepper and electron-beam exposure apparatus.

Throughput achieved using only electron beam exposure according to a combination of the self-projection method (exposure method of character projection) and the variable shaping beam method is 0.7 sheets/hour whereas throughput is 2.9 sheets/hour, i.e., increased approximately by a factor of four in a case wherein a cache memory portion is exposed using the self-projection method; a logic circuit portion is exposed by electron beams only at a gate pattern in an active area thereof; and other patterns are exposed by a deep-UV stepper. It is considered that our electron-beam exposure apparatuses arranged to allow parallel processing on wafers from the stepper will provide throughput which is satisfactory as a mass production tool.

Next, another embodiment in present invention will be described.

Resists usable or the system as shown in FIG. 5 are chemically amplified resists having high resolution and sensitivity, e.g., UV2HS and UVN-HS (manufactured by Shipley Corp.). The performance of a chemically amplified resist of this type can be easily deteriorated by various chemical substances in the air and, therefore, such a resist is handled in a controlled environment inside or between apparatuses 1, 2 and 3 by providing a transport mechanism 4. This suppresses changes in pattern sizes that otherwise occur during exposure.

Such a configuration of a lithography system makes it possible to form device patterns including fine patterns according to a 0.1$\mu$, rule with high throughput. FIG. 15 shows examples of fine patterns formed on a chemically amplified negative-tone resist UVN having a thickness of 0.65 $\mu$m using this lithography system. Patterns greater than 0.25 $\mu$m were formed using a deep-UV stepper, and patterns equal to or smaller than 0.25 $\mu$m were exposed by electron beams. The developing agent was an aqueous solution of TMAH, and the development was carried out for 60 seconds according to a 0.14 rule. It was revealed that patterns as fine as 0.1 $\mu$m was formed with reliability, and the lithography system had sufficient performance in terms of resolving power.

Figures 16, 17:
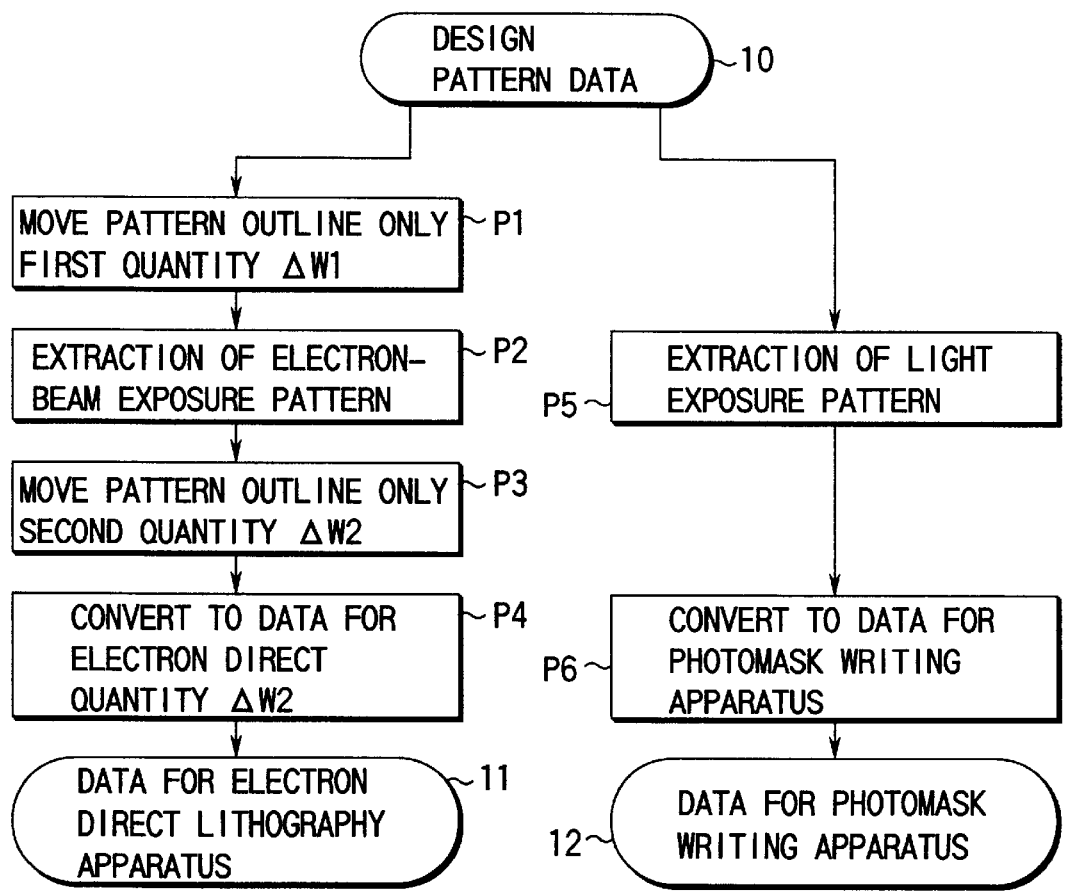
FIG. 16 shows the result of a calculation of the throughput of a lithography system according to the present invention.
FIG. 17 is a diagram showing steps for generating data in a method of generating pattern data according to a sixth embodiment of the present invention.

FIG. 16 shows the result of a calculation of the throughput of this lithography system.

The exposure pattern used for the calculation of the throughput was a gate layer of a 256 Mbit dRAM according to a 0.15 $\mu$m rule. Throughput was calculated by arranging such patterns for 100 chips on the entire surface of an 8-inch wafer. Resist sensitivity was 10 $\mu$C/cm$^2$. Reference was made to Article 1 by Y. Nakayama et al. in Journal of Vacuum Science and Technology, B8(6), 1990, p. 1836, Article 2 by Y. Sohda et al. in Journal of Vacuum Science and Technology, B9(6), 1991, p.2940 and Article 3 by H. Itoh et al. in Journal of Vacuum Science and Technology, B10(6), 1992, p. 2799 for the performance of this apparatus. For this calculation, a configuration including one each stepper and electron-beam exposure apparatus was employed.

Exposure to only electron beam using the exposure method of character projection (the number of cells: 5) provided throughput of 0.3 sheets/hour, while a much higher value of 2.8 sheets/hour was achieved by exposing patterns equal to or greater than a 0.25 $\mu$m rule using a deep-UV stepper and by exposing patterns smaller than them to electron beams using self-projection (the number of cells: 5). It is determined that throughput sufficient for a mass production tool can be achieved by arranging three electron beam lithography apparatuses to process wafers from the stepper in parallel. Therefore, such a lithography system makes it possible to realize a mass production system following photo-lithography which has both of excellent resolving power in the excess of that of light provided electron beam exposure and throughput equivalent to that achieved by an optical stepper.

Hereinafter, embodiment will be describe more concretely.

FIG. 17 illustrates a procedure for generating data in a method for generating pattern data according to a sixth embodiment of the present invention. In FIG. 17, the input is design pattern data 10, and data 11 for an electron-beam direct lithography apparatus and data 12 for a photomask writing apparatus are generated as the output. The former is used in an electron beam direct lithography step, and the latter is used for the manufacture of photomasks and in a subsequent light exposure step. This procedure may be implemented by a computer which reads programs recorded on recording media such as a magnetic disc and operates under control of such programs.

The step of generating the data 11 for an electron-beam direct lithography apparatus consists of step P1 of moving the outline of a design pattern toward the inside of the pattern by a first amount $\Delta W1$ to reduce the width of the pattern, step P2 of extracting a pattern exposed by electron beams, step P3 of moving the outline of the extracted pattern exposed by electron beams toward the outside of the pattern by a second amount $\Delta W2$ to increase the width of the pattern and step P4 of conversion into data for an electron-beam direct lithography apparatus.

The step of generating the pattern data 12 for light exposure consists of step P5 of extracting a pattern exposed by light from the design pattern data 10 and step S6 of converting the extracted pattern exposed by light into data for a photomask writing apparatus. The lithography system used in the present embodiment is the same as that illustrated in FIG. 5.

A description will now be made with reference to FIGS. 18A through 18D on functions at the steps of the method for generating pattern data according to the present embodiment. FIGS. 18A through 18D are pattern diagrams for explaining the functions of the respective processing steps that occur as a result of the application of the method for generating pattern data according to the present invention to patterns 20, 21 and 22 of a gate electrode forming layer of a MOSFET.

In the present embodiment, the design pattern 10 has been subjected to various processes such as enlarging and reducing processes and processes of oversizing and narrowing patterns to be adjusted to desired resist pattern sizes; the size of the boundary between electron beam exposure and light exposure is defined as a pattern width L of the resist pattern; and patterns having sizes smaller than the boundary size L are exposed by electron beams and patterns having sizes equal to or grater than the boundary size L are exposed by deep-UV light to form resist patterns. In the pattern diagram shown in FIG. 18A, a gate electrode 22 having a pattern width smaller than L is exposed by electron beams and pads 20 and 21 to establish conduction to a wiring layer are exposed by deep-UV light to form the patterns.

Figure 18A:
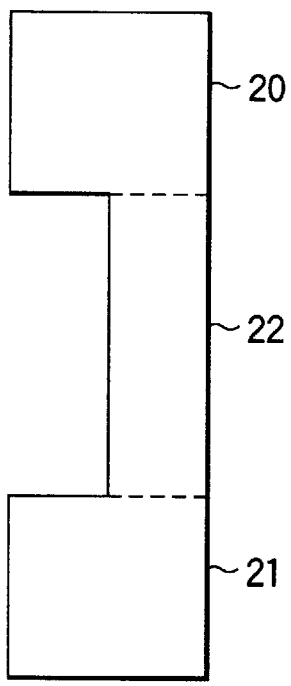
FIGS. 18A through 18D are diagrams for explaining functions at each step of the method for generating pattern data according to the sixth embodiment of the present invention.
Figure 18B:
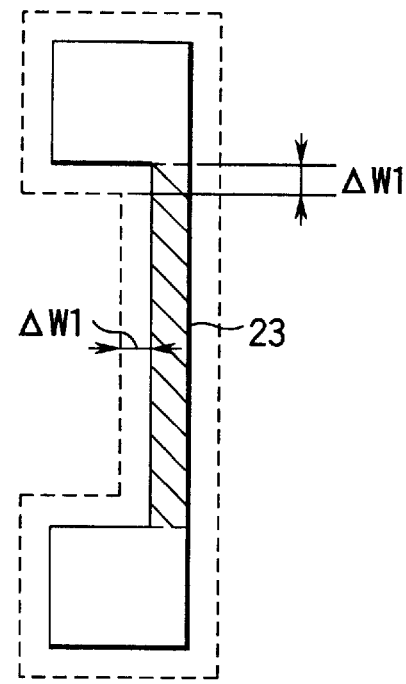

First, at step P1, the outline of the design pattern 10 is moved toward the inside of the pattern by an amount $\Delta W1$ to reduce the pattern width. As a result, as shown in FIG. 18B, the inward movement of the outline of the pattern by $\Delta W1$ results in a reduction of the pattern width by an amount $2\Delta W1$ and retraction of areas where the pads 20 and 21 are connected to the gate electrode 22 by an amount $\Delta W1$.

Next, step P2 extracts patterns exposed by electron beams. For example, the method for extraction is a method wherein patterns having widths smaller than a reference pattern width are extracted as patterns exposed by electron beams. At this time, if the size of the boundary between electron beam exposure and light exposure is defined as a pattern width L of the resist pattern as described above, the boundary size L is narrowed by an amount $2\Delta W1$ to use a value $(L-2\Delta W1)$ as a reference pattern width for extracting patterns exposed by electron beams. As a result, the gate electrode pattern 23 indicated by hatching in FIG. 18B is extracted.

Figure 18C:
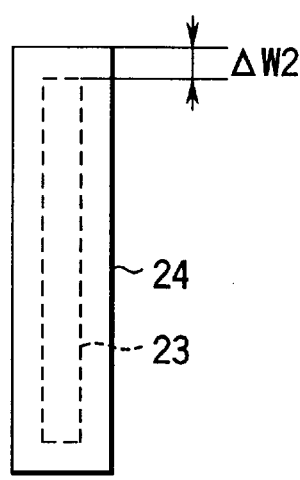

Next, the outline of the pattern extracted at step P3 is moved toward the outside of the pattern by an amount $\Delta W2$ to increase the pattern width. As a result, the width of the gate electrode pattern 23 is increased by an amount $2\Delta W2$ as shown in FIG. 18C to be returned to the same size as the original design pattern, i.e., the desired resist pattern which becomes a pattern 24 exposed by electron beams. At this time, the gate electrode pattern 23 is extended by an amount $\Delta W2$ in the direction of the pad patterns.

At the final step S4, the pattern 24 exposed by electron beams is converted into data 11 for an electron-beam direct lithography apparatus which is used for electron beam exposure.

Referring to patterns exposed by light, at step P5, the pad patterns 20 and 21 having sizes greater than L are extracted from the design pattern using the boundary size L between the electron beam exposure and light exposure as a reference. Further, those patterns are converted at step P6 into data 12 for a photomask writing apparatus. Photomask lithography is carried out using the data 12 for a photomask writing apparatus to form photomasks for light exposure.

Figure 18D:
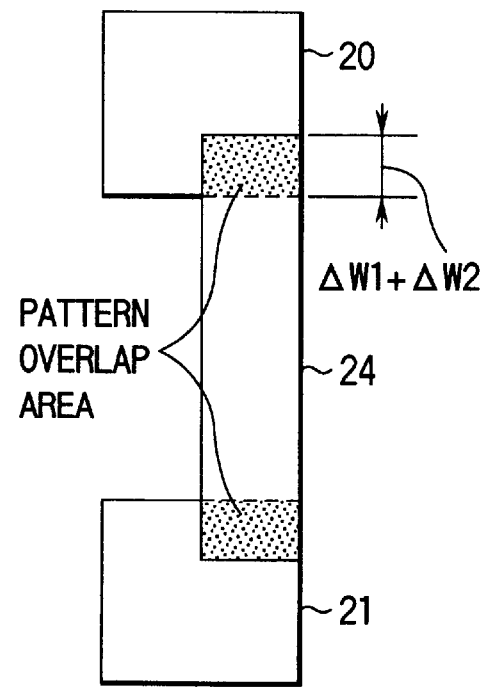

The patterns as shown in FIG. 18D are obtained as a result of applying the above-described procedure for pattern generation to the design pattern data 20, 21 and 22. The positions where the pads and gate electrode are connected are retracted at step P1 toward the pads by an amount $\Delta W1$, and the gate electrode pattern 23 extracted at step P2 is further extended toward the pads by an amount $\Delta W2$ at step P3. Accordingly, the gate electrode pattern ultimately extends toward the pads by an amount $(\Delta W1+\Delta W2)$. Therefore, the gate electrode pattern 24 exposed by electron beams is obtained with a configuration in which it overlaps the pad patterns 20 and 21 formed by light exposure by an amount $(\Delta W1+\Delta W2)$.

Such a method for generating pattern data results in an overlap $(\Delta W1+\Delta W2)$ of the pattern exposed by electron beams on the patterns exposed by light. By setting the amounts $\Delta W1$ and $\Delta W2$ such that the amount $(\Delta W1+\Delta W2)$ exceeds misalignment between electron beam exposure and light exposure, the patterns exposed by electron beams and light overlap with each. other without fail in the areas where they are connected. It is therefore possible to prevent discontinuation of patterns attributable to misalignment.

Further, since the width of the pattern exposed by electron beams is reduced by an amount $2\Delta W1$ at step P1 and is thereafter increased by an amount $2\Delta W2$ at step P3, the width of the ultimate pattern exposed by electron beams can be set equal to the width of the original design pattern by setting the amount of the movement of the outline such that $\Delta W1=\Delta W2$ is satisfied. Referring to the pattern exposed by light, since no process is performed to change the width thereof, it has the same pattern width as that of the design pattern. That is, the method for generating pattern data according to the present embodiment does not have a side effect wherein the patterns ultimately. obtained have line widths different from the intended values.

It is therefore possible to perform the so-called mix-and-match process in the same layer for forming patterns by exposing the same photosensitive material to electron beams and light such that no pattern deterioration occurs in areas where the patterns to be subjected to electron beam exposure and light exposure are connected and hence to form fine patterns accurately.

The present embodiment has referred to an example wherein the amounts $\Delta W1$ and $\Delta W2$ of the movement of pattern outlines at each step are set in consideration only to positional errors in overlapping electron beam exposure and light exposure. The amounts $\Delta W1$ and $\Delta W2$ of the movement of pattern outlines may be set in consideration to other factors such as the accuracy of the size of beams from the lithography apparatus, errors that occur in conversions at resist processing and errors that occur in etching to correct such factors that can reduce the positional accuracy of patterns, thereby allowing more accurate pattern formation.

<Seventh Embodiment>

Figure 19:
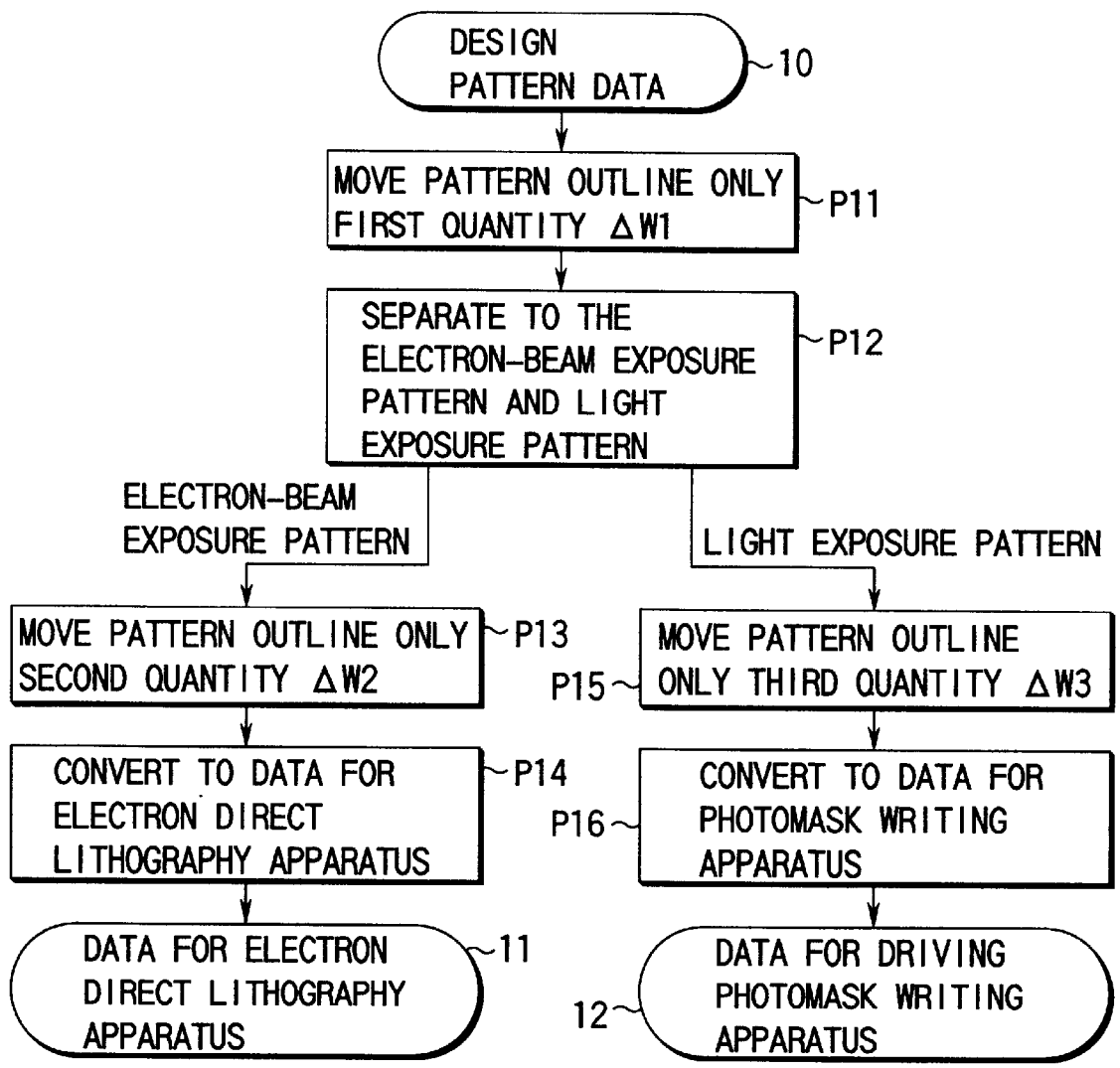
FIG. 19 is a diagram showing steps for generating data in a method of generating pattern data according to a seventh embodiment of the present invention.

FIG. 19 illustrates a procedure for generating data in a method for generating pattern data according to a seventh embodiment of the present invention. In FIG. 19, the input is design pattern data 10, and data 11 for an electron-beam direct lithography apparatus and data 12 for a photomask writing apparatus are generated as the output. The former is used in an electron beam direct lithography step, and the latter is used for the manufacture of photomasks and in a subsequent light exposure step.

The step of generating the data 11 for an electron-beam direct lithography apparatus consists of step P11 of moving the outline of a design pattern toward the inside of the pattern by a first amount $\Delta W1$ to reduce the width of the pattern, step P12 of separating patterns exposed by electron beams and light, step P13 of moving the outline of the pattern separated as a pattern exposed by electron beams at step P12 toward the outside of the pattern by a second amount $\Delta W2$ to increase the pattern width and step P14 of conversion into data 11 for an electron-beam direct lithography apparatus.

The step of generating the data 12 for a photomask writing apparatus for light exposure consists of, in addition to steps P11 and P12, step P15 of moving the outline of the pattern separated as a pattern exposed by light at step P12 toward the outside of the pattern by a second amount $\Delta W3$ to increase the pattern width and step S16 of converting the pattern obtained at step P15 into the data 12 for a photomask writing apparatus. The lithography system used in the present embodiment is also the same as that illustrated in FIG. 5.

A description will now be made with reference to FIGS. 20A through 20D on functions at the steps of the method for generating pattern data according to the present embodiment. FIGS. 20A through 20D are pattern diagrams for explaining the functions of the respective processing steps that occur as a result of the application of the method for generating pattern data according to the present invention to patterns 30, 31 and 32 of a gate electrode forming layer of a MOSFET like the sixth embodiment.

In the present embodiment, the size of the boundary between electron beam exposure and light exposure is defined as a pattern width L of the resist pattern; and patterns having sizes smaller than the boundary size L are exposed by electron beams and patterns having sizes equal to or greater than the boundary size L are exposed by deep-UV light to form resist patterns. In the pattern diagram shown in FIG. 20A, a gate electrode 32 having a pattern width smaller than L is exposed by electron beams and pads 30 and 31 to establish conduction to a wiring layer are exposed by deep-UV light to form the patterns. Further, it is assumed that the pattern sizes are oversized by an amount $2\Delta We$ at an etching step for processing the substrate using the photosensitive material having those patterns formed thereof and that the resist patterns are formed with sizes smaller than the sizes of the designed patterns by an amount $2\Delta We$. A desired size of an overlap between the patterns exposed by electron beams and light is $2\Delta W$.

Figure 20A:
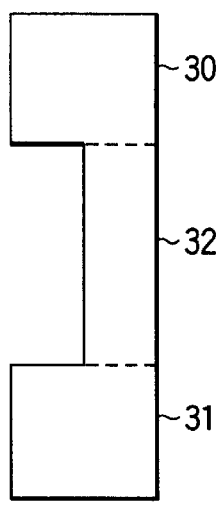
FIGS. 20A through 20D are diagrams for explaining functions at each step of the method for generating pattern data according to the seventh embodiment of the present invention.
Figure 20B:
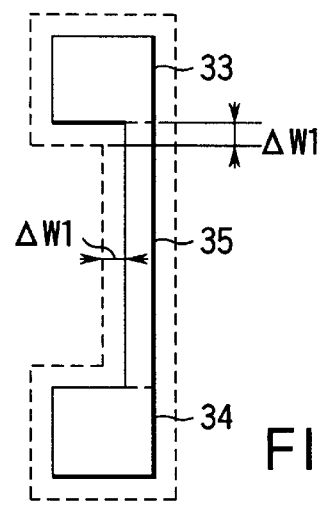

First, step P11 is performed to move the outlines of the design patterns 30, 31 and 32 toward the inside of the patterns by an amount $\Delta W1$ to reduce the pattern widths. At this time $\Delta W1=\Delta W+\Delta we$. As a result, as shown in FIG. 20B, the inward movement of the outlines of the patterns by $\Delta w1$ results in patterns 33, 34 and 35 having pattern widths reduced by an amount $2\Delta W1$. At this time, the areas where the pads 33 and 34 are connected to the gate electrode 35 are retracted toward the pads by an amount $\Delta W1$.

Next, step P12 separates the patterns into patterns exposed by electron beams and light. For example, the method for extraction is a method wherein patterns having widths smaller than a reference pattern width are extracted as patterns exposed by electron beams. At this time, if the size of the boundary between electron beam exposure and light exposure is defined as a pattern width L of the resist pattern as described above, the boundary size L is narrowed by an amount $2\Delta W1$ to use a value $(L-2\Delta W1)$ as a reference pattern width for extracting patterns exposed by electron beams. As a result, the gate electrode pattern 35 in FIG. 20B is separated as a pattern to be exposed electron beams, and the pads 33 and 34 are separated as patterns exposed by light.

Figure 20C:
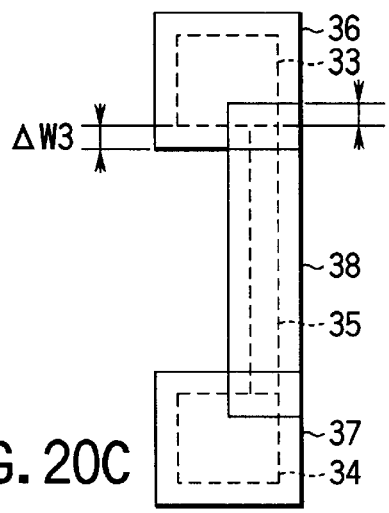

Next, Step P13 moves the outline of the separated pattern 35 exposed by electron beams is moved outwardly of the pattern by an amount $\Delta W2$ to oversize the pattern. At this time $\Delta W2=\Delta W$. As a result, as shown in FIG. 20C, the width of the gate electrode pattern 35 is oversized by an amount $2\Delta W2$ to provide a pattern 38 exposed by electron beams. At this time, the gate electrode pattern 38 is extended in the direction of the pad pattern by an amount $\Delta W2$.

Further, step P14 converts the pattern 38 exposed by electron beams into the data 11 for an electron-beam direct lithography apparatus which data is used to perform electron beam exposure.

Meanwhile, the outlines of the patterns 33 and 34 separated at step P12 as patterns exposed by light are moved at step P15 outwardly of the pattern by an amount $\Delta W3$ to oversize the pattern width. At this time, $\Delta W3=\Delta W$. As a result, as shown in FIG. 20C, the widths of the pad patterns 33 and 34 are increased by an amount $2\Delta W3$ to provide patterns 36 and 37 exposed by light. Further, step P16 converts the patterns 36 and 37 into the data 12 for a photomask writing apparatus. Photomask lithography is performed using the data 12 for a photomask writing apparatus to fabricate photomasks to be used for light exposure.

Figure 20D:
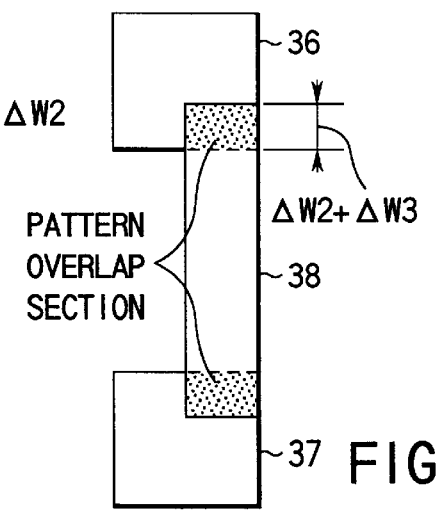

The above-described procedure for pattern generation is applied to design pattern data 30, 31 and 32, which results in patterns as shown in FIG. 20D. As a result of step P11, the positions where pads and gate electrode are connected are retracted by an amount $\Delta W1$. Further, the gate electrode pattern separated as a pattern exposed by electron beams at step P12 is further extended toward the pads by an amount $\Delta W2$ at step P13. Therefore, the gate electrode pattern finally expands toward the pads by an amount $(\Delta W1+\Delta W2)$. On the other hand, the patterns exposed by light are narrowed at step P11 by an amount $\Delta W1$ and is oversized at step P15 by an amount $\Delta W3$. Therefore, there is a change in the pattern width by an amount $(-\Delta W1+\Delta W3)$. As a result, the amount of overlap between the finally obtained patterns exposed by electron beams and light is $(\Delta W1+\Delta W2)+(-\Delta W1+\Delta W3)=\Delta W2+\Delta W3=2\Delta W$, which indicates that a desired amount of overlap can be achieved.

Such a method for generating pattern data results in an overlap $2\Delta W$ of the pattern exposed by electron beams on the patterns exposed by light. By setting the amount $\Delta W$ such that the amount $2\Delta W$ exceeds the amount of misalignment between electron beam exposure and light exposure, the patterns exposed by electron beams and light overlap with each other without fail in the areas where they are connected. It is therefore possible to prevent discontinuation of patterns attributable to misalignment.

Further, since the width of the pattern exposed by electron beams is reduced by an amount $2\Delta W1$ at step P11 and is thereafter increased by an amount $2\Delta W2$ at step P13, the width of the ultimate pattern exposed by electron beams is $(-2\Delta W1+2\Delta W2)=-2\Delta We$. Referring to the pattern exposed by light, since the width of the pattern is reduced at step P11 by an amount $2\Delta W1$ and is thereafter increased at step P15 by an amount $2\Delta W3$. Therefore, the ultimate pattern exposed by light also has a pattern width $(-2\Delta W1+2\Delta W3)=-2\Delta We$. In either case, the pattern width has been reduced by an amount $-2\Delta We$, which indicates that the method for generating pattern data according to the present embodiment makes it possible to obtain desired line widths taking value of the pattern size change in etching into consideration.

It is therefore possible to perform the so-called mix-and-match process in the same layer for forming. patterns by exposing the same photosensitive material to electron beams and light such that no pattern deterioration occurs in areas where the patterns to be subjected to electron beam exposure and light exposure are connected not only during resist pattern formation but also during etching and hence to form fine patterns accurately.

The present embodiment has referred to an example wherein the amounts $\Delta W1$, $\Delta 2$ and $\Delta W3$ of the movement of pattern outlines at each step are set in consideration to positional errors in overlapping electron beam exposure and light exposure and value of the pattern size change in etching. The amounts $\Delta W1$, $\Delta 2$ and $\Delta W3$ of the movement of pattern outlines may be set. in consideration to other factors such as the accuracy of the size of beams from the lithography apparatus, value of the pattern size change in the process of. fabricating photomasks and errors that occur in conversions at resist processing to correct such factors that can reduce the positional accuracy of patterns, thereby allowing more accurate pattern formation.

<Eighth Embodiment>

Figure 21:
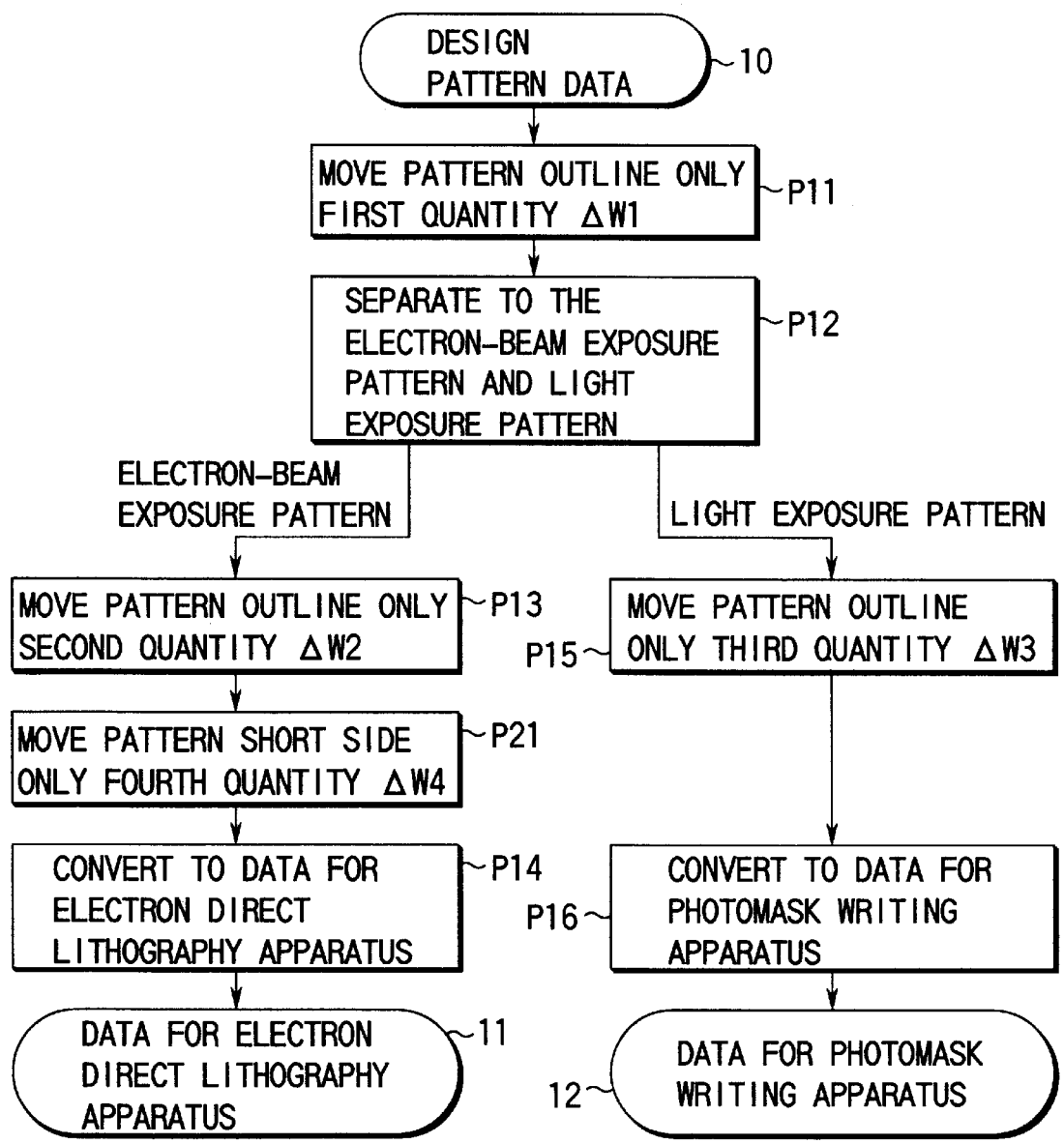
FIG. 21 is a diagram showing steps for generating data in a method of generating pattern data according to an eighth embodiment of the present invention.

FIG. 21 illustrates a procedure for generating data in a method for generating pattern data according to an eighth embodiment of the present invention. In FIG. 21, the input is design pattern data 10, and data 11 for an electron-beam direct lithography apparatus and data 12 for a photomask writing apparatus are generated as the output. The former is used in an electron beam direct lithography step, and the latter is used for the manufacture of photomasks and in a subsequent light exposure step.

The step of generating data according to the present embodiment is substantially the same as that described in the seventh embodiment except that step 21 for moving shorter sides of a pattern exposed by electron beams by an amount $\Delta W4$ is added.

Figure 22A:
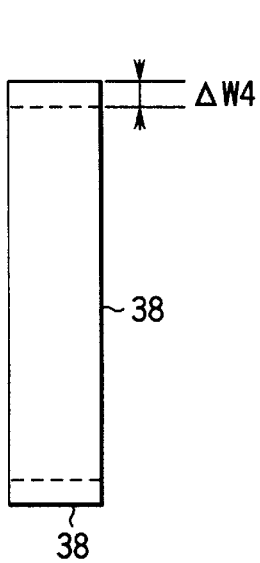
FIGS. 22A through 22B are diagrams for explaining functions at each step of the method for generating pattern data according to the eighth embodiment of the present invention.
Figure 22B:
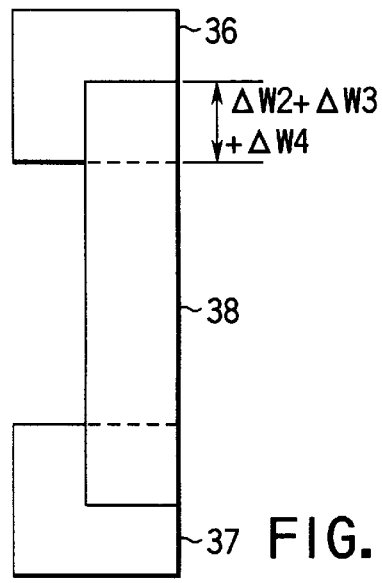

FIGS. 22A and 22B are illustrate the function of the method for generating patterns of the present embodiment performed on patterns similar to those shown in FIGS. 20A through 20D referred to in the seventh embodiment. The outline of the gate electrode pattern 35 separated as a pattern exposed by electron beams at step P12 is moved at step P13 toward the outside of the pattern by a second amount $\Delta W2$ to increase the pattern width, thereby providing a pattern 38.

Next, at step P21, the shorter sides of the outline of the pattern exposed by electron beams are moved outwardly of the pattern by an amount $\Delta W4$. Specifically, as shown in FIG. 22A, the pattern 38 exposed by electron beams expands toward the pad patterns exposed by light by the amount $\Delta W4$. Therefore, the amount of overlap with the patterns exposed by light is increased by $\Delta W4$, resulting in an amount of overlap $W2+W3+W4$ between the patterns exposed by light and electron beams.

In the case of the method of generating pattern data described in the seventh embodiment, step P11 causes the area where the pads and gate electrode are connected to be retracted toward the pads by $\Delta W1$, and the gate electrode pattern separated at step P12 as a pattern exposed by electron beams further expands at step P12 toward the pads by $\Delta W2$ and, therefore, it. finally expands toward the pads by an amount $(\Delta W1+\Delta W2)$. On the other hand, the patterns exposed by light are narrowed at step P11 by an amount $\Delta W1$ and is oversized at step P15 by an amount $\Delta W3$. Therefore, there is a change in the pattern width by an amount $(-\Delta W1+\Delta W3)$. As a result, the amount of overlap between the finally obtained patterns exposed by electron beams and light is $(\Delta W1+\Delta W2)+(-\Delta W1+\Delta W3)=\Delta W2+\Delta W3$.

It should be noted here that if the pattern oversizing amounts $2\Delta W2$ and $2\Delta W3$ exceed the pattern narrowing amount $2\Delta W1$, the final pattern size will be wider than the designed pattern size. If the pattern narrowing amount $2\Delta W1$ exceeds the minimum size Wmin of the design pattern, the pattern narrowing will eliminate patterns of the minimum size. Therefore, the amount $2\Delta W1$ is limited by the minimum size Wmin. In summary, the amount of overlap between patterns exposed by electron beams and light obtained by the method for generating pattern data according to the seventh embodiment can not exceed Wmin. That is, desired effects can not be achieved if the desired amount of pattern overlap $2\Delta W$ is greater than the minimum size Wmin of the design pattern.

On the contrary, the method for generating pattern data according to the present embodiment, the amount of pattern overlap can be increased by an arbitrary size $\Delta W4$. Accordingly, a desired amount of pattern overlap can be always achieved. It is therefore possible to perform the so-called mix-and-match process in the same layer for forming patterns by exposing the same photosensitive material to electron beams and light such that no pattern deterioration occurs in areas where the patterns to be subjected to electron beam exposure and light exposure are connected not only during resist pattern formation but also during etching and hence to form fine patterns accurately.

<Ninth Embodiment>

Figure 23:
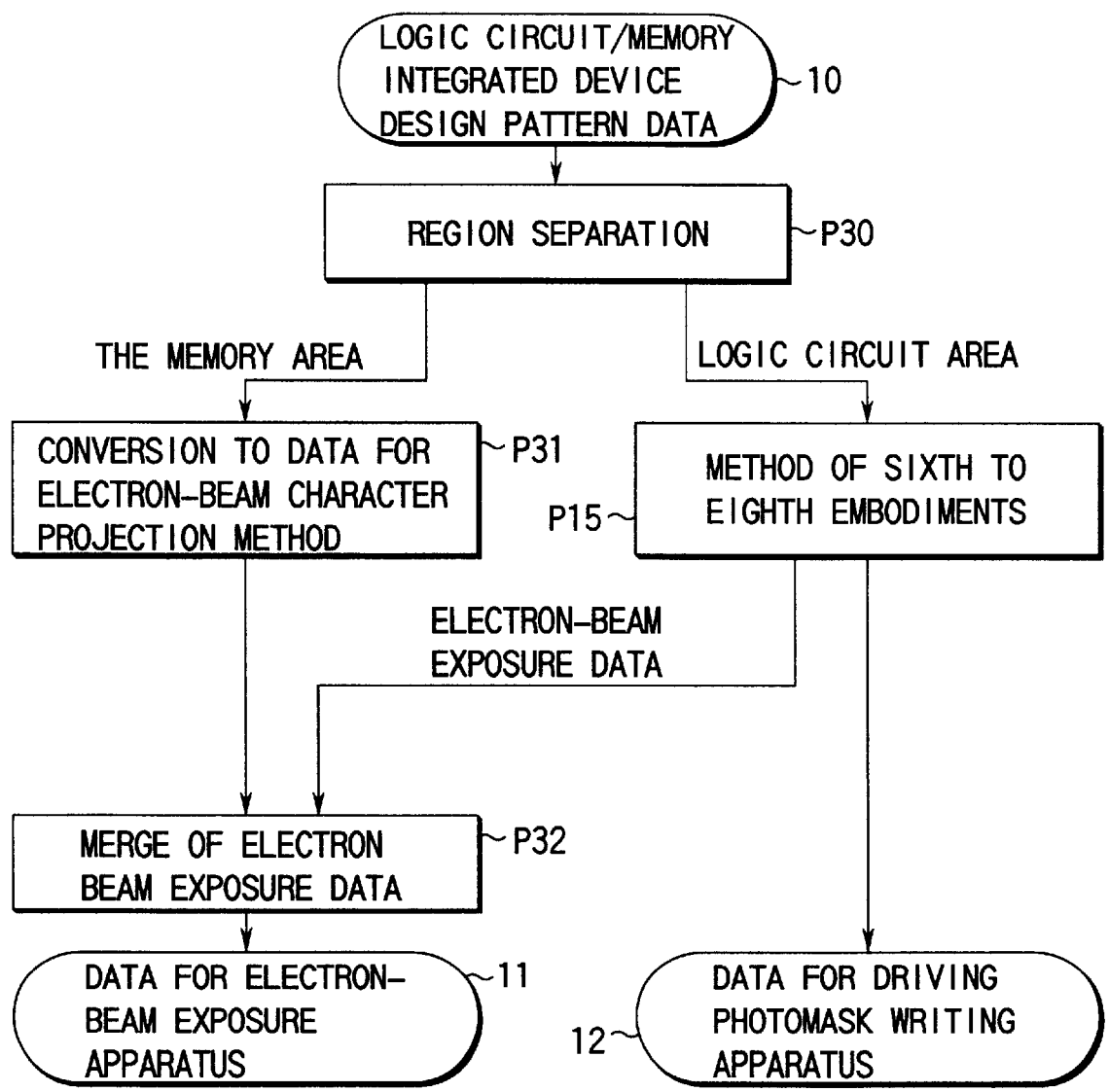
FIG. 23 is a diagram for explaining functions at each step of a method for generating pattern data according to a ninth embodiment of the present invention.

FIG. 23 illustrates a method for generating patterns according to a ninth embodiment of the present invention and shows an example of the application of the same method to the generation of patterns in a gate layer of a semiconductor device having both of a memory device and a logic circuit. In FIG. 23, the input is design pattern data 10 of the device having both of a logic circuit and a memory device, and data 11 for an electron-beam direct lithography apparatus and data 12 for a photomask writing apparatus are generated as the output. The former is used in an electron beam direct lithography step, and the latter is used for the manufacture of photomasks and in a subsequent light exposure step.

The present embodiment consists of a step (S30) of separating a memory device area and a logic circuit area, a step (P31) of converting the pattern of the memory device area into lithographic data for part simultaneous electron beam exposure, a step of separating patterns in the logic circuit area into patterns exposed by electron beams and light according to the methods described in the first through eighth embodiments and a step (P32) of merging the pattern of the memory device and the pattern exposed by electron beams in the logic circuit area and converting the result into data for an electron beam lithography apparatus.

Next, the method for generating pattern data having such a configuration will be described. Patterns on the gate layer of the semiconductor device having a memory device and a logic circuit are separated by step P30 into the memory device area and logic circuit area. The pattern of the memory device area is converted by step P31 into lithographic data for part simultaneous electron beam exposure. Patterns in the logic circuit area are separated into patterns exposed by electron beams and light according to the methods described in the first through eighth embodiments. The pattern exposed by light is converted into data for a photomask writing apparatus for generating photomasks for light exposure. At step P32, the pattern exposed by electron beams is merged with the lithographic data for part simultaneous electron beam exposure generated at step P31 to be converted into lithographic data for an electron-beam exposure apparatus.

with such a configuration wherein patterns to be exposed are shared by light exposure and electron beam exposure, it is possible to form device patterns including fine patterns according to a 0.15 $\mu$m rule which are difficult to form using light with high throughput. A calculation of the throughput of the present method for generating patterns provided the same result as that shown in FIG. 14.

As described above, the present embodiment makes it possible to provide a mass production system that follows photolithography which has both of excellent resolving power beyond that achievable with light provided by electron beam exposure and throughput equivalent to that achievable with an optical stepper.

While a cache memory area is exposed using an electron beam lithography apparatus of the exposure of character projection type according to the present embodiment, such an area may be exposed by deep-UV light if the pattern can be resolved by light exposure. In this case, since the lithography throughput is further improved as a result of a reduction in the number of patterns exposed by electron beams, it is possible to construct a same layer mix-and-match type lithography system having higher throughput.

<Tenth Embodiment>

A tenth embodiment of the present invention will now be described.

Figure 24:
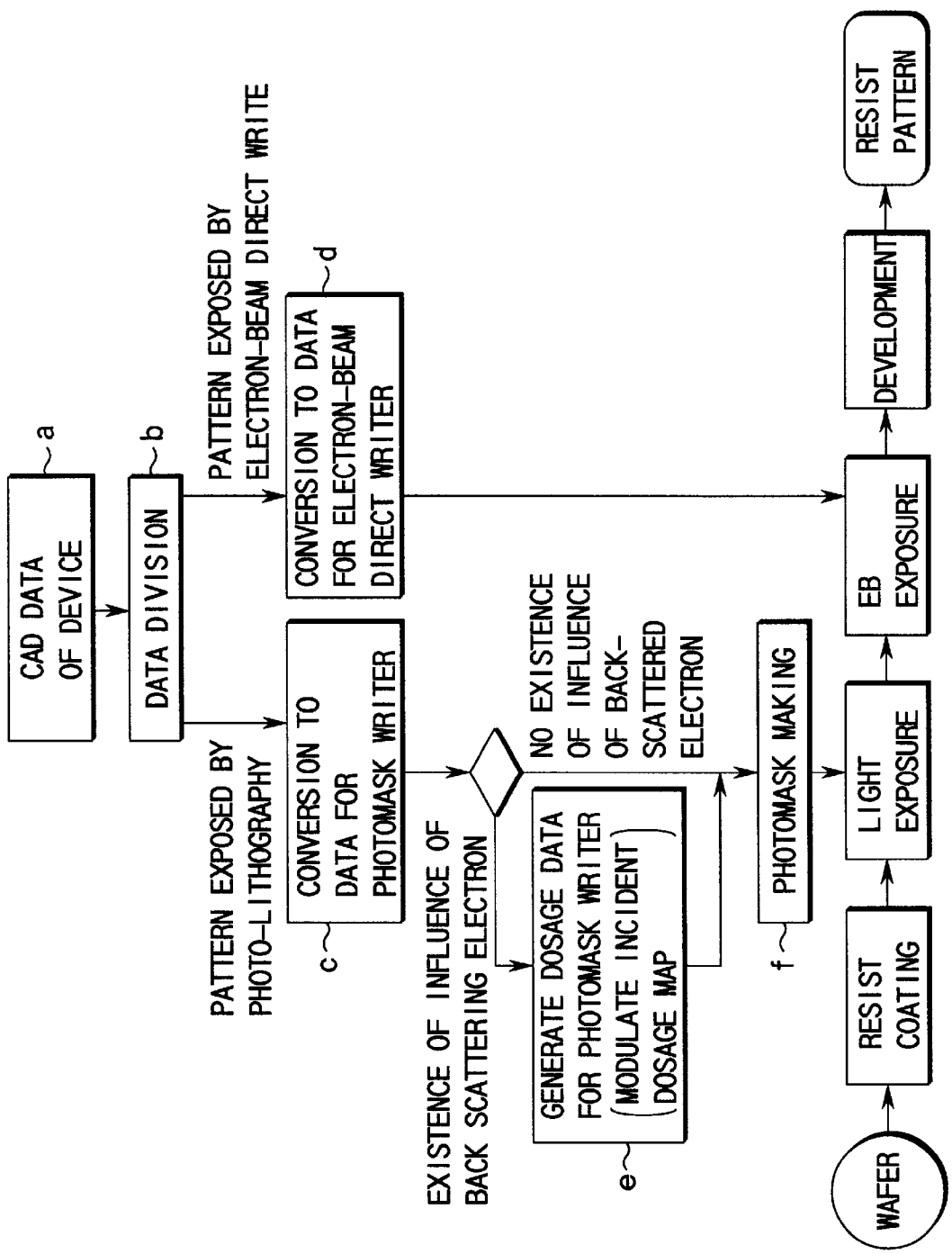
FIG. 24 is a flow chart showing a method for pattern formation according to a first specific example of a tenth embodiment of the present invention.
Figure 25:
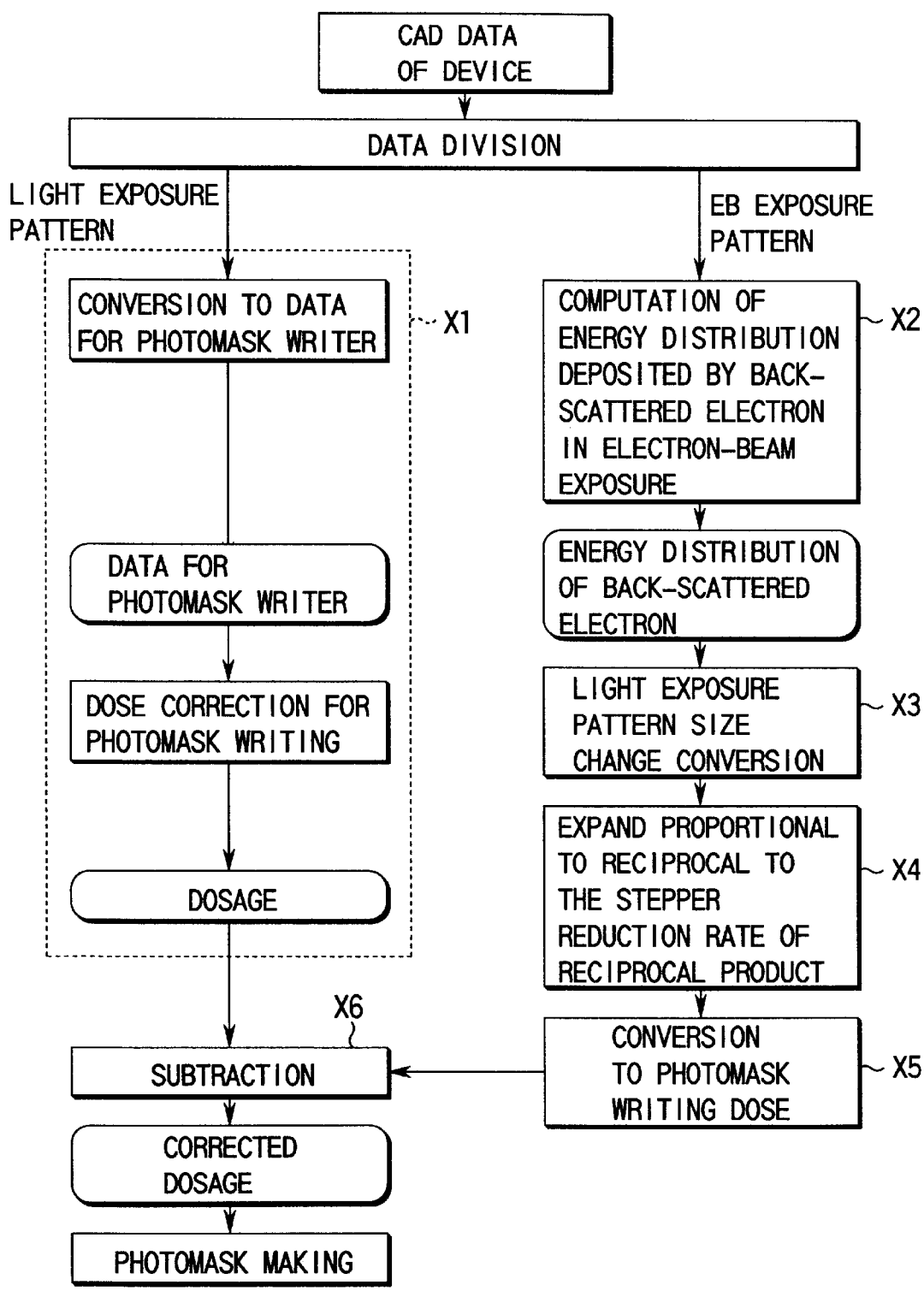
FIG. 25 is a flow chart showing a method for generating data for dose for correcting photomask drawing according to the first specific example of the tenth embodiment of the present invention.

FIGS. 24 and 25 are flow charts illustrating a method for forming patterns according to a first specific example of the tenth embodiment. The lithography system used to implement the method for pattern formation will not be described in detail because it is the same as that shown in FIG. 5.

A description will now be made on the method for pattern formation shown in FIGS. 24 and 25. For simplicity, the description will proceed with reference to FIGS. 26A through 26F.

Figure 26A:
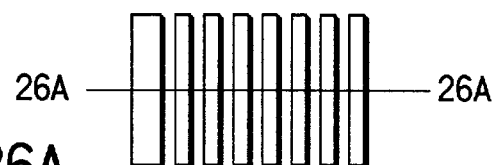
FIGS. 26A through 26F are diagrams for explaining functions of a method for pattern formation according to the tenth embodiment of the present invention.

First, CAD data of device (a) are separated into CAD data for photomasks for light exposure and CAD data for electron exposure (b) using a resolving size as a boundary which is more relaxed than the limit of resolution of an optical stepper used in a lithography system (hereinafter referred to as "boundary size"). As shown in FIG. 26A, it is assumed that the data are separated into patterns exposed by light (thick areas) and patterns exposed by electron beams (thin areas).

Figure 26B:
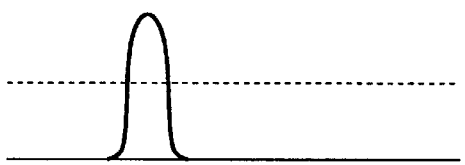
Figure 26C:
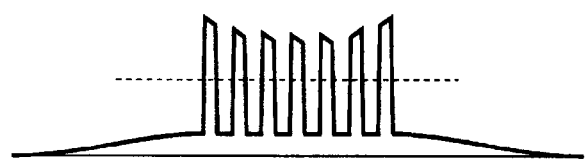
Figure 26D:
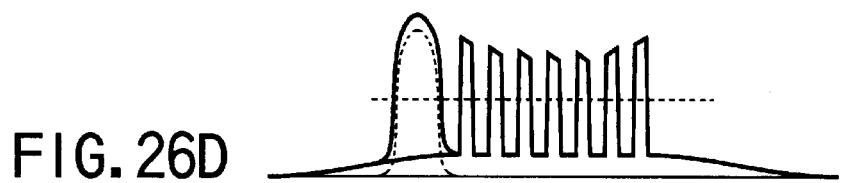
Figure 27:
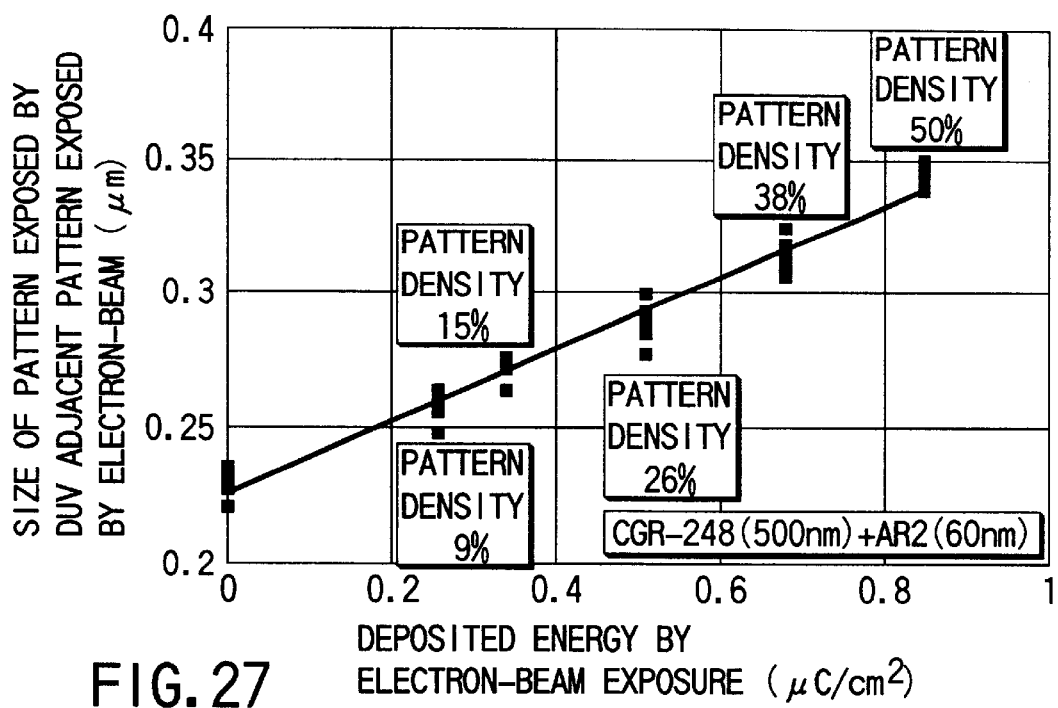
FIG. 27 is a graph showing an effect of back-scattered electrons on the sizes of the resist.

Next, data for photomask lithography (c) and data for electron beam lithography are generated from the respective CAD data. During the generation of the data for electron beam lithography, optical proximity effect correction is performed such that all patterns exposed by electron beams can be formed with preferable sizes. The optical proximity effect correction is carried out under control over dose of application. FIGS. 26B and 26C are maps of doses calculated in such a process which show the distribution of energy accumulated in the resist when each of the patterns shown in FIG. 26A is exposed as viewed at the section 26A—26A in FIG. 26A. The profile shown in FIG. 26C represents the sum of the energy of incident electrons and back-scattered electrons. Since the both types of exposure are carried out on the same resist, the actual distribution of energy accumulated in the resist is as shown in FIG. 26D. Patterns exposed by light in proximity to patterns exposed by electron beams are subjected to the effect of back-scattered electrons and, as a result, its accumulated energy is increased. Therefore, in the case of simultaneous development, the patterns exposed by light will be formed differently from the desired patterns. The effect of back-scattered electrons on the sizes of the resist can be easily inferred if the graph shown in FIG. 27 is available in advance.

It is determined whether the effect of back-scattered electrons on the patterns exposed by light is negligible or not based on whether the amount of the resultant variation in the sizes is equal to or smaller than an allowable value. For example, if it is determined that there is no influence, the data of the separated patterns exposed by light are converted into data for photomask lithography, and photomasks are fabricated using, for example, an electron beam lithography apparatus for photomask lithography. Thereafter, the patterns to be subjected to light can be formed using the resultant photomasks, and the patterns exposed by electron beams can be formed using data for electron beam lithography which has been prepared separately to form desired patterns.

On the other hand, if the variation of the pattern sizes exposed by light due to back-scattered electrons exceeds the allowable value, the method of fabricating photomasks is changed such that the patterns exposed by light will be shaped into desired pattern sizes under the effect of back-scattered electrons. The method for such a change will be described below. Specifically, the variation of the size caused by back-scattered electrons is absorbed by changing the photomask sizes in advance.

Figure 26E:
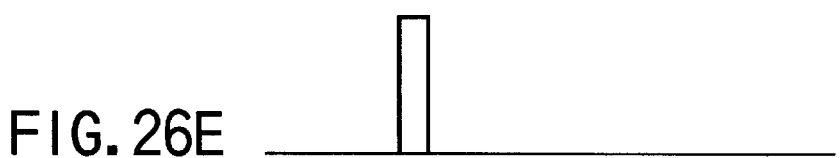
Figure 26F:
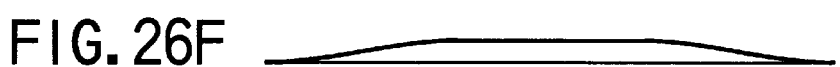
Figure 28A:
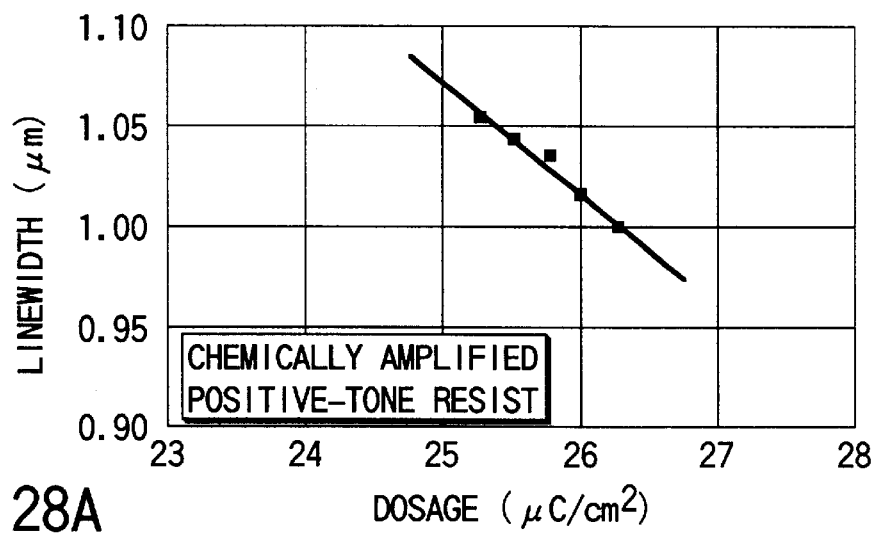
FIGS. 28A through 28B are diagrams for explaining functions of a method for pattern formation according to the tenth embodiment of the present invention.

FIG. 26E shows the distribution of doses of incident electrons of lithographic data for fabricating photomasks using an electron-beam exposure apparatus as viewed in the section A—A. However, variation of the size occurs in data for photomask lithography generated based on this map because of back-scattered electrons that occur during electron beam pattern exposure (FIG. 26F shows the distribution of the same which is obtained during a calculation to correct the doses). Therefore, data for doses for correcting photomask pattern lithography is generated by subtracting the doses during electron beam exposure from the distribution of doses shown in this map. However, it is necessary to identify the relationship between the dose of electron beams on the resist used on the photomask substrate and the sizes thereof when photomasks are, fabricated in consideration to possibility of use of different resists and different electron reflection coefficient of substrates. FIG. 28A shows an example showing the relationship between the dose of electrons on a resist used for the fabrication of photomasks and the sizes of the resist.

Further, since the line widths are transferred to a wafer with the reduction factor of the stepper applied thereto, the sizes must be enlarged in advance by an inverse multiple of the reduction factor in order to correct variation of the size on the wafer attributable to back-scattered electrons on the photomasks. Therefore, taking such factors into consideration, an incident electrons is obtained which satisfies a relational expression:

wafer line width conversion factor (nm/$\mu$C/cm$^2$)×back-scattered electrons ($\mu$C/cm$^2$)=reduction factor of stepper×photomask linewidth conversion factor (nm/$\mu$C/cm$^2$)×incident electrons ($\mu$C/cm$^2$)

Figure 28B:
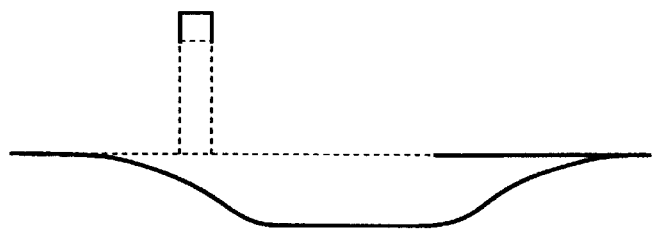

The incident electrons is subtracted from the dose as shown in FIG. 26E which has been determined without taking the effect of back-scattered electrons into consideration. Specifically, by forming a pattern with a dose indicated by the dotted line in FIG. 28B, a photomask can be formed in sizes for which variation of the pattern sizes exposed by light dude to back-scattered electrons has been taken into consideration in advance.

Although the function has been described with reference to a single pattern for simplicity, correction of the size is carried out on all patterns exposed by light according to such a concept to generate data for photomask lithography based on which photomasks are fabricated.

The corrected dose data used for the fabrication of a photomask as described above can be generated in accordance the step shown in FIG. 25. Specifically, the step is preferably comprises a step X1 of obtaining a map of proper doses for drawing a pattern exposed by light on a photomask substrate, a step X2 for obtaining a map of the distribution of energy accumulated by back-scattered electrons during the lithography of a pattern exposed by electron beams on the wafer, a step X3 for converting the map of the distribution of energy accumulated by back-scattered electrons into a map of distribution of the amount of pattern size variation of the pattern exposed by light, a step X4 of enlarging the map of distribution of the amount of pattern size variation of the pattern exposed by light by an inverse multiple of the reduction factor of the stepper for light exposure, a step X5 of converting the enlarged map of distribution of the amount of pattern size variation of the pattern exposed by light into a map of distribution of converted values of photomask exposure doses, and a step X6 of subtracting the map of distribution of converted values of photomask exposure doses obtained at step X5 from the map of proper doses obtained at step X1. The pattern is exposed by light using the photomask, and the pattern for electron beam exposure is exposed by electron beams using data for electron beam lithography which has been prepared separately to form desired patterns.

Figure 29:
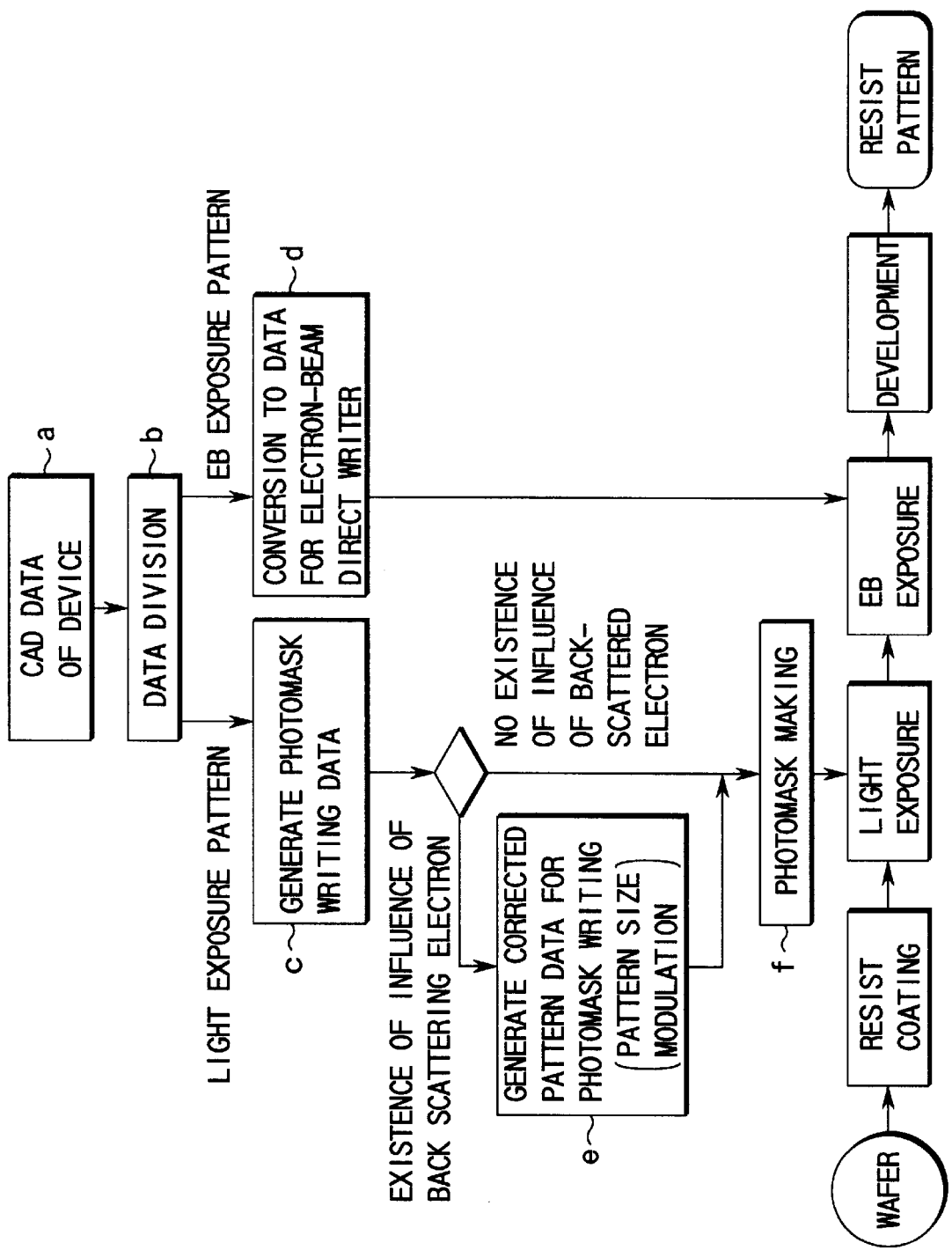
FIG. 29 is a flow chart showing a method for pattern formation according to a second specific example of the tenth embodiment of the present invention.
Figure 30:
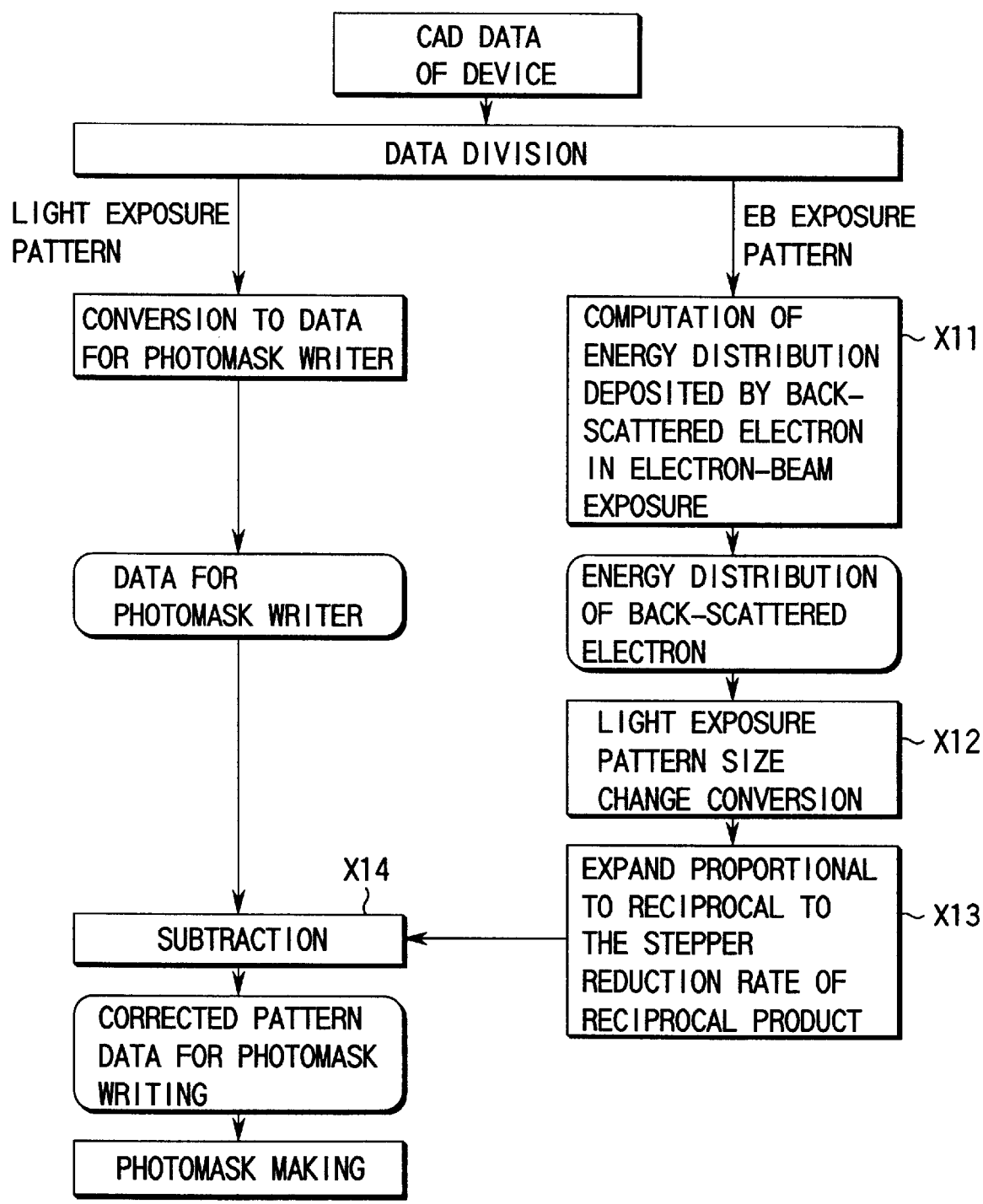
FIG. 30 is a flow chart showing a method for generating data for corrective photomask lithography according to the second specific example of the tenth embodiment of the present invention.

FIGS. 29 and 30 are flow charts illustrating a method for forming patterns according to a second specific example of the tenth embodiment. The lithography system used to implement the method for pattern formation will not be described because it is the same as that shown in FIG. 5.

A description will now be made on the method for pattern formation shown in FIGS. 29 and 30. For simplicity, the description will proceed with reference to FIGS. 26A through 26F.

First, CAD data of device (a) are separated into CAD data for photomasks for light exposure and CAD data for electron exposure (b) using a resolving size as a boundary which is more relaxed than the limit of resolution of an optical stepper used in a lithography system (hereinafter referred to as "boundary size"). As shown in FIG. 26A, it is assumed that the data are separated into patterns exposed by light (thick areas) and patterns exposed by electron beams (thin areas).

Next, data for lithography data, i.e., photomask lithography data (c) and data for electron beam lithography (d) are generated from the respective CAD data. During the generation of the data for electron beam lithography, optical proximity effect correction is performed such that all patterns exposed by electron beams can be formed with preferable sizes. The optical proximity effect correction is carried out under control over dose of application. FIGS. 26B and 26C are maps of doses calculated in such a process which show the distribution of energy accumulated in the resist when each of the patterns shown in FIG. 26A is exposed as viewed at the section 26A—26A in FIG. 26A. The profile shown in FIG. 26C represents the sum of the energy of incident electrons and back-scattered electrons. Since the both types of exposure are carried out on the same resist, the actual distribution of energy accumulated in the resist is as shown in FIG. 26D. Patterns exposed by light in proximity to patterns exposed by electron beams are subjected to the effect of back-scattered electrons and, as a result, its accumulated energy is increased. Therefore, in the case of simultaneous development, the patterns exposed by light will be formed differently from the desired patterns. The effect of back-scattered electrons on the sizes of the resist can be easily inferred if the graph shown in FIG. 27 is available in advance.

It is determined whether the effect of back-scattered electrons on the patterns exposed by light is negligible or not based on whether the amount of the resultant variation in the sizes is equal to or smaller than an allowable value. For example, if it is determined that there is no influence, the data of the separated patterns exposed by light are converted into data for photomask lithography, and photomasks are fabricated using, for example, an electron beam lithography apparatus for photomask lithography. Thereafter, the patterns to be subjected to light can be formed using the resultant photomasks, and the patterns exposed by electron beams can be formed using data for electron beam lithography which has been prepared separately to form desired patterns.

On the other hand, if the variation of the pattern sizes exposed by light due to back-scattered electrons exceeds the allowable value, the method of fabricating photomasks is changed such that the patterns exposed by light will be shaped into desired pattern sizes under the effect of back-scattered electrons. The method for such a change will be described below. Specifically, the variation of the size caused by back-scattered electrons is absorbed by changing the photomask sizes in advance.

FIG. 26E shows the distribution of doses of incident electrons of lithographic data for fabricating photomasks using an electron-beam exposure apparatus as viewed in the section A—A. However, variation of the size occurs in data for photomask lithography generated based on this map because of back-scattered electrons that occur during electron beam pattern exposure (FIG. 26F shows the distribution of the same which is obtained during a calculation to correct the doses). Therefore, data for drawing a corrected photomask pattern (e) is generated by subtracting the variation of the size during electron beam exposure from the graphical size shown in this map. However, it is necessary to identify the relationship between the dose of electron beams on the resist used on the photomask substrate and the sizes thereof when photomasks are fabricated in consideration to possibility of use of different resists and different electron reflection coefficient of substrates. FIG. 28A shows an example showing the relationship between the dose of electrons on a resist used for the fabrication of photomasks and the sizes of the resist.

Further, since the linewidths are transferred to a wafer with the reduction factor of the stepper applied thereto, the sizes must be enlarged in advance by an inverse multiple of the reduction factor in order to correct variation of the size on the wafer attributable to back-scattered electrons on the photomasks. Therefore, taking such factors into consideration, an amount for size conversion of the graphical size is obtained which satisfies a relational expression:

wafer linewidth conversion factor $(nm/\mu C/cm^2) \times$ back-scattered electrons $(\mu C/cm^2)$=reduction factor of stepper$\times$size conversion of photomask (nm)

The amount for size conversion may be subtracted from the graphical size which has been determined without taking the effect of back-scattered electrons into consideration. Thus, a photomask can be formed in sizes for which variation of the pattern sizes exposed by light dude to back-scattered electrons has been taken into consideration in advance.

Although the function has been described with reference to a single pattern for simplicity, correction of the size is carried out on all patterns exposed by light according to such a concept to generate data for photomask lithography based on which photomasks are fabricated.

The data for drawing the corrected photomask pattern used for the fabrication of a photomask as described above can be generated in accordance the step shown in FIG. 25. Specifically, the step is preferably comprises a step X11 of obtaining a map of the distribution of energy accumulated by back-scattered electrons during the lithography of a pattern exposed by electron beams on a wafer, a step X12 for converting the map of the distribution of energy accumulated by back-scattered electrons into a map of distribution of the amount of pattern size variation of the pattern exposed by light, a step X13 of obtaining a map of distribution of the amount of pattern size variation of the pattern exposed by light enlarged by an inverse multiple of the reduction factor of the stepper for light exposure, and a step X14 of subtracting the enlarged map of distribution of the amounts of variation of the size obtained at step X13 from the pattern data for light exposure to be drawn on the photomask substrate.

The pattern is exposed by light using the photomask, and the pattern for electron beam exposure is exposed by electron beams using data for electron beam lithography which has been prepared separately to form desired patterns.

Figure 31:
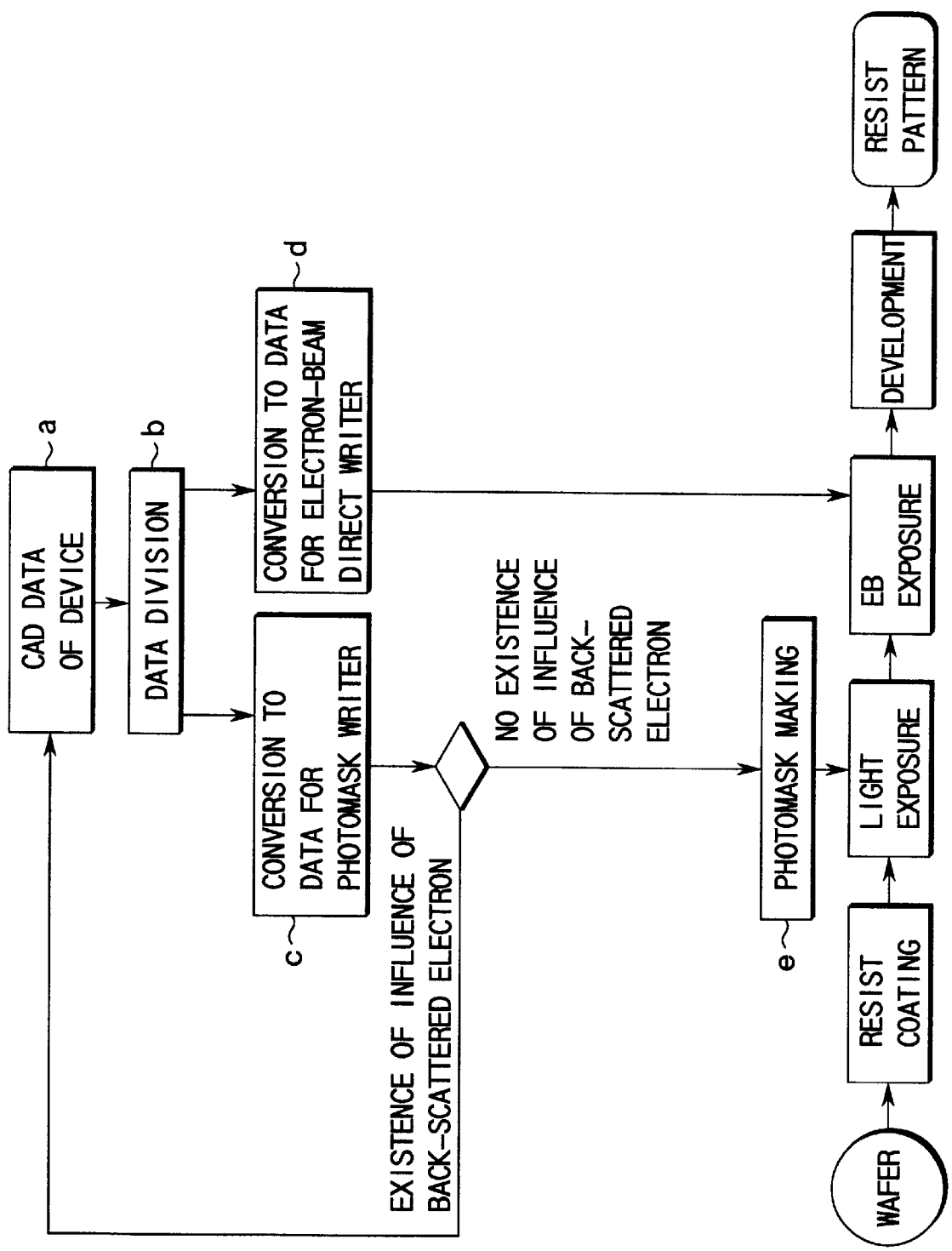
FIG. 31 is a flow chart showing a method for pattern formation according to a third specific example of the tenth embodiment of the present invention.

FIG. 31 is a flow chart illustrating a method for forming patterns according to a third specific example of the tenth embodiment. The lithography system used to implement the method for pattern formation will not be described because it is the same as that shown in FIG. 5.

A description will now be made on the method for pattern formation shown in FIG. 31. For simplicity, the description will proceed with reference to FIGS. 26A through 26F.

First, CAD data of device (a) are separated into CAD data for photomasks for light exposure and CAD data for electron exposure (b) using a resolving size as a boundary which is more relaxed than the limit of resolution of an optical stepper used in a lithography system (hereinafter referred to as "boundary size"). As shown in FIG. 26A, it is assumed that the data are separated into patterns exposed by light (thick areas) and patterns exposed by electron beams (thin areas).

Next, data for photomask lithography (c) and data for electron beam lithography (d) are generated from the respective CAD data. During the generation of the data for electron beam lithography, optical proximity effect correction is performed such that all patterns exposed by electron beams can be formed with preferable sizes. The optical proximity effect correction is carried out under control over dose of application. The degree of the influence of back-scattered electrons on the pattern exposed by light is checked from the data for electron beam lithography. A map 26D for variation of the size is obtained from the graph shown in FIG. 27, and it is determined whether the effect of back-scattered electrons on the patterns exposed by light is negligible or not based on whether the amount of the resultant variation is equal to or smaller than an allowable value.

If there is influence, while the disadvantage was solved in the first and second specific examples by correcting the sizes of the photomask, the present example reefers to a simpler method which does not involve the correction of photomask sizes.

Figure 32:
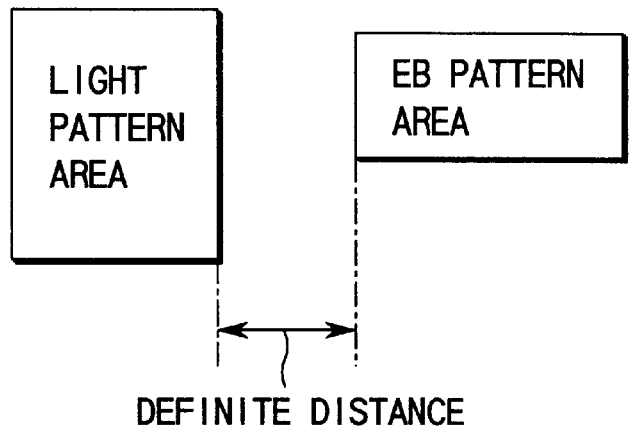
FIG. 32 is a view showing an example of the arrangement of patterns of the third specific example of the tenth embodiment of the present invention.

Since the range of back-scattered electron reach on a wafer is only a radius of about 30 $\mu$m, as shown in FIG. 32, device pattern data is regenerated in an area where the effect of back-scattered electrons on the pattern exposed by light is equal to or greater than an allowable value such that the pattern exposed by light is kept apart from the pattern exposed by electron beams by a predetermined distance d, i.e., kept apart at the radius of backward scattering or more. The improved data is subjected to the data separating flow again to verify the pattern exposed by light will not adversely affected by back-scattered electrons during electron beam exposure. However, when there is a line connecting those patterns, the effect of back-scattered electrons is unavoidable. In such a case, measures are taken to avoid any disadvantage even if there is variation of the size. Thereafter, the improved pattern exposed by light is converted to generate data for photomask lithography and a photomask is fabricated using, for example, an electron-beam exposure apparatus for photomask lithography. Thereafter, the pattern is exposed by light using the photomask and the pattern exposed by electron beams is exposed using data for electron beam lithography which has been prepared separately to from desired patterns.

FIGS. 33 through 38 illustrates specific examples of the fabrication of devices using a lithography system according to the present embodiment. A process on a gate electrode of a MOSFET will now be illustrated as an example.

Figure 33:
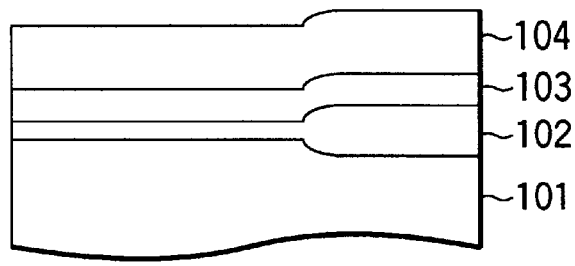
FIG. 33 is a cross-sectional view showing an example of a structure of a semiconductor device manufactured using the methods for pattern formation according to the tenth embodiment and an eleventh embodiment of the present invention.

FIG. 33 is a diagram showing a basic structure of a semiconductor device manufactured using the methods described as first through third specific examples. In FIG. 33, a polysilicon area 103 and a resist 104 are formed on a semiconductor substrate 101. Although reference is made on a step formed by the LOCOS (local oxidation of silicon) process which is a selective oxidation process employing $Si_3N_4$ as an oxidation mask, the present invention is applicable to steps originating from other element separation methods such as STI (shallow trench isolation). The resist 104 is a resist sensitive to deep-UV light and electron beams, e.g., VN-HS and is about 500 nm thick.

Figure 34:
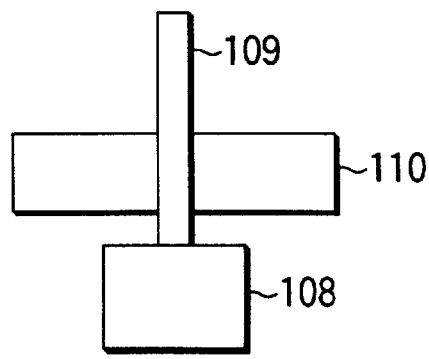
FIG. 34 is a plan view showing an example of a structure of a semiconductor device manufactured using the methods for pattern formation according to the tenth embodiment and an eleventh embodiment of the present invention.

FIG. 34 is a plan view of a gate electrode pattern which is exposed by electron beams because of its fineness. Since the focal depth of electron beam exposure is as deep as several $\mu$m, the exposure has tolerance to steps which is incomparably greater than that of exposure utilizing deep-UV light. Therefore, no discontinuation of resist occurs even at a step between the element area and element separation area, which allows accurate patterning.

A description will now be made on steps for forming a gate electrode with reference to FIGS. 35 through 38.

Figure 35:
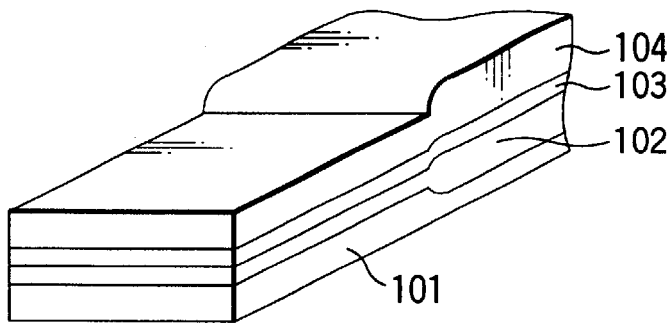
FIG. 35 is a perspective view showing an example of a structure of a semiconductor device manufactured using the methods for pattern formation according to the tenth embodiment and an eleventh embodiment of the present invention.

FIG. 35 is a perspective view of FIG. 33 as viewed from the left-hand side. A gate oxide area, an element separating oxide area 102, a polysilicon area 103 (200 nm) and a resist area 104 (500 nm) are sequentially formed on a semiconductor 101. The resist used here is negative. Only the resist is exposed by electron beams, and others are exposed by deep-UV light using photomask masks as described in the first, second and third specific examples to form all patterns.

Figure 36:
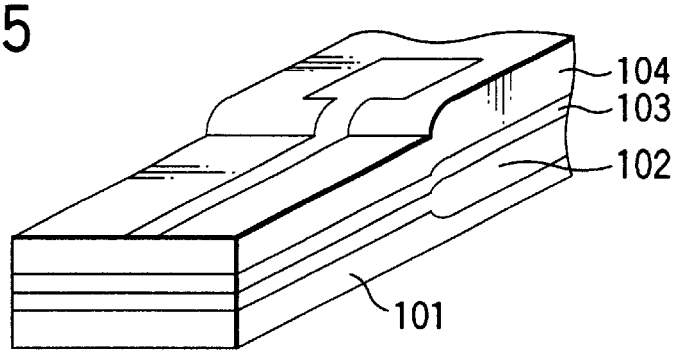
FIG. 36 is a perspective view showing an example of a structure of a semiconductor device manufactured using the methods for pattern formation according to the tenth embodiment and an eleventh embodiment of the present invention.

First, the patterns are exposed by deep-UV light. Next, an electron-beam exposure apparatus is used to pattern fine portions. FIG. 36 shows latent image in the resist formed by light exposure and electron beam exposure. By using photomask masks as described in the first, second and third specific examples for the pattern exposure using deep-UV light, light and electron beams can be selectively projected upon the resist to form patterns without taking back-scattered electrons during electron beam exposure into consideration.

Figure 37:
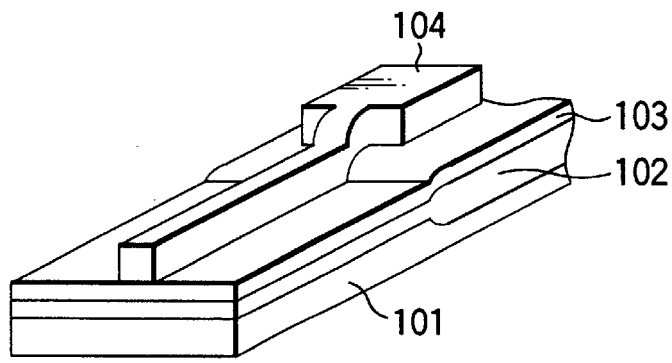
FIG. 37 is a perspective view showing an example of a structure of a semiconductor device manufactured using the methods for pattern formation according to the tenth embodiment and an eleventh embodiment of the present invention.
Figure 38:
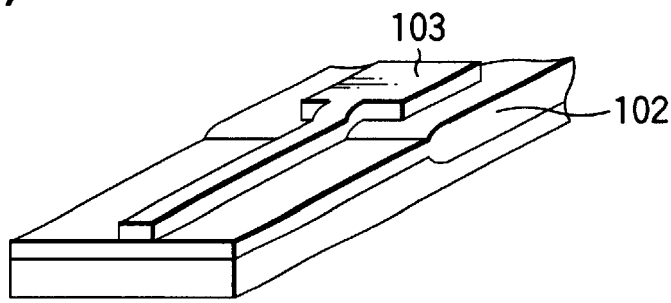
FIG. 38 is a perspective view showing an example of a structure of a semiconductor device manufactured using the methods for pattern formation according to the tenth embodiment and an eleventh embodiment of the present invention.

Next, development is performed to achieve the state shown in FIG. 37. The resist is developed using an aqueous solution of TMAH of 0.27 N. Thereafter, an RIE process is performs based on the resist pattern to form the gate electrode as shown in FIG. 38.

As described above, according to the present invention, light and electron beams can be selectively applied to the same resist to form patterns without taking back-scattered electrons during electron beam exposure. As a result, the fabrication of photomasks for light exposure is simplified because it is responsible for patterns for which requirements on resolution is more relaxed than the limit resolution, which increases the flexibility in exposure process. For electron beam exposure, the exposure time is significantly reduced because it is responsible only for the formation of patters smaller than the boundary size.

<Eleventh Embodiment>

Figure 39:
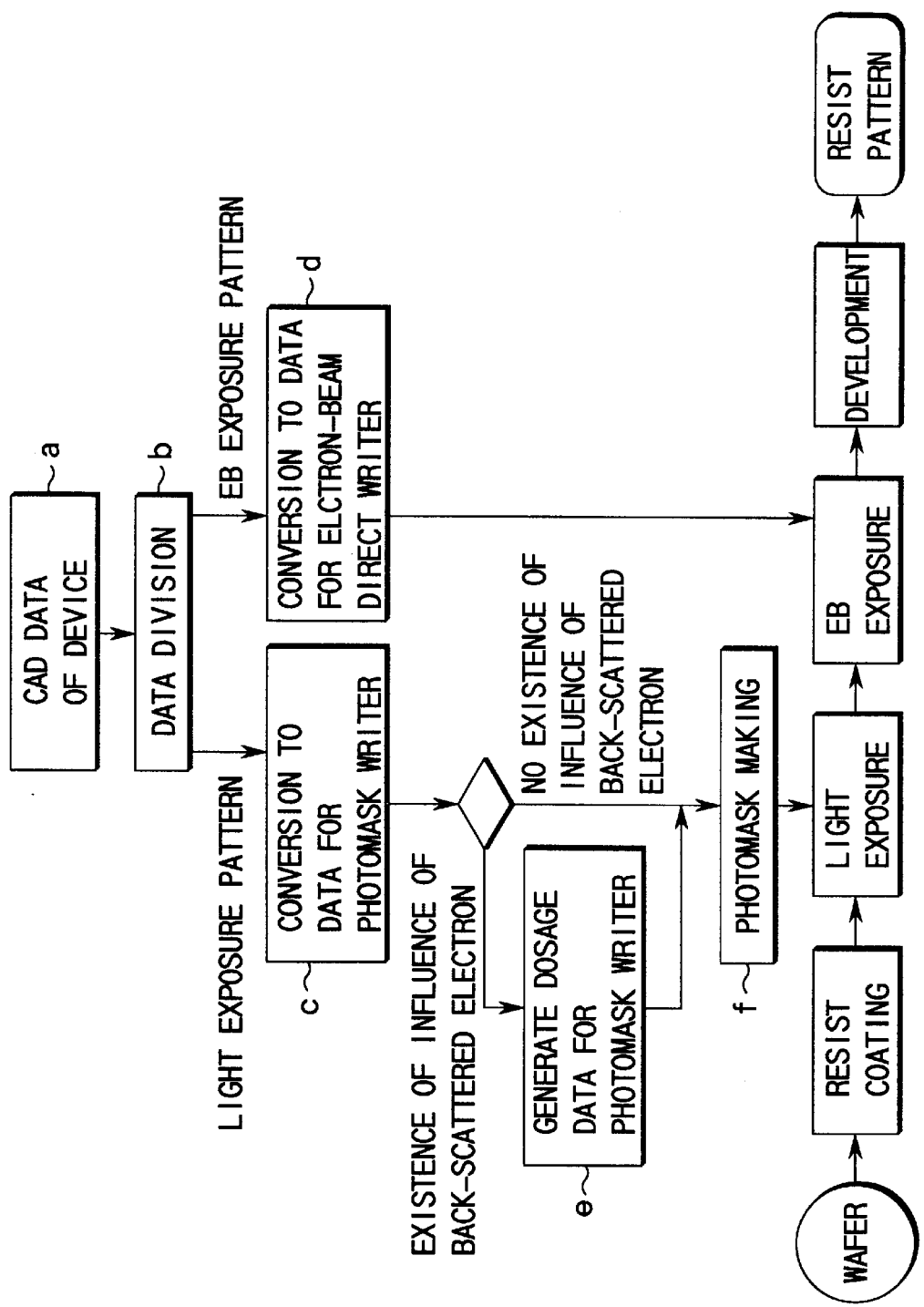
FIG. 39 is a flow chart showing a method for pattern formation according to the eleventh embodiment of the present invention.
Figure 40:
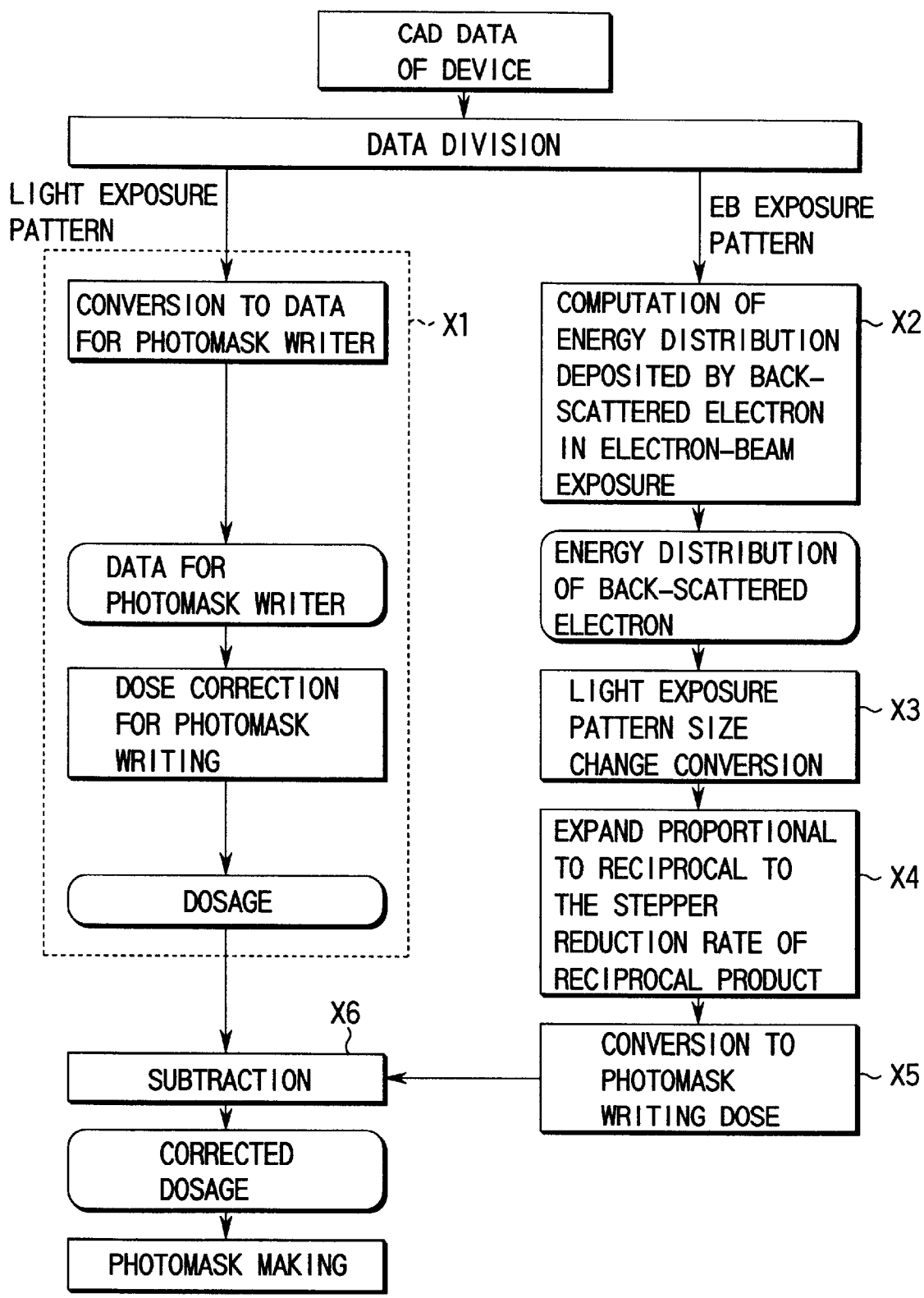
FIG. 40 is a flow chart showing a method of generating data for close for correcting photomask writing according to the eleventh embodiment of the present invention.

FIGS. 39 and 40 are flow charts illustrating a method for forming patterns according to an eleventh embodiment of the present invention. The lithography system used to implement the method for pattern formation will not be described because it is the same as that described in the section of the related art and shown in FIG. 5.

A description will now be made on the method for pattern formation shown in FIGS. 39 and 40. For simplicity, the description will proceed with reference to FIGS. 41A through 41F.

Figure 41A:
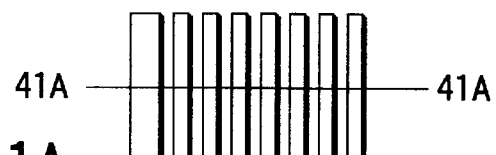
FIGS. 41A through 41F are diagrams for explaining functions of the method for pattern formation according to the eleventh embodiment of the present invention.

First, CAD data of device (a) are separated into CAD data for photomasks for light exposure and CAD data for electron exposure (b) using a resolving size as a boundary which is more relaxed than the limit of resolution of an optical stepper used in a lithography system (hereinafter referred to as "boundary size"). As shown in FIG. 41A, it is assumed that the data are separated into patterns exposed by light (thick areas) and patterns exposed by electron beams (thin areas).

Figure 41B:
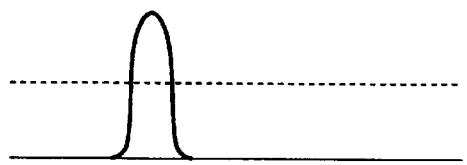
Figure 41C:
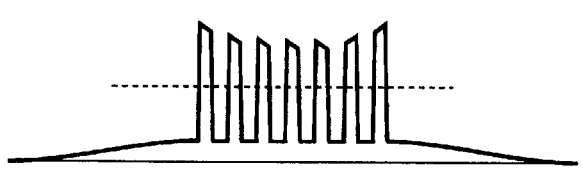
Figure 41D:
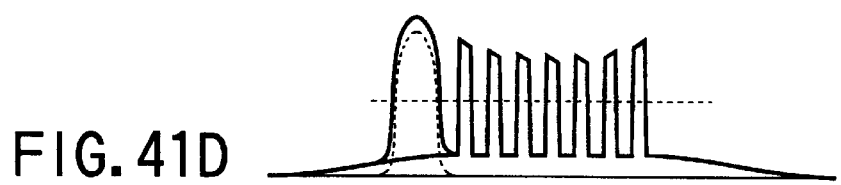

Next, lithographic data, i.e., data for photomask writing (c) and data for electron beam lithography are generated from the respective CAD data. During the generation of the data for electron beam lithography, optical proximity effect correction is performed such that all patterns exposed by electron beams can be formed with preferable sizes. The optical proximity effect correction is carried out under control over dose of application. FIGS. 41B and 41C are maps of doses calculated in such a process which show the distribution of energy accumulated in the resist when each of the patterns shown in FIG. 41A is exposed as viewed at the section 41A—41A in FIG. 41A. The profile shown in FIG. 41C represents the sum of the energy of incident electrons and back-scattered electrons. Since the both types of exposure are carried out on the same resist, the actual distribution of energy accumulated in the resist is as shown in FIG. 41D. Patterns exposed by light in proximity to patterns exposed by electron beams are subjected to the effect of back-scattered electrons and, as a result, its accumulated energy is increased. Therefore, in the case of simultaneous development, the patterns exposed by light will be formed differently from the desired patterns. The effect of back-scattered electrons on the sizes of the resist can be easily inferred if the graph shown in FIG. 27 is available in advance.

It is determined whether the effect of back-scattered electrons on the patterns exposed by light is negligible or not based on whether the amount of the resultant variation in the sizes is equal to or smaller than an allowable value. For example, if it is determined that there is no influence, the data of the separated patterns exposed by light are converted into data for photomask writing, and photomasks are fabricated using, for example, an electron beam lithography apparatus for photomask writing. Thereafter, the patterns to be subjected to light can be formed using the resultant photomasks, and the patterns exposed by electron beams can be formed using data for electron beam lithography which has been prepared separately to form desired patterns.

On the other hand, if the variation of the pattern sizes exposed by light due to back-scattered electrons exceeds the allowable value, the method of fabricating photomasks is changed such that the patterns exposed by light will be shaped into desired pattern sizes under the effect of back-scattered electrons. The method for such a change will be described below. Specifically, the variation of the size caused by back-scattered electrons is absorbed by changing the photomask sizes in advance.

Figure 41E:
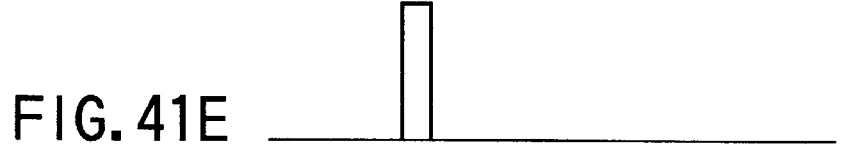
Figure 41F:
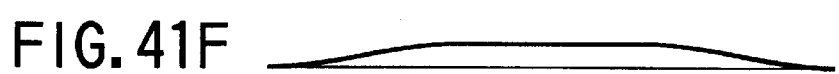

FIG. 41E shows the distribution of doses of incident electrons of lithographic data for fabricating photomasks using an electron-beam exposure apparatus as viewed in the section 41A—41A. However, variation of the size occurs in data for photomask writing generated based on this map because of back-scattered electrons that occur during electron beam pattern exposure (FIG. 41F shows the distribution of the same which is obtained during a calculation to correct the doses). Therefore, data for doses for correcting photomask pattern lithography is generated by subtracting the doses during electron beam exposure from the distribution of doses shown in this map (e). However, it is necessary to identify the relationship between the dose of electron beams on the resist used on the photomask substrate and the sizes thereof when photomasks are fabricated in consideration to possibility of use of different resists and different electron reflection coefficient of substrates. FIG. 42A shows an example showing the relationship between the dose of electrons on a resist used for the fabrication of photomasks and the sizes of the resist.

Further, since the photomask sizes are transferred to a wafer with the reduction factor of the stepper applied thereto, the sizes must be enlarged in advance by an inverse multiple of the reduction factor in order to correct variation of the size on the wafer attributable to back-scattered electrons on the photomasks. Therefore, taking such factors into consideration, an incident electrons is obtained which satisfies a relational expression:

wafer linewidth conversion factor $(nm/\mu C/cm^2)\times$back-scattered electrons $(\mu C/cm^2)$=reduction factor of stepper$\times$photomask linewidth conversion factor $(nm/\mu C/cm^2)\times$incident electrons $(\mu C/cm^2)$ The incident electrons is subtracted from the dose as shown in FIG. 41E which has been determined without taking the effect of back-scattered electrons into consideration. Specifically, by forming a pattern with a dose indicated by the solid line in FIG. 42B, a photomask can be formed in sizes for which variation of the pattern sizes exposed by light dude to back-scattered electrons has been taken into consideration in advance.

What is important here is the magnitude of change of the size required on the photomask. Since the reduction factor of a stepper is ¼ or ⅕, the pattern sizes of the photomask will be enlarged by a factor of 4 or 5. While the size of a photomask is changed by changing the amount of illumination during photomask writing according to the present invention, as shown in FIG. 42, there is a limit on the achievable change of the size. A required amount of change may not be achieved in some occasions. The lower limit of the amount of illumination is determined whether a resist pattern can be resolved or not, and the upper limit is determined when no change occurs in the pattern size even if the dose is increased. According to the present invention, it is possible to increase the amount of change of the size by increasing the amount of blur in photomask writing, which is an essential part of the present invention.

FIG. 42C shows the relationship between the doses and linewidths with the amount of blur of beams at 30 nm. 50 nm and 100 nm. FIG. 42A shows the case of the blur in the amount of 30 nm. The greater the amount of blur, the greater the variation of the size becomes even if the rate of change in dose are the same. This indicates that the changeable range has been consequently increased. As a result, the correctable range is significantly expanded to make it possible to change the pattern sizes of a photomask only by modulating the dose. Specifically, the amount of change of the size is increased by a factor of 2 or more by increasing the amount of blur to 100 nm. However, too significant blur of beams will obviously creates disadvantages associated with controllability of sizes in lithography apparatuses having not so good dose accuracy, and it is therefore desirable to keep the amount of blur at the minimum level required.

Although the function has been described with reference to a single pattern for simplicity, correction of the size is carried out on all patterns exposed by light according to such a concept to generate data for photomask writing based on which photomasks are fabricated.

The corrected dose data used for the fabrication of a photomask (e) as described above can be generated in accordance the step shown in FIG. 40. Specifically, the step is preferably comprises a step X1 of obtaining a map of proper doses for drawing a pattern exposed by light on a photomask substrate, a step X2 for obtaining a map of the distribution of energy accumulated by back-scattered electrons during the lithography of a pattern exposed by electron beams on the wafer, a step X3 for converting the map of the distribution of energy accumulated by back-scattered electrons into a map of distribution of the amount of pattern size variation of the pattern exposed by light, a step X4 of enlarging the map of distribution of the amount of pattern size variation of the pattern exposed by light by an inverse multiple of the reduction factor of the stepper for light exposure, a step X5 of converting the enlarged map of distribution of the amount of pattern size variation of the pattern exposed by light into a map of distribution of converted values of photomask exposure doses, and a step X6 of subtracting the map of distribution of converted values of photomask exposure doses obtained at step X5 from the map of proper doses obtained at step X1. The pattern is exposed by light using the photomask, and the pattern for electron beam exposure is exposed by electron beams using data for electron beam lithography which has been prepared separately to form desired patterns.

As described above, the present embodiment makes it possible to change pattern sizes of a photomask only by modulating the dose and to provide a simple and accurate method for pattern formation which has excellent resolving power beyond that achievable with light provided by electron beam exposure and throughput equivalent to that achievable with an optical stepper.

FIGS. 33 through 38 illustrates specific examples of the fabrication of devices using a lithography system according to the present embodiment. A process on a gate electrode of a MOSFET will now be illustrated as an example.

FIG. 33 is a diagram showing a basic structure of a semiconductor device manufactured using the method described in the present embodiment. In FIG. 33, a polysilicon area 103 and a resist 104 are formed on a semiconductor substrate 101. Although reference is made on a step formed by the LOCOS process which is a selective oxidation process employing $Si_3N_4$ as an oxidation mask, the present invention is applicable to steps originating from other element separation methods such as STI. The resist 104 is a resist sensitive to deep-UV light and electron beams, e.g., VN-HS and is about 500 nm thick.

FIG. 34 is a plan view of a gate electrode pattern which is exposed by electron beams because of its fineness. Since the focal depth of electron beam exposure is as deep as several $\mu$m, the exposure has tolerance to steps which is incomparably greater than that of exposure utilizing deep-UV light. Therefore, no discontinuation of resist occurs even at a step between the element area and element separation area, which allows accurate patterning.

A description will now be made on steps for forming a gate electrode with reference to FIGS. 35 through 38.

FIG. 35 is a perspective view of FIG. 33 as viewed from the left-hand side. A gate oxide area, an element separating oxide area 102, a polysilicon area 103 (200 nm) and a resist area 104 (500 nm) are sequentially formed on a semiconductor 101. The resist used here is negative. Only the resist is exposed by electron beams, and others are exposed by deep-UV light using photomask masks as described in the first, second and third specific examples to form all patterns.

First, the patterns are exposed by deep-UV light. Next, an electron-beam exposure apparatus is used to pattern fine portions. FIG. 36 shows latent image in the resist formed by light exposure and electron beam exposure. By using photomasks as described above for the pattern exposure using deep-UV light, light and electron beams can be selectively projected upon the resist to form patterns without taking back-scattered electrons during electron beam exposure into consideration.

Next, development is performed to achieve the state shown in FIG. 37. The resist is developed using an aqueous solution of TMAH of 0.27 N. Thereafter, an RIE process is performs based on the resist pattern to form the gate electrode as shown in FIG. 38.

As described above in detail, the present embodiment makes it possible to correct the effect of back-scattered electrons during the formation of patterns exposed by electron beams easily and accurately using the pattern sizes of a photomask. As a result, the fabrication of photomasks for light exposure is simplified because it is responsible for patterns for which requirements on resolution is more relaxed than the limit resolution, which increases the flexibility in exposure process. For electron beam exposure, the exposure time is significantly reduced because it is responsible only for the formation of patters smaller than the boundary size.

<Twelfth Embodiment>

Figure 43:
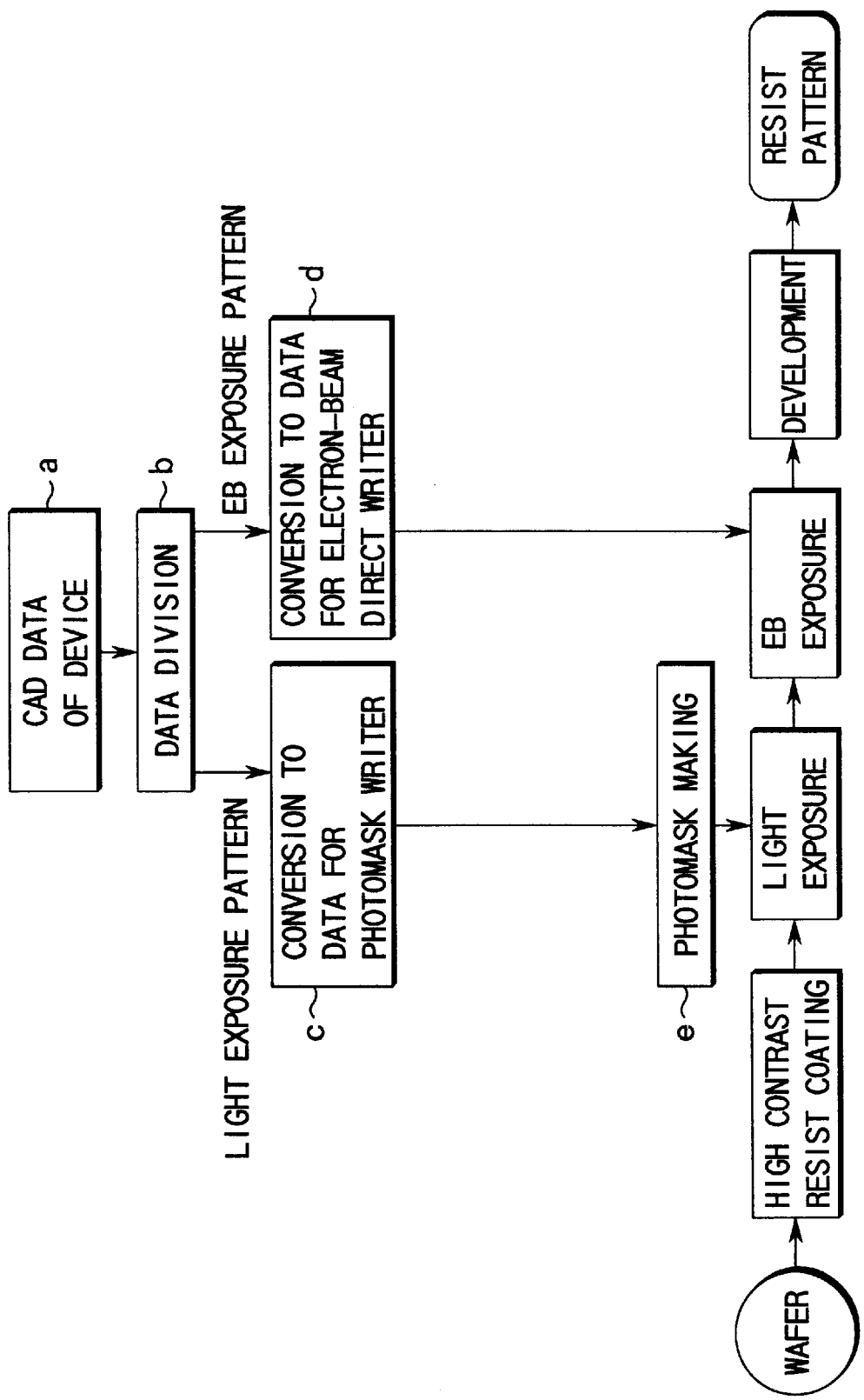
FIG. 43 is a flow chart showing a method for pattern formation according to the twelfth embodiment of the present invention.

FIGS. 43 is a flow charts illustrating a method for forming patterns according to a twelfth embodiment of the present invention. The lithography system used to implement the method for pattern formation will not be described because it is the same as that described in the section of the related art and shown in FIG. 5.

What should be noted about the present embodiment is that a resist having high contrast such as a resist having a PH jump mechanism is used. The high contrast resist is specifically SEPR-4202PB manufactured by Shin-Etsu Chemical Co., Ltd.

A description will now be made on the method for pattern formation according to the present embodiment. For simplicity, the description will proceed with reference to the patterns shown in FIGS. 44A through 44D.

Figure 44A:
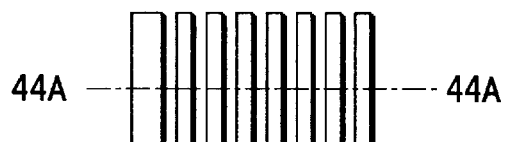
FIGS. 44A through 44D are diagrams for explaining functions of the method for pattern formation according to the twelfth embodiment of the present invention.

First, CAD data of device (a) are separated into CAD data for photomasks for light exposure and CAD data for electron exposure (b) using a resolving size as a boundary which is more relaxed than the limit of resolution of an optical stepper used in a lithography system (hereinafter referred to as "boundary size"). As shown in FIG. 44A, it is assumed that the data are separated into patterns exposed by light (thick areas) and patterns exposed by electron beams (thin areas).

Next, lithographic data, i.e., data for photomask writing (c) and data for electron beam lithography are generated from the respective CAD data. During the generation of the data for electron beam lithography, optical proximity effect correction is performed such that all patterns exposed by electron beams can be formed with preferable sizes. The optical proximity effect correction is carried out under control over dose of application.

Figure 44B:
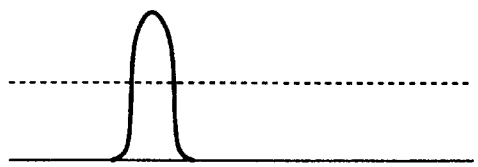
Figure 44C:
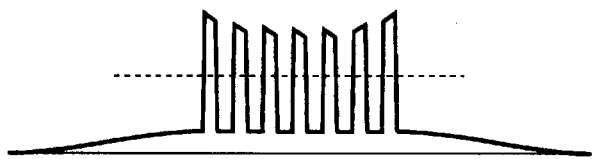
Figure 44D:
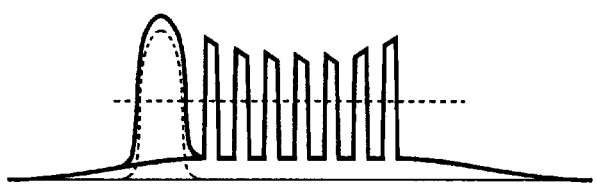

FIGS. 44B and 44C are maps of doses calculated in such a process which show the distribution of energy accumulated in the resist when each of the patterns shown in FIG. 44A is exposed as viewed at the section 44A—44A in FIG. 44A. The profile shown in FIG. 44C represents the sum of the energy of incident electrons and back-scattered electrons. Since the both types of exposure are carried out on the same resist, the actual distribution of energy accumulated in the resist is as shown in FIG. 44D. Patterns exposed by light in proximity to patterns exposed by electron beams are subjected to the effect of back-scattered electrons and, as a result, its accumulated energy is increased.

Figure 45:
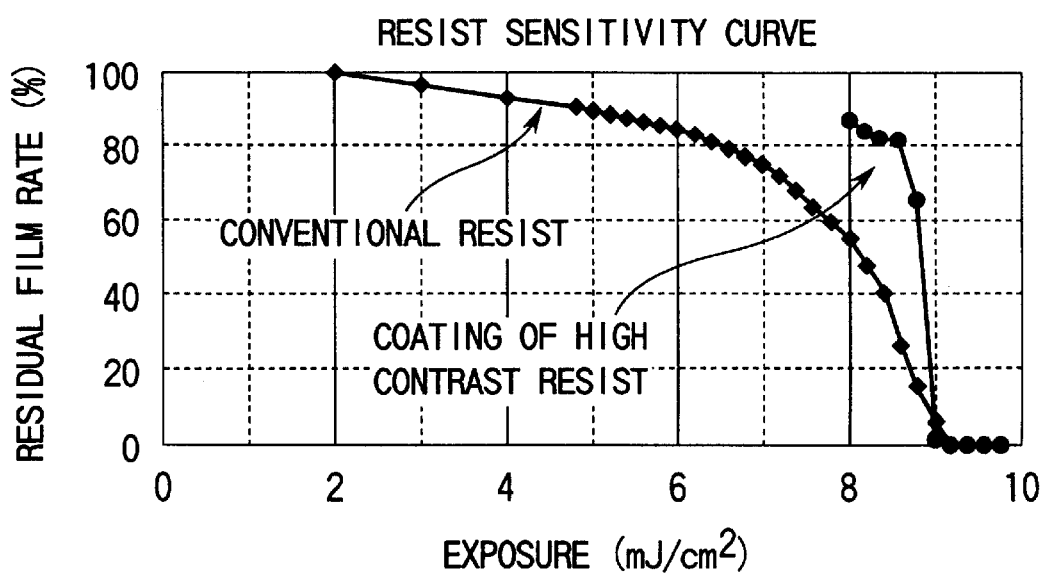
FIG. 45 is a diagram for explaining functions of the method for pattern formation according to the twelfth embodiment of the present embodiment.

As shown in FIG. 45, the resist whose pattern is formed using a mechanism referred to as "PH jump" is characterized by a γ-value which is higher than conventional resists (γ-value is a dose ratio at which the thickness of residual resist is 0% and 50% of the initial thickness). During light exposure, energy accumulated in a non-exposed area of a pattern is about 0.3 times that is an exposed area due to leakage of irradiation light. The amount of energy accumulated in a non-exposed area is about 3 mJ/cm$^2$ whereas the dose required for optimum pattern formation using light exposure is 10 mJ/cm$^2$. Since the amount of accumulated energy added to a pattern exposed by light adjacent to a pattern exposed by electron beams under the influence of back-scattered electrons during electron beam application is about 5 mJ/cm$^2$ when the lithographic density of the pattern exposed by electron beams is 50%. Therefore, energy in an amount of 8 mJ/cm$^2$ is accumulated in a non-exposed area after light exposure and electron beam exposure. Therefore, conventional resists are subjected to significant variation in the residual film ratio, i.e., significant variation of the size. On the other hand, a high contrast resist is subjected to no variation of the residual film ratio, i.e., no variation of the size.

Thus, the use of a high contrast resist makes it possible to ignore the effect of back-scattered electrons on a pattern exposed by light. Therefore, a separated pattern exposed by light is converted without taking the effect of back-scattered electrons into consideration to generate data for photomask writing, and a photomask is fabricated using, for example, an electron-beam exposure apparatus for photomask writing. Thereafter, the pattern exposed by light is exposed using the photomask and the pattern exposed by electron beams is exposed using data for electron beam lithography prepared separately to form desired patterns.

According to the present embodiment, light and electron beams can be selectively applied to the same resist to form patterns without taking back-scattered electrons during electron beam exposure. As a result, the fabrication of photomasks for light exposure is simplified because it is responsible for patterns for which requirements on resolution is more relaxed than the limit resolution, which increases the flexibility in exposure process. For electron beam exposure, the exposure time is significantly reduced because it is responsible only for the formation of patters smaller than the boundary size.

While various embodiments of the present invention have been described, the present invention is not limited thereto.

Although the above described embodiments have referred to the formation of patterns in a gate layer of a MIS transistor, the present invention may be applied to the formation of patterns in other layers. The present invention may be applied not only to MIS transistors but also to the patterning of fine areas in bipolar transistors and the like.

Although the above embodiments have referred to a gate electrode forming layer as an example, the method for forming patterns according to the present invention may obviously be used for other pattern layers involved in the manufacture of semiconductor devices to the same effect. Further, while the present invention has been described as a method of extracting patterns exposed by electron beams or light using a reference size, the same effect will be achieved by extracting other methods of extracting patterns.

The techniques described in the embodiments may be used in various apparatuses by storing them in memory media such as magnetic discs (floppy discs, hard discs ant the like), optical discs (CD-ROMs, DVDs and the like) and semiconductor memories as programs executable by computers. The computer realizing the apparatus of the present invention reads programs recorded on the recording medium and controls above processings by controlling operations by the programs.

For example, the present invention can be applied to all patternings including such as element area, contact hole, and netal wiring layer in addition to the gate electrode of the MOSFET. In addition, the present invention can be applied to such as patterning of the fine regions of the bipolar transistor in addition to the MOSFET.

The present invention can be applied to various apparatus within a scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for forming patterns wherein pattern transfer to the same photosensitive material on a first layer is carried out using both light exposure and charged particle beam exposure, said method comprising the step of:

performing a predetermined geometric operation between data associated with a pattern to be transferred to said first layer and data associated with a pattern to be transferred to a second layer different from said first layer;

separating said pattern data associated with the pattern to be transferred to the first layer into first exposure pattern data for charged particle beam exposure and second exposure pattern data for light exposure; and performing pattern transfer onto said first layer based on the result of said separation, wherein said geometric operation is at least either a process of extracting an overlapping area between the pattern to be transferred to said first layer and the pattern to be transferred to said second layer from the pattern to be transferred to said first layer or a process of removing the same.

2. The method for forming patterns according to claim 1, wherein said first layer is a gate layer for forming a gate of a MIS transistor and said second layer is an active area layer for forming an active area of a MIS transistor.

3. A method for forming patterns wherein pattern transfer to the same photosensitive material on a gate layer for forming a gate of a MIS transistor is carried oat using both light exposure and charged particle beam exposure, said method comprising the steps of:

separating pattern data associated with patterns transferred to said gate layer into first exposure pattern data for transferring a pattern onto an area corresponding to an active area of the MIS transistor using charged particle beam exposure and second exposure pattern data for transferring a pattern onto an area corresponding to an area including a non-active area of the MIS transistor using light exposure; and performing pattern transfer to the gate layer based on the result of said separation, wherein said geometric operation is at least either a process of extracting an overlapping area between the pattern to be transferred to said first layer and the pattern to be transferred to said second layer from the pattern to be transferred to said first layer or a process of removing the same.

4. A method for forming patterns wherein at least part of pattern transfer to the same photosensitive material on a first layer is carried out using charged particle beam exposure that applies charged particle beams emitted by an charged particle beam source to a sample through a first shaping aperture and a second shaping aperture, said method comprising the steps of:

performing a predetermined geometric operation between data associated with a pattern to be transferred to said first layer and data associated with a pattern to be transferred to a second layer different from said first layer;

separating said pattern data associated with the pattern to be transferred to the first layer into first exposure pattern data and second exposure pattern data; and performing pattern transfer onto said first layer based on the result of said separation, wherein the first exposure pattern data are used in an exposure method wherein an charged particle beam image projected upon the second shaping aperture through the first shaping aperture includes an area sandwiched by at least part of a pair of aides facing each other of a shaping pattern formed on the second shaping aperture; and said geometric operation is at least either a process of extracting an overlapping area between the pattern to be transferred to said first layer and the pattern to be transferred to said second layer from the pattern to be transferred to said first layer or a process of removing the same.

5. The method for forming patterns according to claim 4, wherein said first layer is a gate layer for forming a gate of a MIS transistor and said second layer is an active area layer for forming an active area of a MIS transistor.

6. A method for forming patterns wherein at least part of pattern transfer to the same photosensitive material on a gate layer for forming a gate of a MIS transistor is carried out using charged particle beam exposure that applies charged particle beams emitted by an charged particle beam source to a sample through a first shaping aperture and a second shaping aperture, said method comprising the steps of:

separating pattern data associated with the pattern to be transferred to said gate layer into first exposure pattern data for transferring a pattern onto an area corresponding to an active area of said MIS transistor using charged particle beam exposure and second exposure pattern data for transferring a pattern onto an area corresponding to an area including a non-active area of said MIS transistor using light exposure;

performing pattern transfer onto said gate layer based on the result of said separation, wherein the first exposure pattern data are used in an exposure method wherein an charged particle beam image projected upon the second shaping aperture through the first shaping aperture includes an area sandwiched by at least part of a pair of sides facing each other of a shaping pattern formed on the second shaping aperture; and said geometric operation is at least either a process of extracting an overlapping area between the pattern to be transferred to said first layer and the pattern to be transferred to said second layer from the pattern to be transferred to said first layer of a process of removing the same.

7. The method for forming patterns according to claim 1 or 4, wherein the process of separating into said first exposure pattern data and said second exposure pattern data comprises:

a process of extracting an overlapping area between the pattern to be transferred to said first layer and the pattern to be transferred to said second layer from the pattern to be transferred to said first layer;

a process of generating said first exposure pattern data based on the result of the process;

a process of removing the overlapping area between the pattern to be transferred to said first layer and the pattern to be transferred to said second layer from the pattern to be transferred to said first layer; and a process of generating said second exposure pattern data based on the result of the process.

8. The method for forming patterns according to claim 7, wherein the process of extracting an overlapping area between the pattern to be transferred to said first layer and the pattern to be transferred to said second layer from the pattern to be transferred to the first layer is a process of extracting an overlapping area between a pattern obtained by oversizing the pattern to be transferred to the second layer and the pattern to be transferred to the first layer from the pattern to be transferred to the first layer.

9. The method for forming patterns according to claim 7, wherein the process of removing the overlapping area between the pattern to be transferred to said first layer and the pattern to be transferred to said second layer from the pattern to be transferred to the first layer is a process of removing an overlapping area between a pattern obtained by oversizing the pattern to be transferred to the second layer and the pattern to be transferred to the first layer or a pattern obtained by oversizing the same from the pattern to be transferred to the first layer or the pattern obtained by oversizing the same.

10. The method for forming patterns according to claim 7, wherein said process of generating the first exposure pattern data includes a process of adding the pattern obtained by said extraction process and the pattern obtained by said removing process when said patterns are smaller than a first and second thresholds, respectively, and wherein said process of generating the second exposure pattern data includes a process of adding the pattern obtained by said extraction process and the pattern obtained by said removing process when said patterns are greater than a first and second thresholds, respectively.

11. The method for forming patterns according to claim 1 or 4, wherein said process of separating into the first exposure pattern data and second exposure pattern data comprises:

a process of generating a first oversized pattern by oversizing the pattern to be transferred to the first layer;

a process of generating the second exposure pattern data based on the result of said process;

a process of generating a second oversized pattern by oversizing the pattern to be transferred to the first layer further beyond said first oversized pattern;

a process of generating a third oversized pattern by oversizing the pattern to be transferred to the second layer;

a process of removing an overlapping area between the pattern to be transferred to the first layer and the second oversized pattern from the second oversized pattern;

a process of extracting an overlapping area where the pattern obtained by said removing process and the third oversized pattern; and a process of generating said first exposure pattern data based on the result of said extraction process.

12. A method for forming patterns involving pattern transfer to the same photosensitive material using light exposure and charged particle beam exposure, said method comprising the steps of:

moving the outline of a device design pattern inwardly by a first amount;

extracting a pattern exposed by charged particle beams from said device design pattern whose outline has been moved;

moving the outline of said extracted pattern exposed by charged particle beams outwardly by a second amount;

converting said pattern exposed by charged particle beams whose outline has been moved into a data format for an charged particle beam lithography apparatus;

extracting a pattern exposed by light from said device design pattern; and converting said pattern exposed by light into a data format for a photomask writing apparatus.

13. A method for forming patterns involving pattern transfer-to the same photosensitive material using light exposure and charged particle beam exposure, said method comprising the steps of:

moving the outline of a device design pattern inwardly by a first amount;

separating said device design pattern whose outline has been moved into a pattern exposed by light and a pattern exposed by charged particle beams;

moving the outline of said pattern exposed by light outwardly by a second amount;

moving the outline of said pattern exposed by charged particle beams outwardly by a third amount;

converting said pattern exposed by light whose outline has been moved into a data format for a photomask writing apparatus; and converting said pattern exposed by charged particle beams whose outline has been moved into a data format for an charged particle beam lithography apparatus.

14. The method for forming patterns according to claim 12 or 13, wherein the absolute values of the first and second outline movements are equal to each other or wherein the absolute values of the first, second and third outline movements are equal to each other.

15. The method for forming patterns according to claim 12 or 13, wherein the absolute values of the first and second outline movements are different or wherein the absolute values of the first, second and third outline movements are different.

16. The method for forming patterns according to claim 12 or 13, wherein each of said outline movements is determined in consideration to errors in alignment between light exposure and charged particle beam exposure on the same photosensitive material, the accuracy of the charged particle beam size of the charged particle beam lithography apparatus, value of the pattern size change in resist processing and value of the pattern size change in etching.

17. The method for forming patterns according to claim 12 or 13, wherein a boundary size between light exposure and charged particle beam exposure is defined based on which the extraction of the pattern exposed by charged particle beams or the separation of the patterns exposed by light and charged particle beams is carried out.

18. The method for forming patterns according to claim 17, wherein a value obtained by correcting said boundary size with said first outline movement is used as a reference size based on which the extraction of the pattern exposed by charged particle beams or the separation of the patterns exposed by light and charged particle beams is carried out.

19. The method for forming patterns according to claim 12 or 13, further comprising the step of moving the position of at least either of shorter or longer sides of said extracted or separated pattern exposed by charged particle beams in a direction perpendicular thereto before said step of converting the pattern exposed by charged particle beams into a data format for an charged particle beam lithography apparatus.

20. The method for forming patterns according to claim 12 or 13, further comprising the step of moving the position of the sides of said extracted or separated pattern exposed by charged particle beams which are in contact with said pattern exposed by light in a direction perpendicular thereto before said step of converting the pattern exposed by charged particle beams into a data format for an charged particle beam lithography apparatus.

21. The method for forming patterns according to any one of claim 1, 3, 4, 6, 12 or 13, wherein said method is applied a logic portion of a gate layer of a semiconductor circuit having said logic portion and a memory portion thereon and wherein a method for pattern formation based on light exposure or part simultaneous charged particle beam exposure is used for said memory portion.

22. A method for forming patterns wherein desired pattern transfers on a photosensitive material formed on a substrate to be processed are performed using light exposure and charged particle beam exposure employing photomasks, and wherein the transfer of patterns in the excess of the limit of resoluiton of light exposure is performed using charged particle beam exposure;

said method comprising the step of forming a pattern exposed by light varying the pattern sizes of the photomasks used for light exposure to suppress the effect of back-scattered charged particles on said pattern that occurs during charged particle beam exposure;

wherein said photomasks are generated by a charged particle beam exposure apparatus employing proximity effect correction for dose control and wherein said predetermined correction is carried out by modulating a map of incident close used during the generation of said photomasks; and the modulation of said map of incident dose used in photomask making is carried out by obtaining the incident charged particles from a relational expression:

pattern size change per charged particle on wafer×back-scattered charged particles=reduction ratio of stepper×pattern size change per charged particle on photomask incident charged particles.

23. A method for forming patterns wherein desired pattern transfers on a photosensitive material formed on a substrate to be processed are performed using light exposure and charged particle beam exposure employing photomasks; wherein the transfer of patterns in the excess of the limit of resolution of light exposure is performed using charged particle beam exposure, said method comprising the step of forming a pattern expose by light varying the pattern sizes of the photomasks used for light exposure to suppress the effect of back-scattered charged particles on said pattern that occurs daring charged particle beam exposure; wherein said photomasks are generated by a charged particle beam exposure apparatus employing proximity effect correction for dose control and wherein said predetermined correction is carried out by modulating a map of incident doge used during the generation of said photomasks; and the process of generating data for said map of incident dose comprises the step of:

obtaining a map of proper dozes for drawing a pattern exposed by light on a photomask substrate;

obtaining a distribution map of energy accumulated by back-scattered charged particles during the drawing a pattern exposed by charged particles on a wafer;

converting said distribution map of energy accumulated by back-scattered charged particles into a distribution map of variation of the pattern size exposed by light;

enlarging said distribution map of variation of the pattern size exposed by light by an inverse multiple of the reduction factor of a stepper for light exposure;

converting said enlarged distribution of variation of the pattern size exposed by light into a distribution map of converted values of photomask exposure doses; and subtracting said distribution map of converted values of photomask exposure doses from said map of proper doses.

24. A method for forming patterns wherein desired pattern transfers on a photosensitive material formed on a substrate to be processed are performed using light exposure and charged particle beam exposure employing photomasks and wherein the transfer of patterns in the excess of the limit of resolution of light exposure is performed using charged particle beam exposure, said method comprising the step of forming a pattern exposed by light varying the pattern sizes of the photomasks used for light exposure to suppress the effect of back-scattered charged particles on said pattern that occurs during charged particle beam exposure, wherein said predetermined correction is carried out by modulating the pattern size exposed on the photomasks during the fabrication of the same and said modulation of the pattern size is carried out by obtaining the amount of the pattern size change on photomask from a relational expression:

ratio of pattern size change on wafer to back-scattered charged particle×back-scattered charged particles=reduction ratio of stepper×pattern size change on photomask.

25. A method for forming patterns wherein desired pattern transfers on a photosensitive material formed on a substrate to he processed are performed using light exposure and charged particle beam exposure employing photomasks and wherein the transfer of patterns in the excess of the limit of resolution of light exposure is performed using charged particle beam exposure, said method comprising the step of forming a pattern exposed by light varying the pattern sizes of the photomasks used for light exposure to suppress the effect of back-scattered charged particles on said pattern that occurs during charged particle beam exposure, wherein said predetermined correction is carried out by modulating the pattern size exposed on photomasks during the fabrication of the same, and the step of generating data for said map of pattern size comprising the steps of:

obtaining a distribution map of energy accumulated by back-scattered charged particles during the drawing of a pattern exposed by charged particle beam an a wafer;

converting said distribution map of energy accumulated by back-scattered charged particles into a distribution map of variation of the pattern size exposed by light;

enlarging said distribution map of variation of the pattern size exposed by light by an inverse multiple of the reduction factor of a stepper for light exposure; and subtracting said enlarged distribution map of variation of the pattern size exposed by light from the pattern exposed by light drawn on the photo mask substrate.

26. A method for forming patterns wherein a desired pattern is formed on a substrate by applying charged particle beams on said substrate, comprising the steps of:

identifying the relationship between the variation of the dose of charged particles beams and the variation of pattern sizes in advance; and varying the pattern sizes by varying the dose, wherein said relationship between the variation of the dose of charged particle beams and the variation of the pattern sizes is set at a desired value by varying the amount of blur of charged particle beams.

27. The method for forming patterns according to claim 26, further comprising the step of creating a map of doses in advance.

28. The method for forming patterns according to claim 27, wherein said step of creating a map of doses comprises the steps of:

establishing a map of proper doses for drawing a pattern exposed by light on a photomask substrate;

establishing a distribution map of energy accumulated by back-scattered charged particles during the drawing of a pattern exposed by charged particle beams on a wafer;

converting said distribution map of energy accumulated by back-scattered charged particles into a distribution map of the variation of the sizes of the pattern exposed by light;

enlarging said distribution map of the variation of the sizes of the pattern exposed by light by an inverse multiple of the reduction factor of a stepper for light exposure;

converting said enlarged distribution map of the variation of the sizes of the pattern exposed by light into a distribution map of converted values of doses for photomask exposure; and subtracting said distribution map of converted values of doses for photomask exposure from said map of proper doses.

29. The method for forming patterns according to claim 26, wherein said amount of blur of charged particle beams is varied by varying the focal position of an optical system for focusing charged particle beams.

* * * * *

UNITED STATES PATENT AND TRADEMARK OFFICE
CERTIFICATE OF CORRECTION

PATENT NO. : 6,316,163 B1
DATED : November 13, 2001
INVENTOR(S) : Magoshi et al.

It is certified that error appears in the above-identified patent and that said Letters Patent is hereby corrected as shown below:

Column 44,
Line 53, change "oat" to -- out --.

Column 45,
Line 2, change "said first" to -- a first --.
Lines 2-3, change "said second" to -- a second --.
Line 8, change "an charged" to -- a charged --.
Lines 22-23, change "an charged" to -- a charged --.
Line 42, change "an charged" to -- a charged --.
Lines 56-57, change "an charged" to -- a charged --.
Line 64, change "said first" to -- a first --.
Line 65, change "said second" to -- a second --.

Column 47,
Line 23, change "an charged" to -- a charged --.
Line 29, change "transfer-to" to -- transfer to --.
Line 47, change "an charged" to -- a charged --.

Column 48,
Line 17, change "an charged" to -- a charged --.
Line 24, change "an charged" to -- a charged --.
Line 33, change "Amethod" to -- A method --.
Line 47, change "wherein said" to -- wherein a --.
Line 49, change "close" to -- dose --.

Column 49,
Line 4, change "wherein said" to -- wherein a --.
Line 5, change "doge" to -- dose --.
Line 9, change "dozes" to -- doses --.
Line 37, change "wherein said" to -- wherein a --.
Line 49, change "he" to -- be --.
Line 57, change "wherein said" to -- wherein a --.

UNITED STATES PATENT AND TRADEMARK OFFICE
CERTIFICATE OF CORRECTION

PATENT NO. : 6,316,163 B1
DATED : November 13, 2001
INVENTOR(S) : Magoshi et al.

It is certified that error appears in the above-identified patent and that said Letters Patent is hereby corrected as shown below:

Column 50,
Line 5, change "an a" to -- on a --.
Line 15, delete "photo mask".

Signed and Sealed this

Seventeenth Day of December, 2002

JAMES E. ROGAN
*Director of the United States Patent and Trademark Office*